United States Patent
Luo et al.

(10) Patent No.: US 12,444,695 B2
(45) Date of Patent: Oct. 14, 2025

(54) MEMORY DEVICE INCLUDING SUPPORT STRUCTURES AND CONTACT STRUCTURES HAVING DIFFERENT MATERIALS

(71) Applicant: Micron Technology, Inc., Boise, ID (US)

(72) Inventors: Shuangqiang Luo, Boise, ID (US); John Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 618 days.

(21) Appl. No.: 17/694,040

(22) Filed: Mar. 14, 2022

(65) Prior Publication Data

US 2023/0290739 A1    Sep. 14, 2023

(51) Int. Cl.
*H01L 23/52* (2006.01)
*H01L 23/00* (2006.01)
(Continued)

(52) U.S. Cl.
CPC ........ *H01L 23/562* (2013.01); *H01L 23/5226* (2013.01); *H01L 23/5283* (2013.01);
(Continued)

(58) Field of Classification Search
CPC ............... H01L 23/562; H01L 23/5226; H01L 23/5283; H01L 23/53257; H01L 29/40114; H01L 29/40117; H01L 29/42328; H01L 29/42344; H10B 41/10; H10B 41/35; H10B 41/41; H10B 43/10; H10B 43/35; H10B 43/40; H10B 43/27; H10B 43/50; G11C 5/04; G11C 5/06
(Continued)

(56) References Cited

U.S. PATENT DOCUMENTS

| | | | |
|---|---|---|---|
| 9,899,397 B1 * | 2/2018 | Leobandung | H10D 64/035 |
| 2012/0208347 A1 * | 8/2012 | Hwang | H01L 21/762 |
| | | | 257/E21.546 |

(Continued)

OTHER PUBLICATIONS

"Chinese Application Serial No. 202310238227.9, Notification to Make Rectification mailed Apr. 12, 2023", with machine English translation, 2 pages.

*Primary Examiner* — Sheikh Maruf
(74) *Attorney, Agent, or Firm* — Schwegman Lundberg & Woessner, P.A.

(57) ABSTRACT

Some embodiments include apparatuses and methods of forming the apparatuses. One of the apparatuses includes tiers located one over another, the tiers including respective memory cells and control gates for the memory cells; a first pillar extending through the tiers and separated from the control gates, the first pillar including a first dielectric liner portion and a first core portion adjacent the first dielectric liner portion, the first dielectric liner portion and the first core portion extending along a length of the first pillar; and a second pillar extending through the tiers and separated from the control gates, the second pillar including a second dielectric liner portion and a second core portion adjacent the second dielectric liner portion, the second dielectric portion and the second core portion extending along a length of the second pillar, wherein the first core portion and the second core portion have different materials.

20 Claims, 43 Drawing Sheets

(51) Int. Cl.
  *H01L 23/522*  (2006.01)
  *H01L 23/528*  (2006.01)
  *H01L 23/532*  (2006.01)
  *H10B 41/10*  (2023.01)
  *H10B 41/35*  (2023.01)
  *H10B 41/41*  (2023.01)
  *H10B 43/10*  (2023.01)
  *H10B 43/35*  (2023.01)
  *H10B 43/40*  (2023.01)
  *H10D 30/68*  (2025.01)
  *H10D 30/69*  (2025.01)
  *H10D 64/01*  (2025.01)

(52) U.S. Cl.
  CPC ....... *H01L 23/53257* (2013.01); *H10B 41/10* (2023.02); *H10B 41/35* (2023.02); *H10B 41/41* (2023.02); *H10B 43/10* (2023.02); *H10B 43/35* (2023.02); *H10B 43/40* (2023.02); *H10D 30/6892* (2025.01); *H10D 30/696* (2025.01); *H10D 64/035* (2025.01); *H10D 64/037* (2025.01)

(58) Field of Classification Search
  USPC .......................................................... 257/324
  See application file for complete search history.

(56) References Cited

U.S. PATENT DOCUMENTS

| | | | |
|---|---|---|---|
| 2014/0054670 A1* | 2/2014 | Lee | H10B 41/27 257/326 |
| 2015/0091071 A1* | 4/2015 | Wu | H10D 30/0411 257/316 |
| 2015/0091072 A1* | 4/2015 | Wu | H10B 41/30 257/316 |
| 2015/0118811 A1* | 4/2015 | Makala | H10B 43/27 438/270 |
| 2016/0071876 A1* | 3/2016 | Mizuno | H10B 43/40 438/269 |
| 2017/0092657 A1* | 3/2017 | Lee | H10B 43/27 |
| 2017/0133229 A1* | 5/2017 | Wu | H10D 30/6893 |
| 2018/0053773 A1* | 2/2018 | Leobandung | H10D 64/017 |
| 2020/0243555 A1* | 7/2020 | Hu | H10B 43/10 |

\* cited by examiner

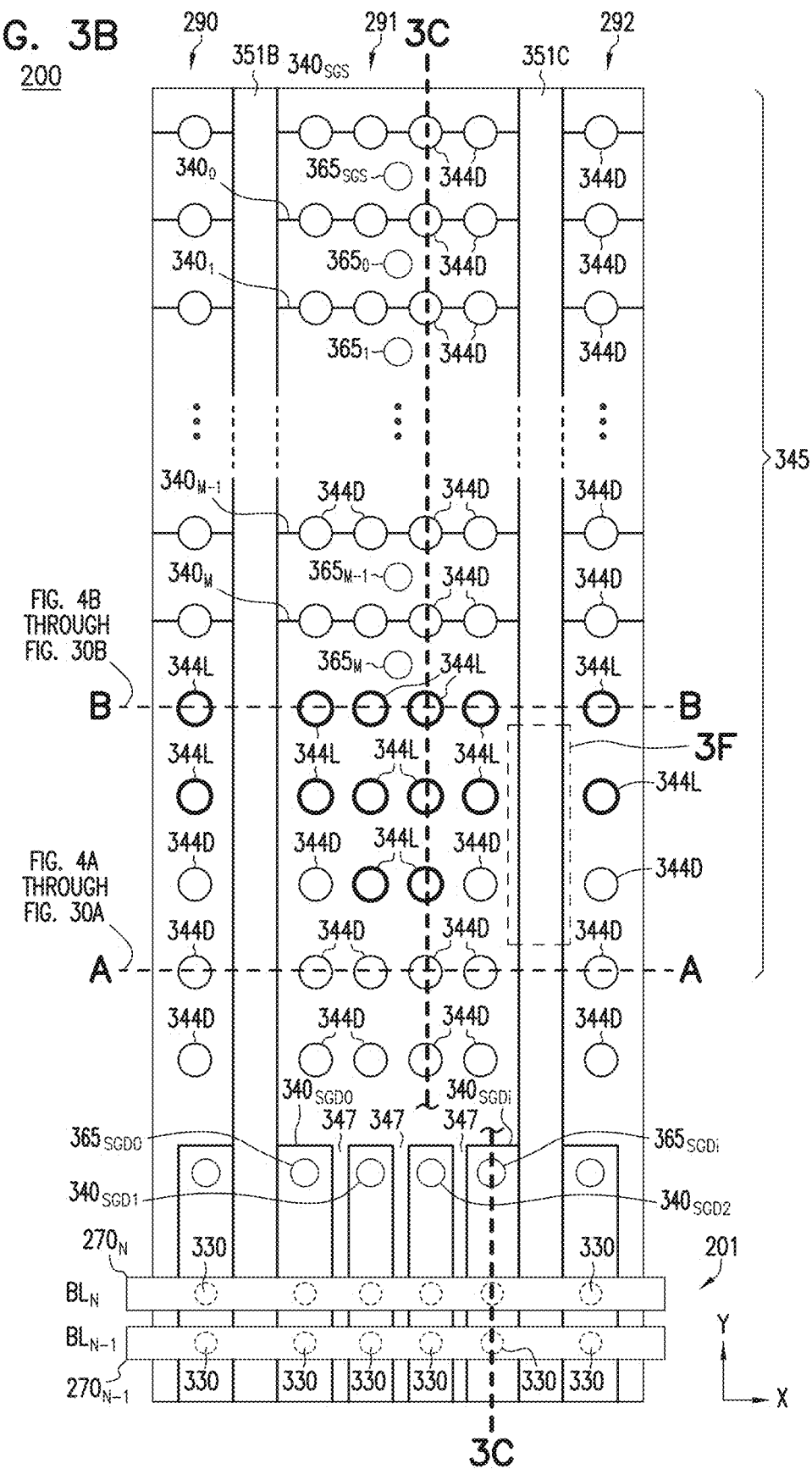

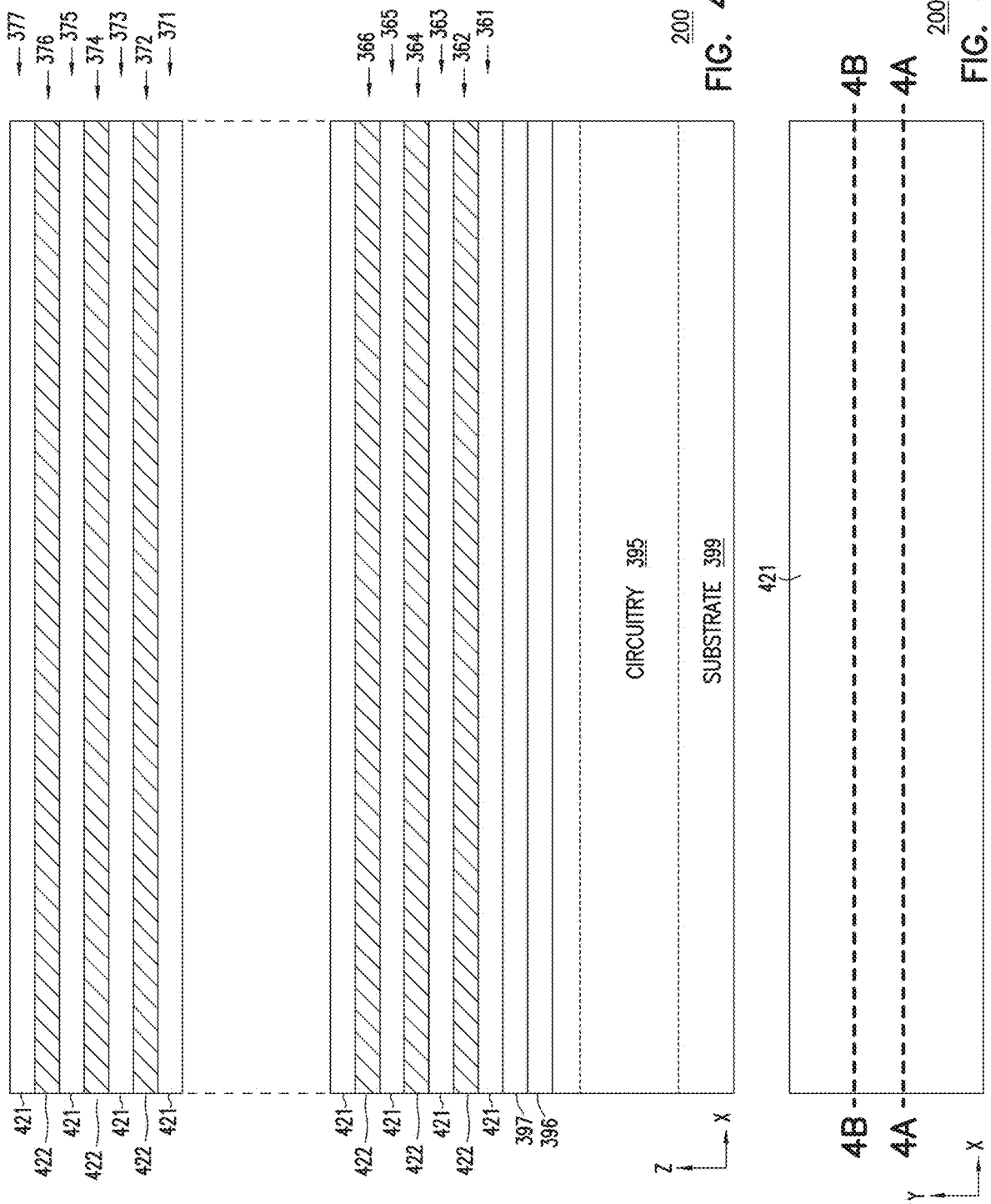

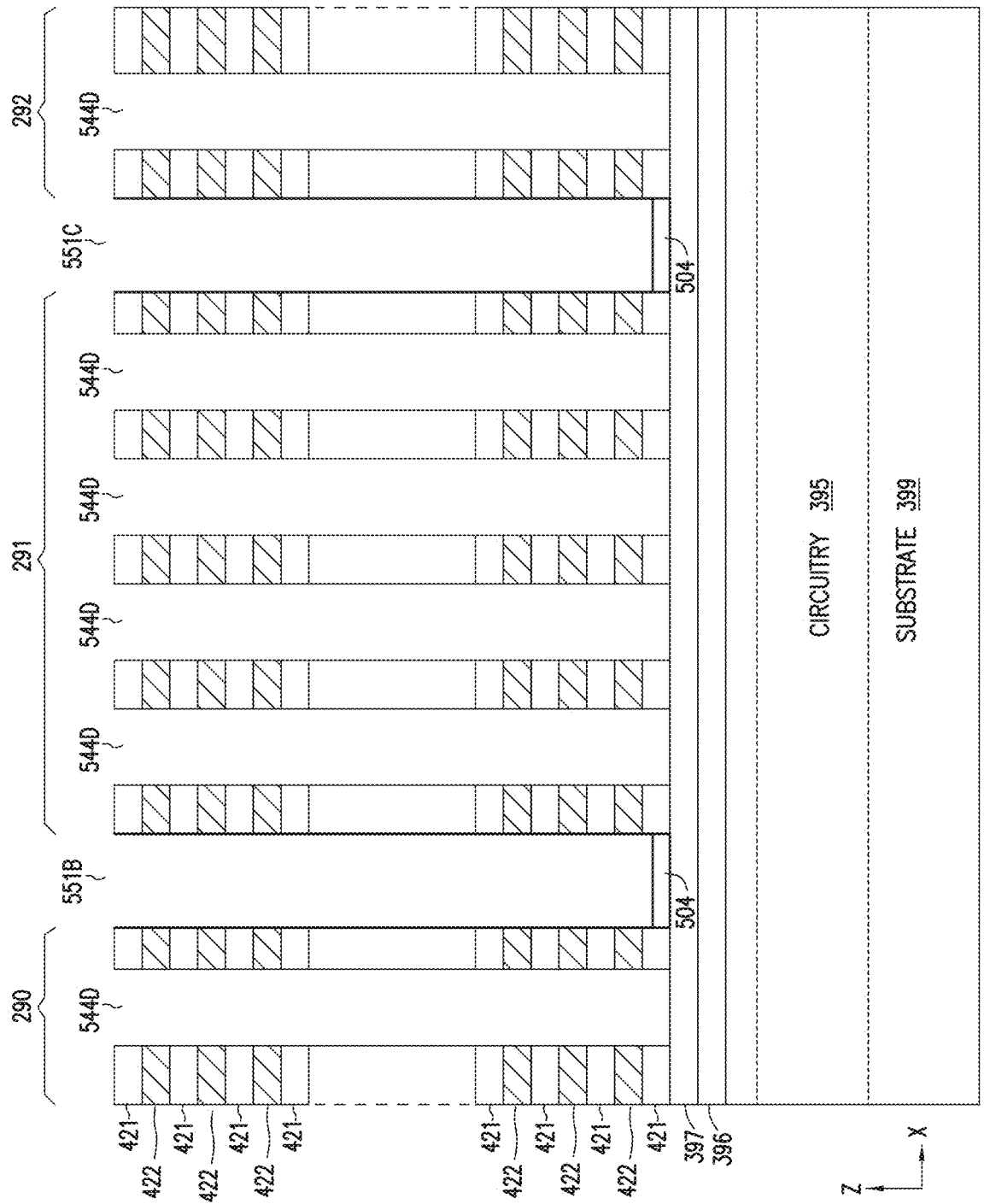

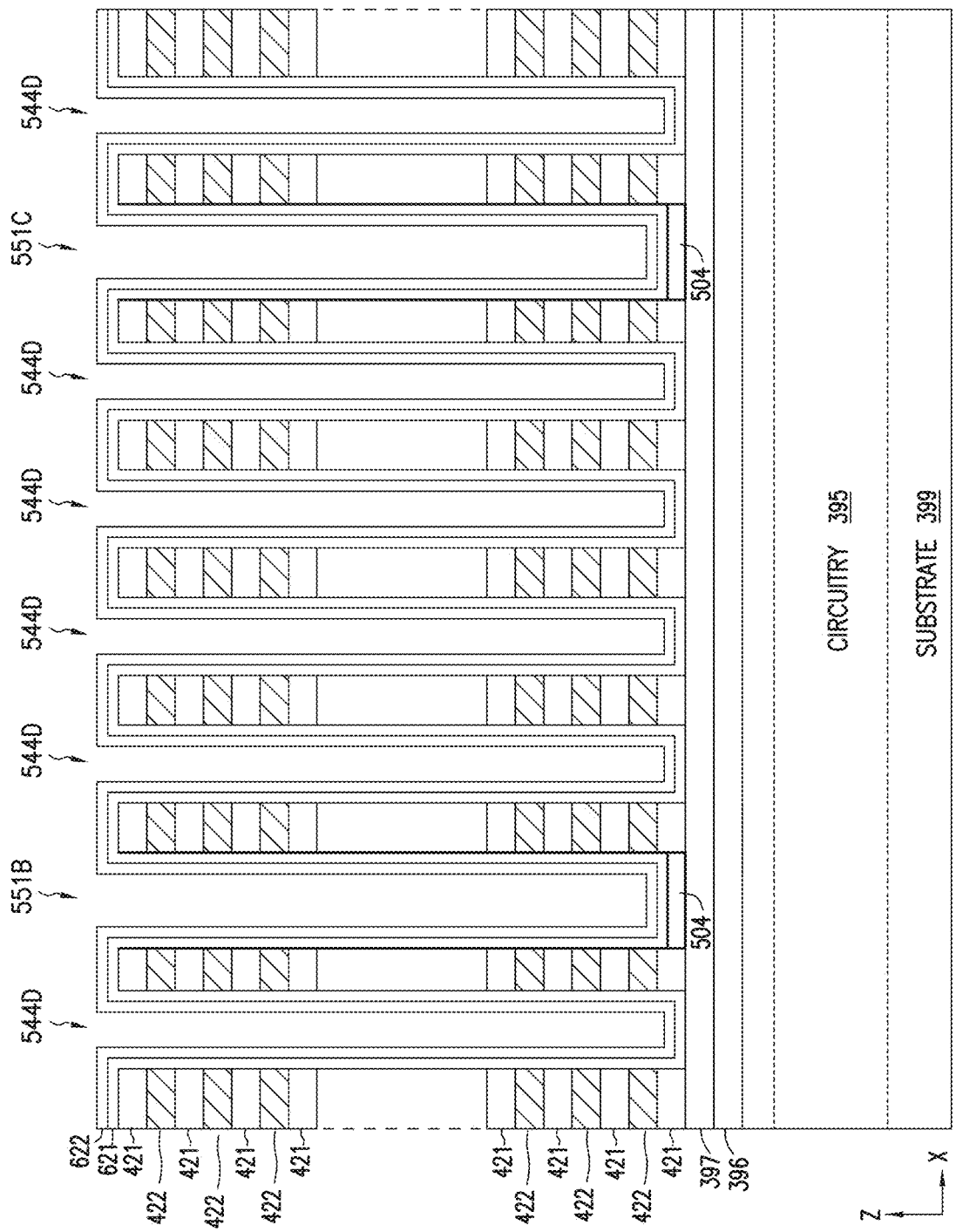

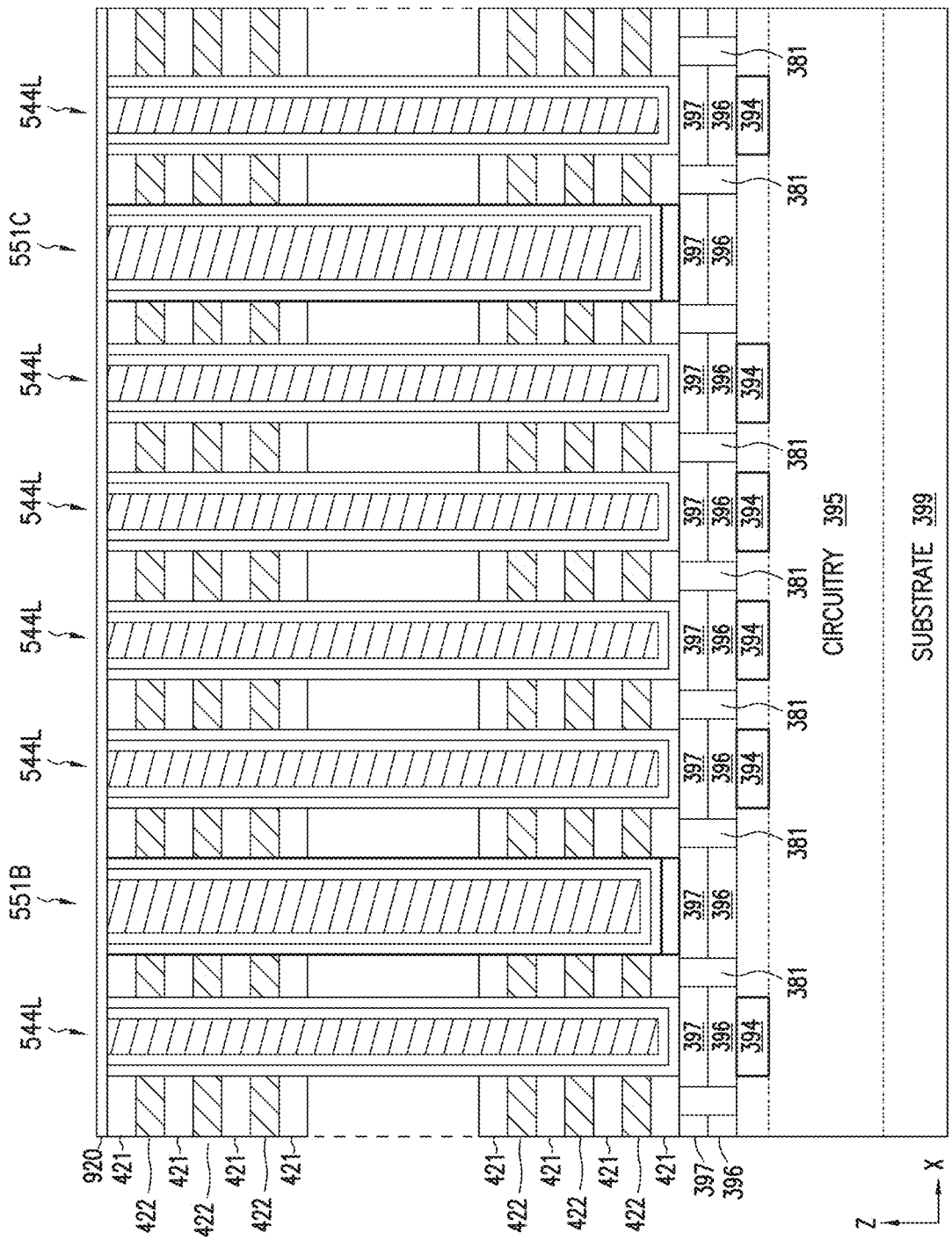

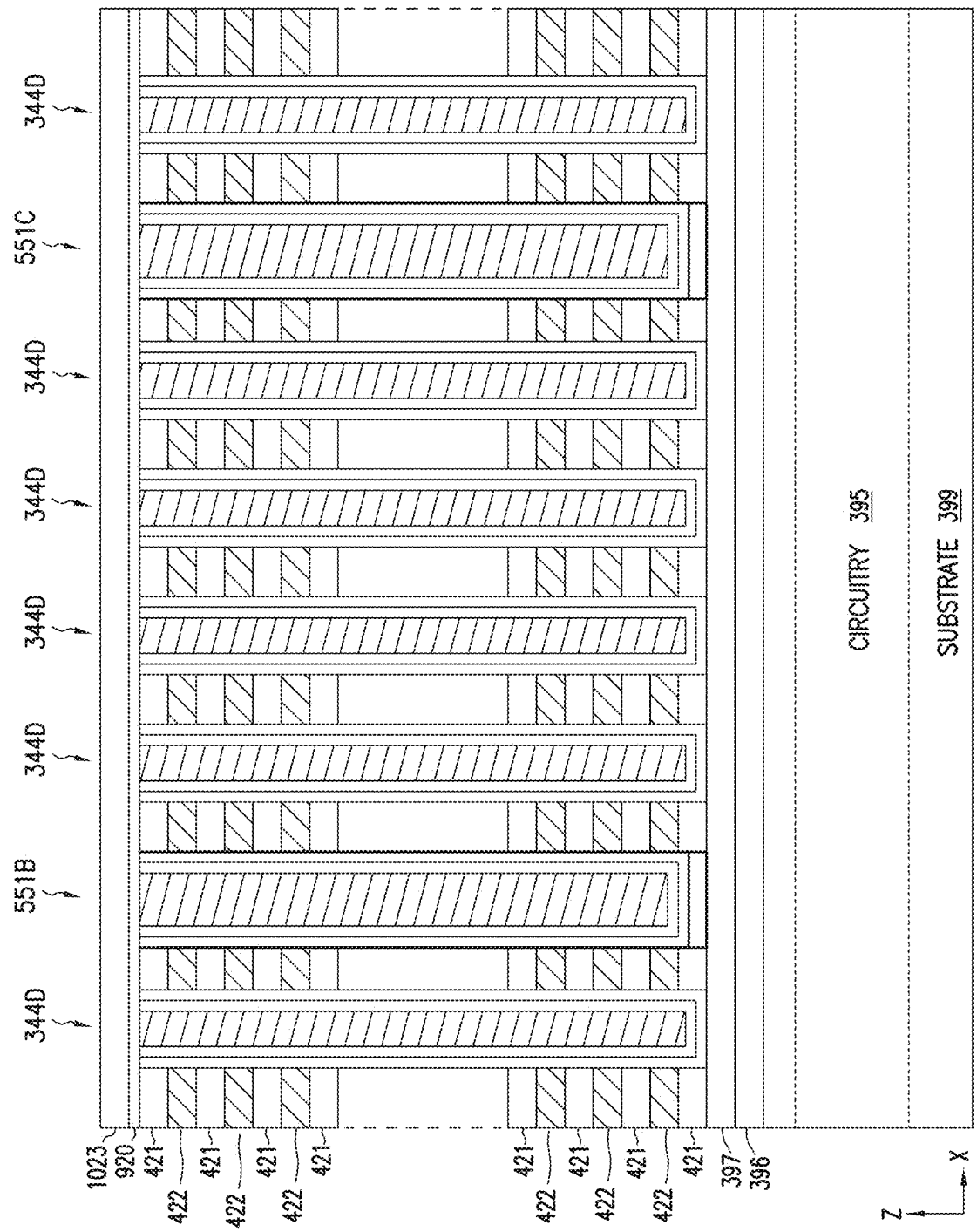

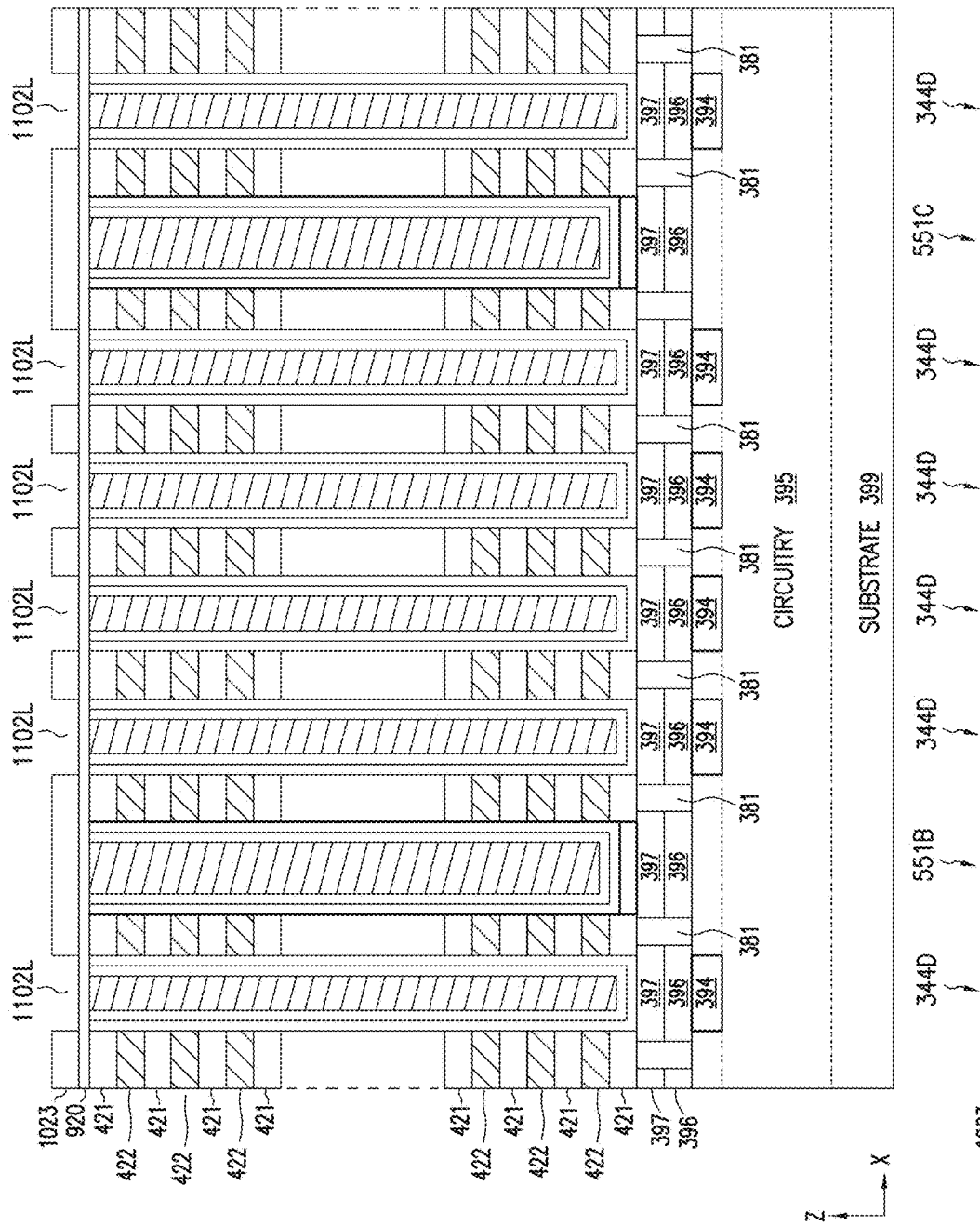
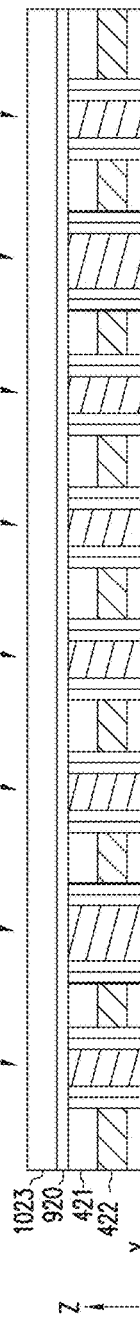
FIG. 11B
FIG. 11A

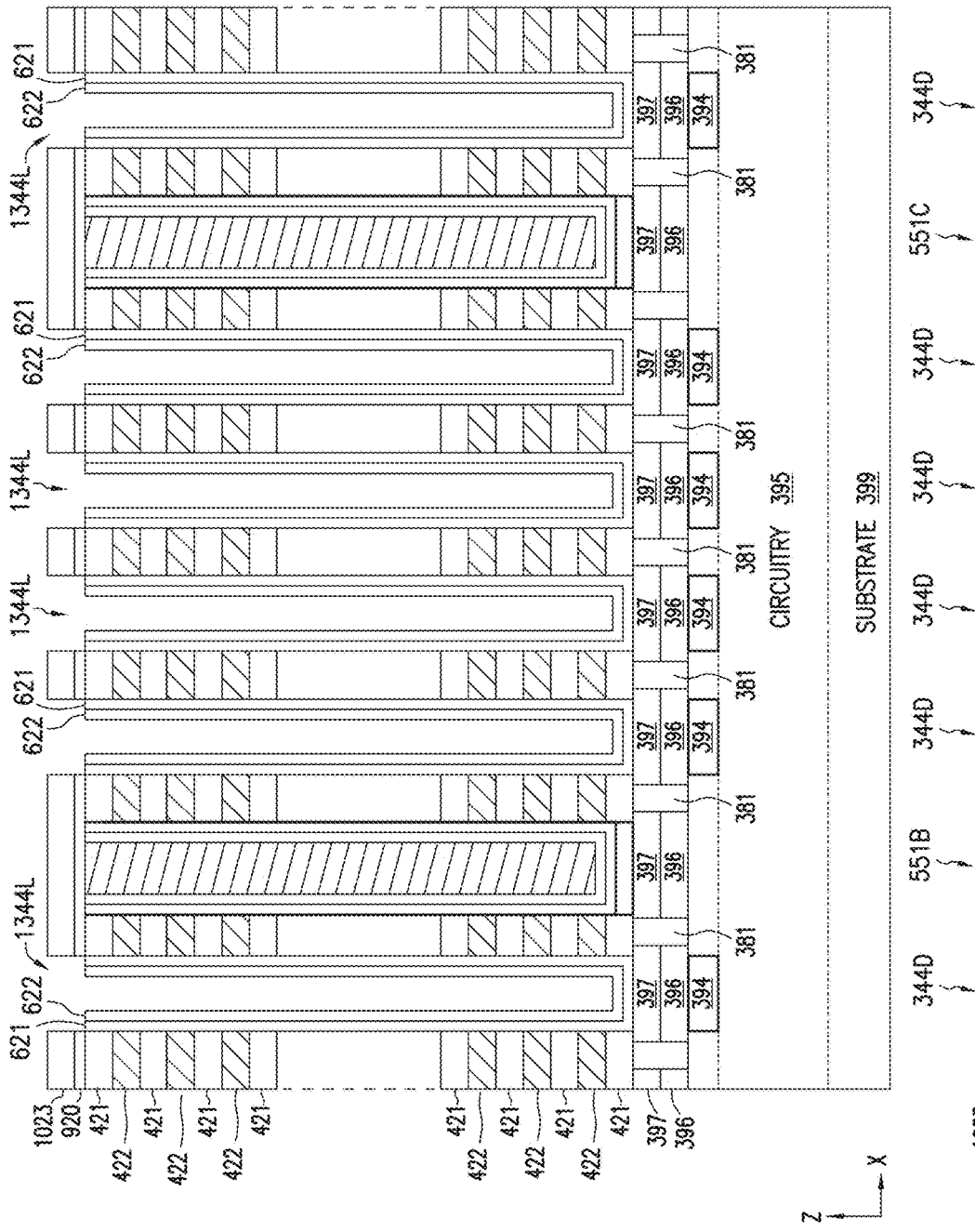

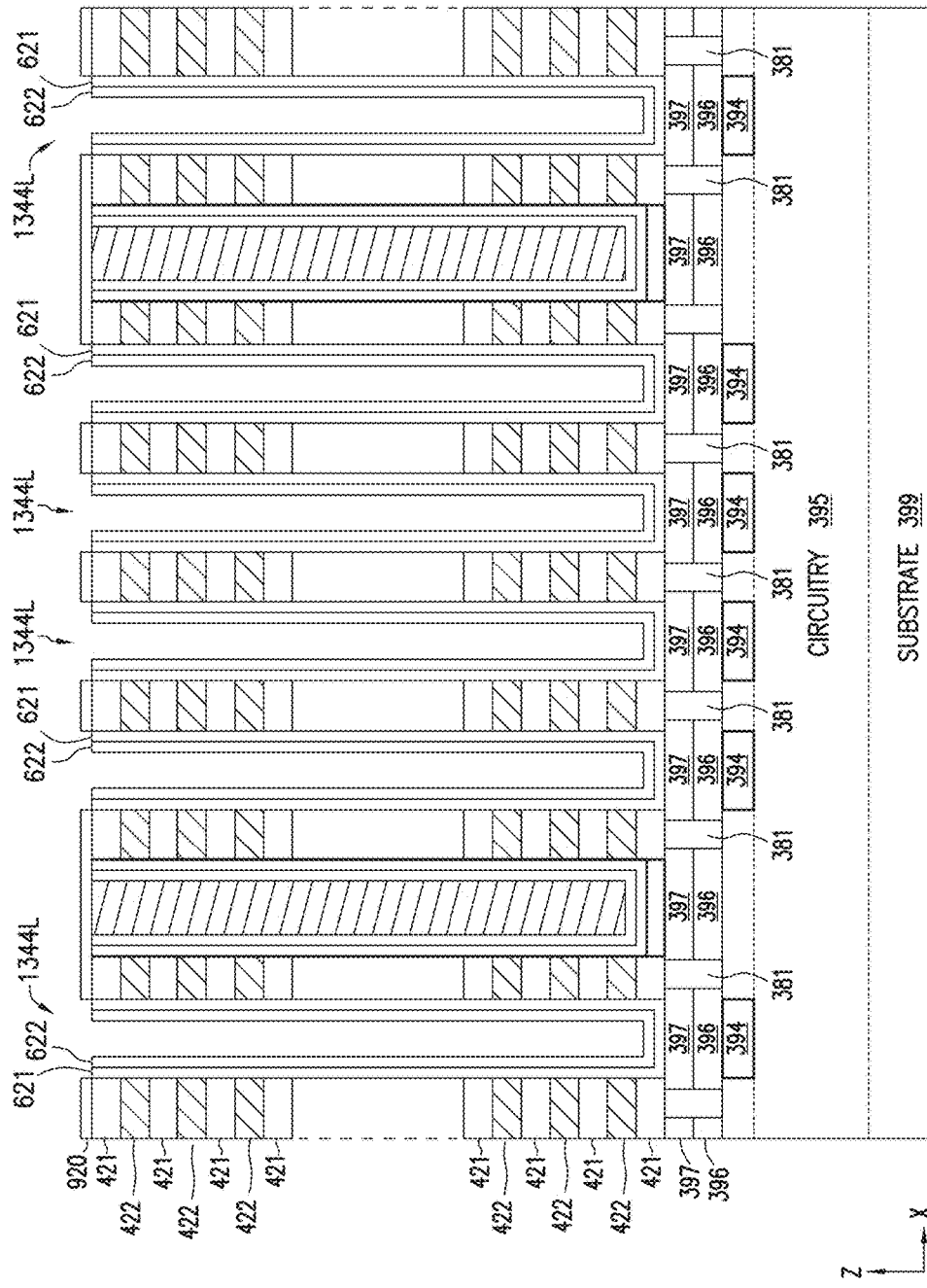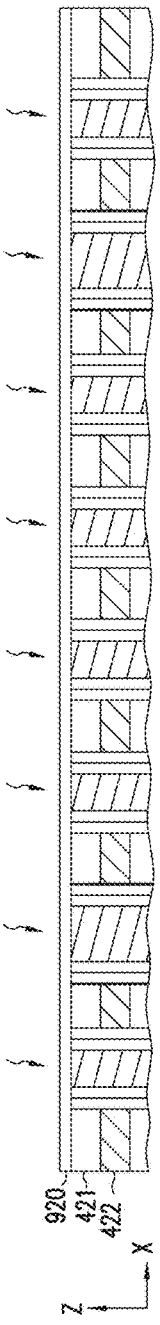

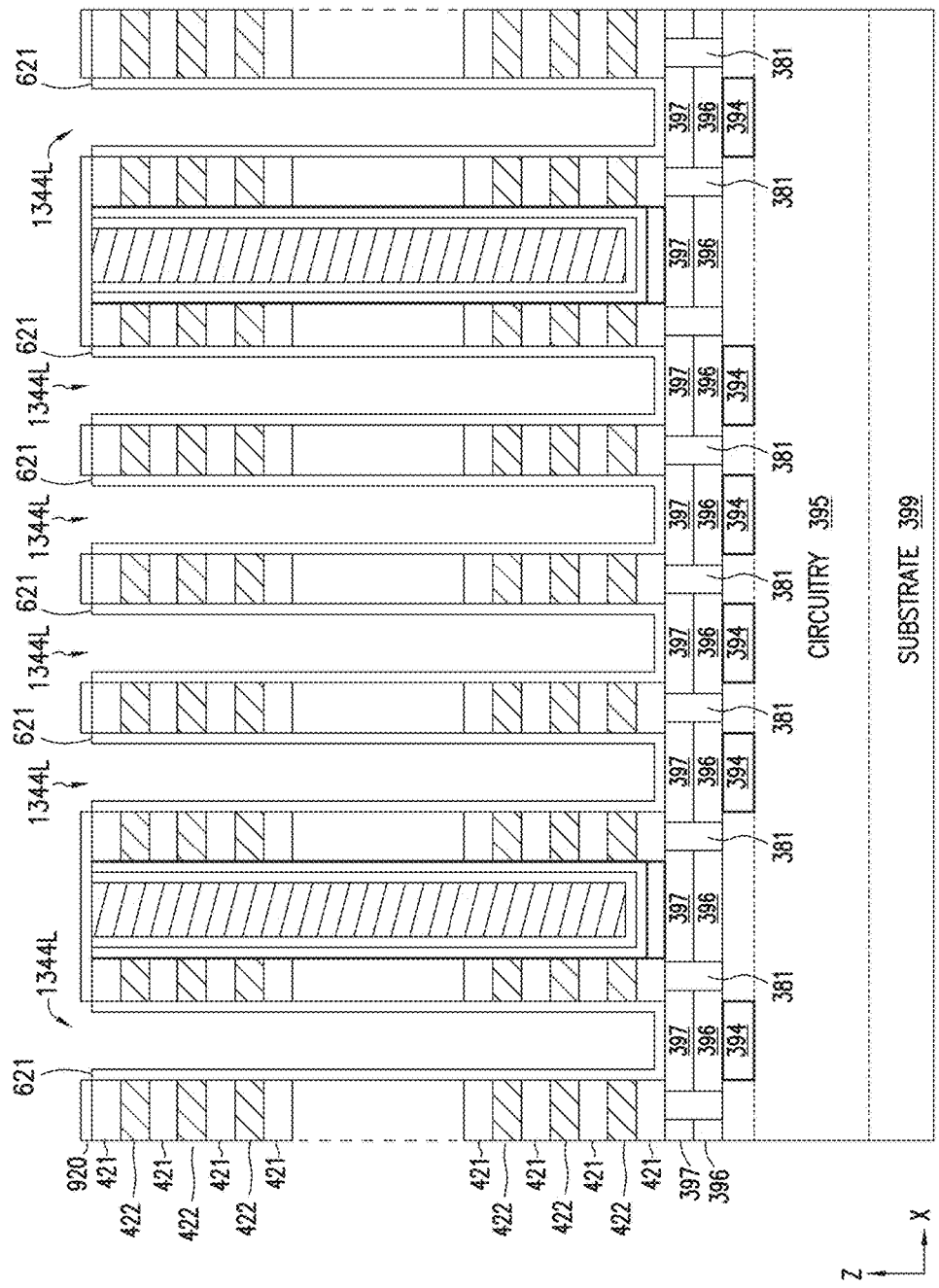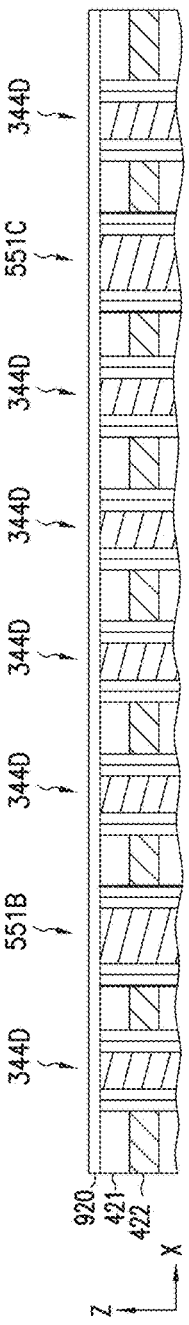

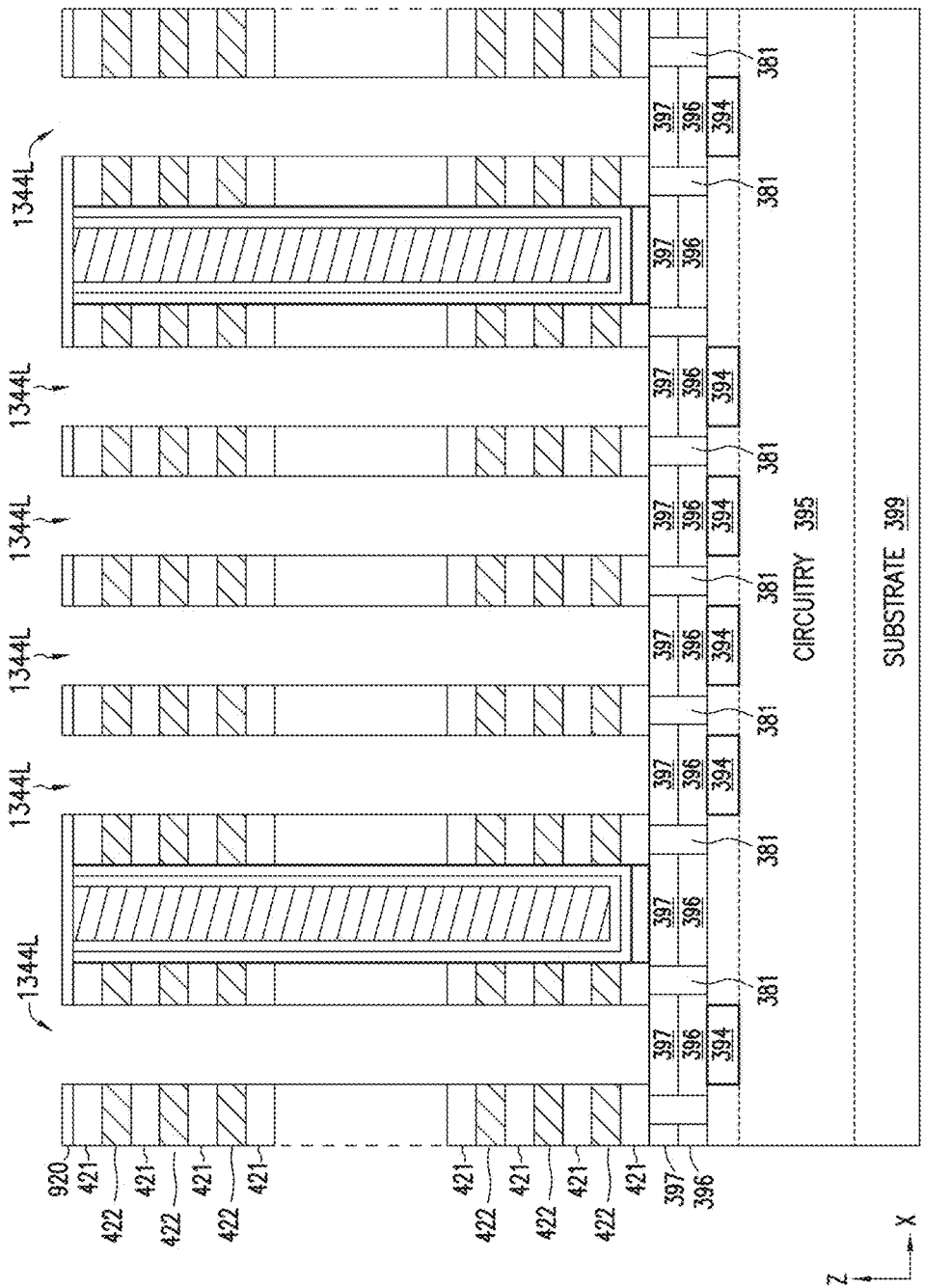
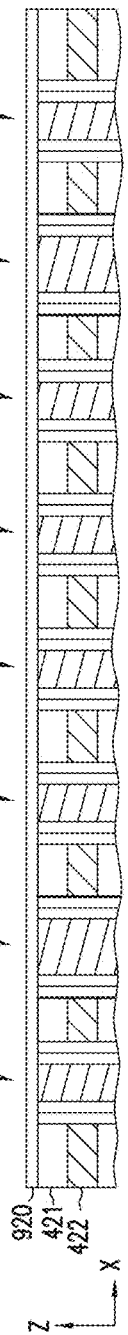
FIG. 16B
FIG. 16A

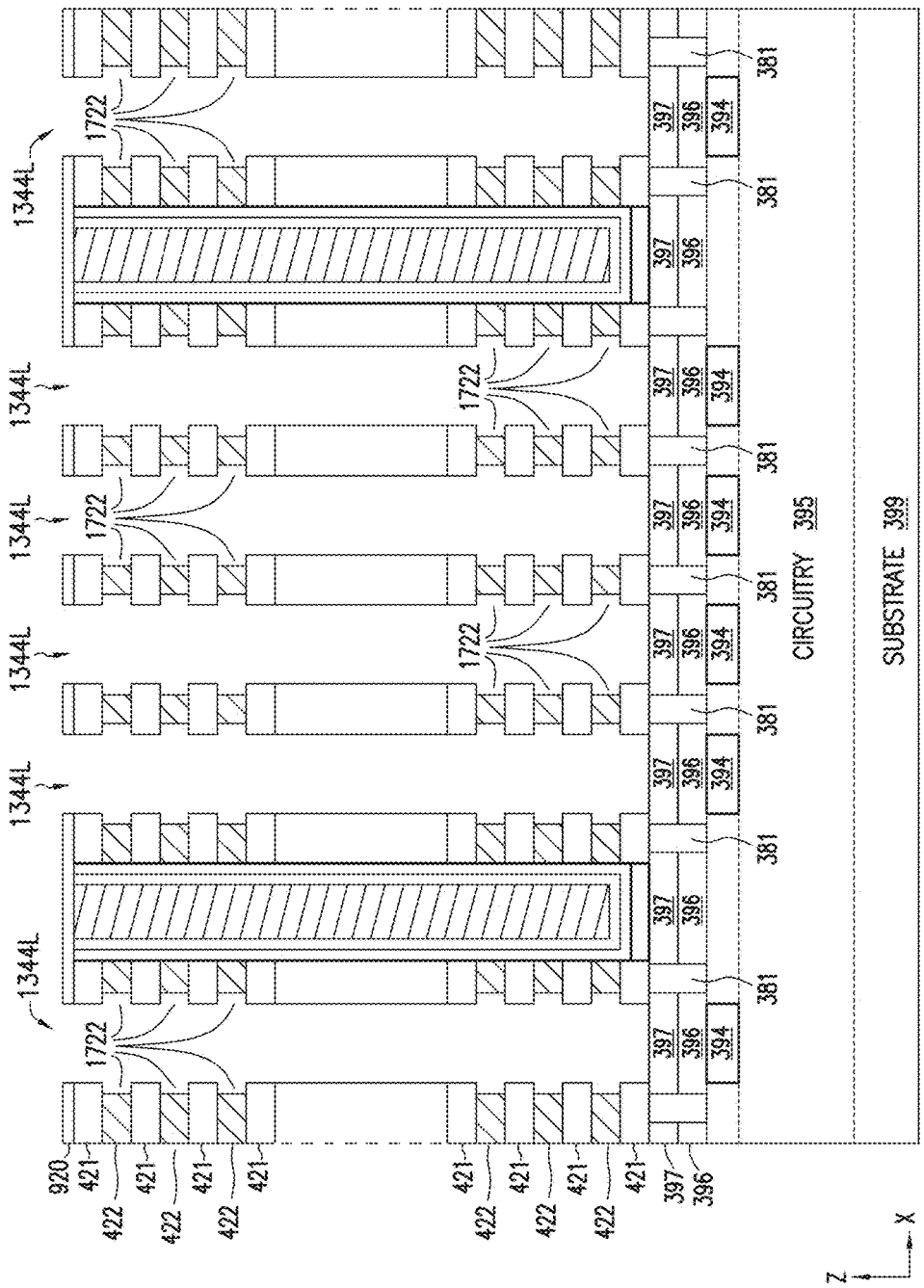
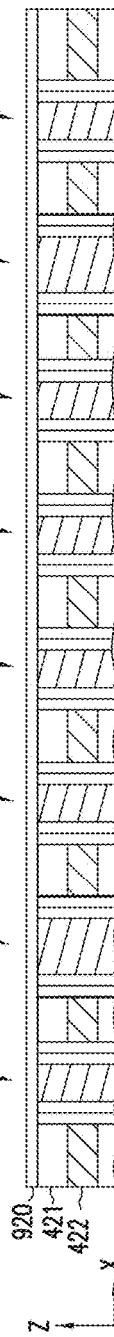

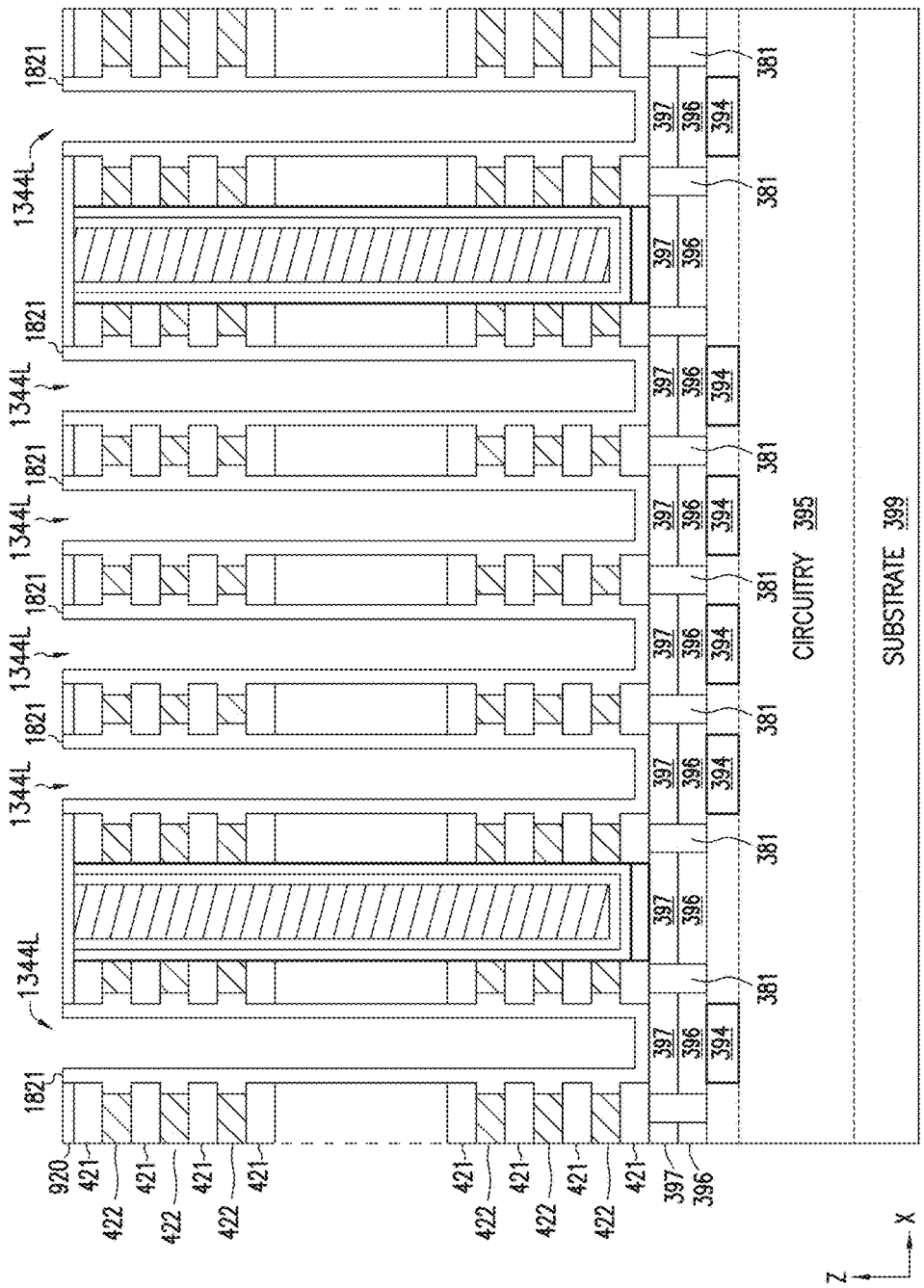
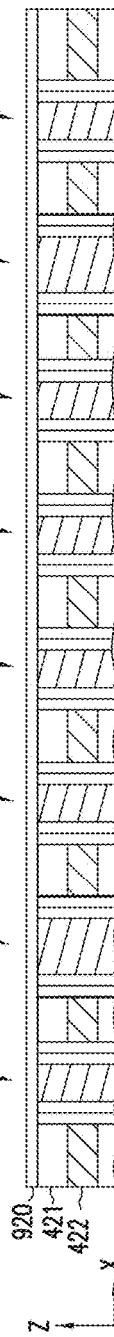

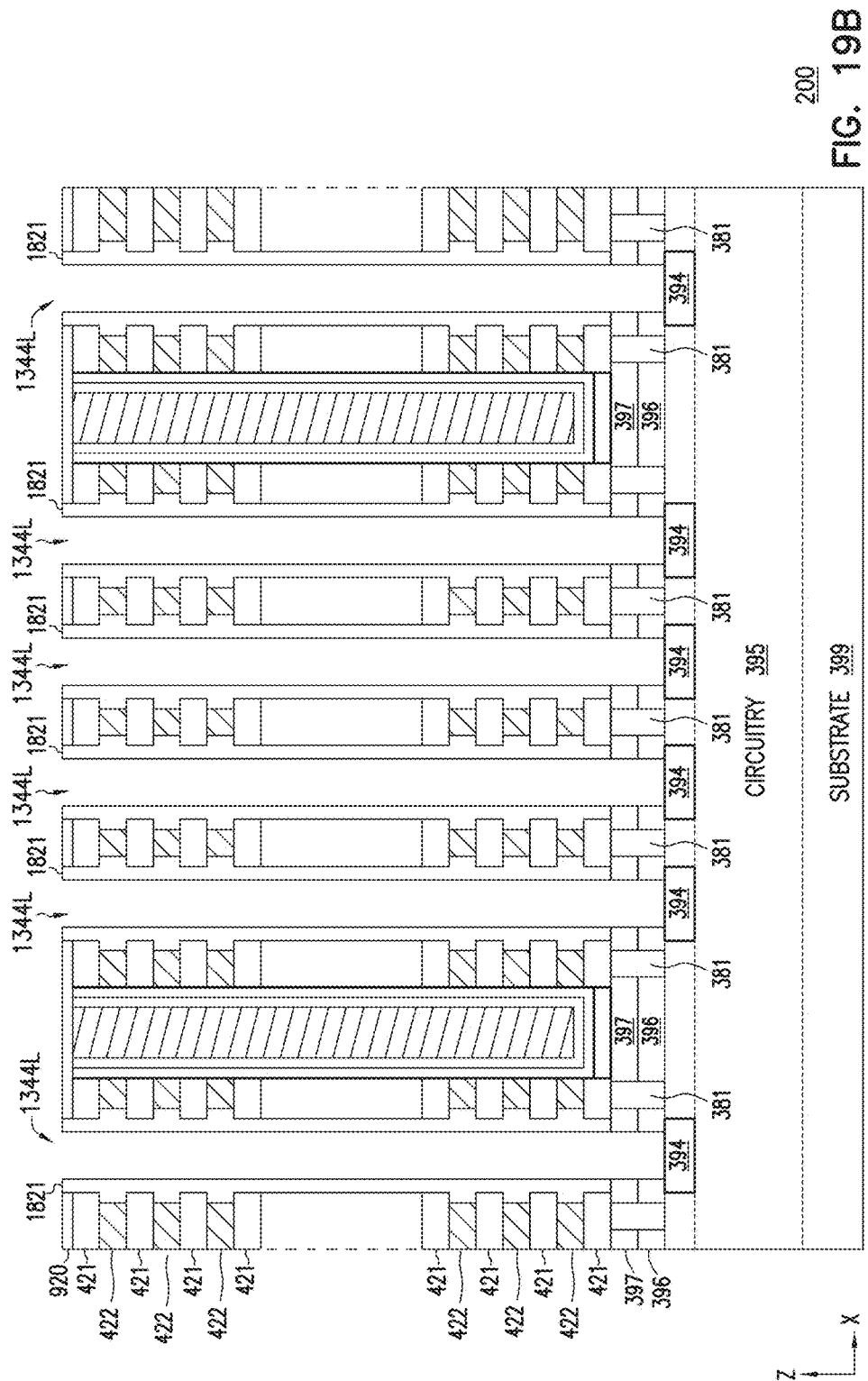
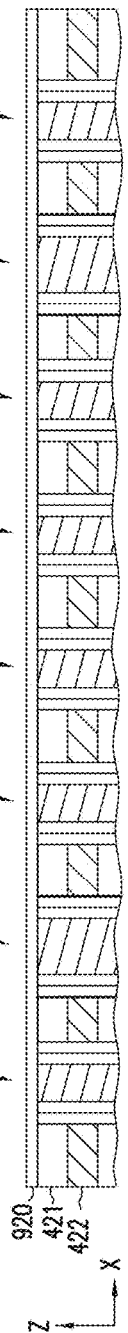

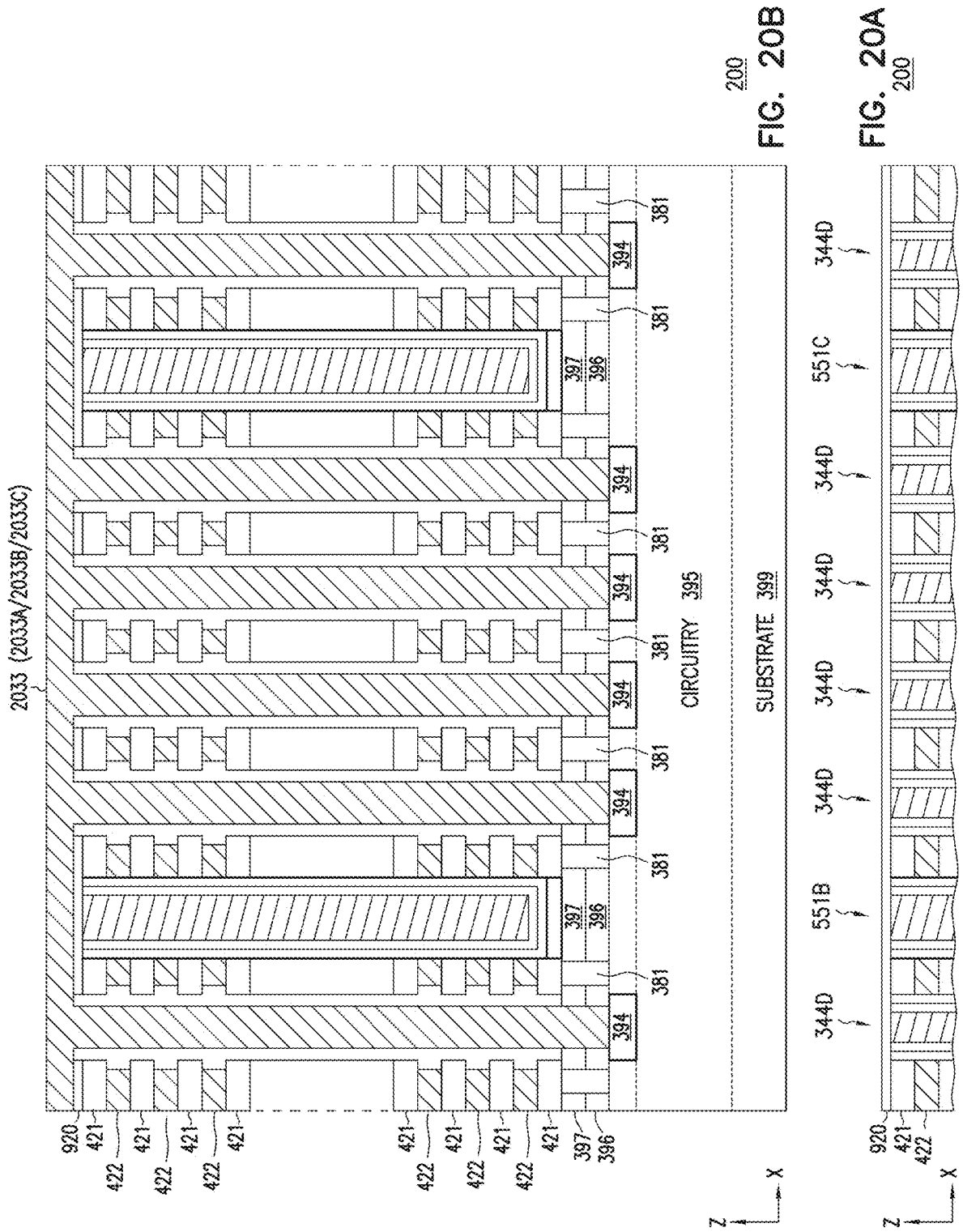

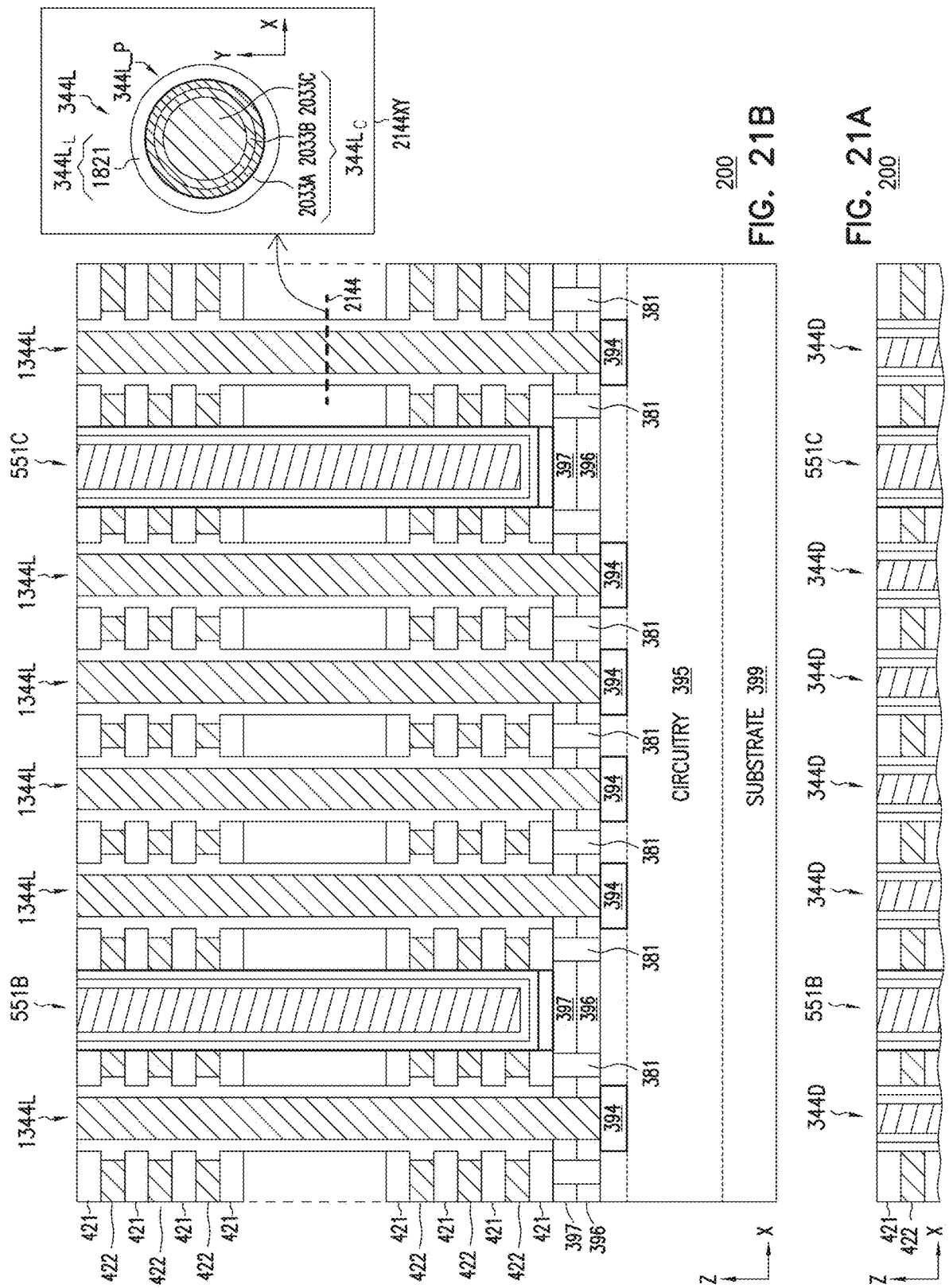

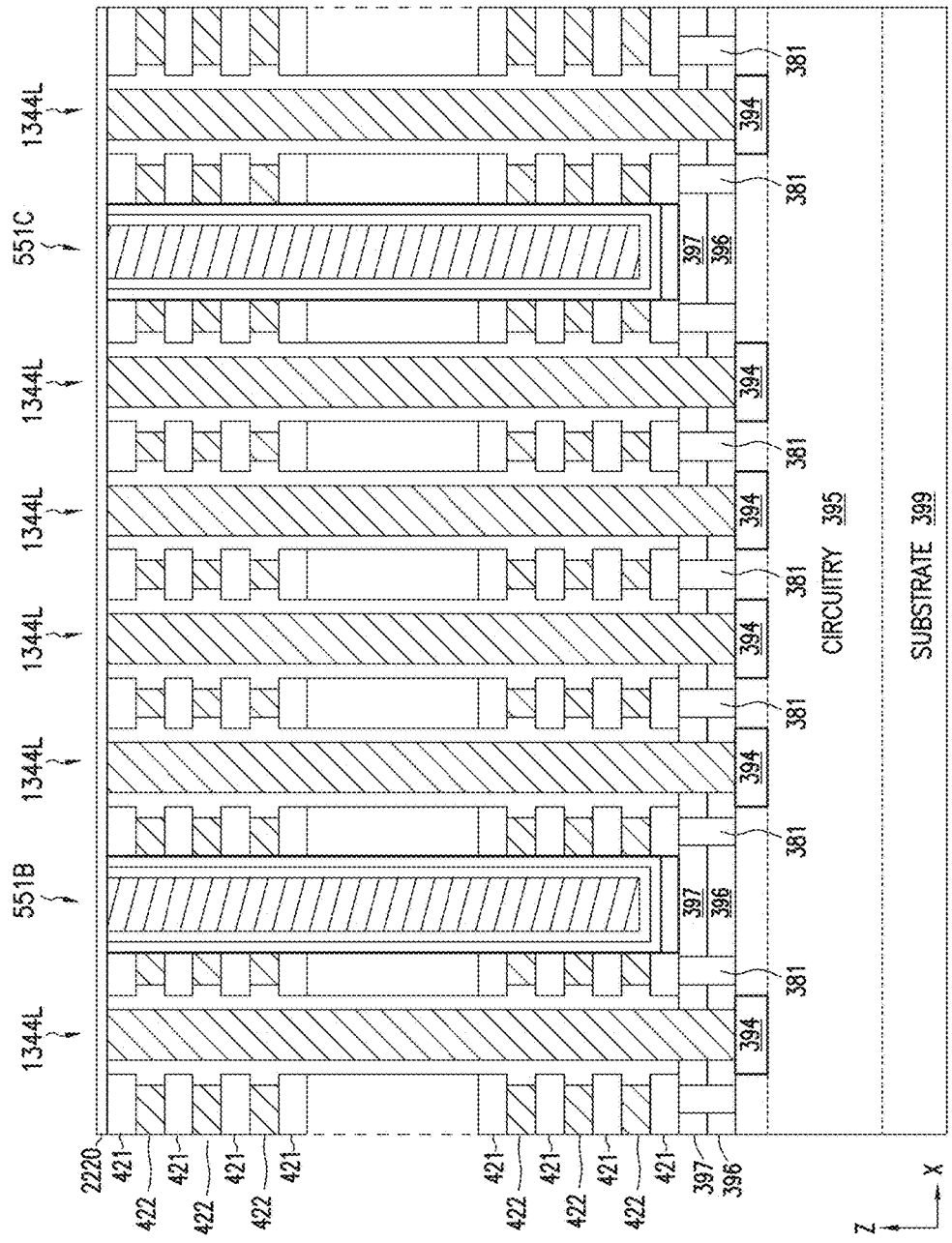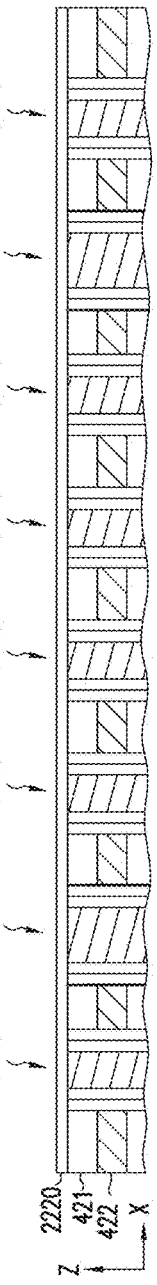
FIG. 22B
FIG. 22A

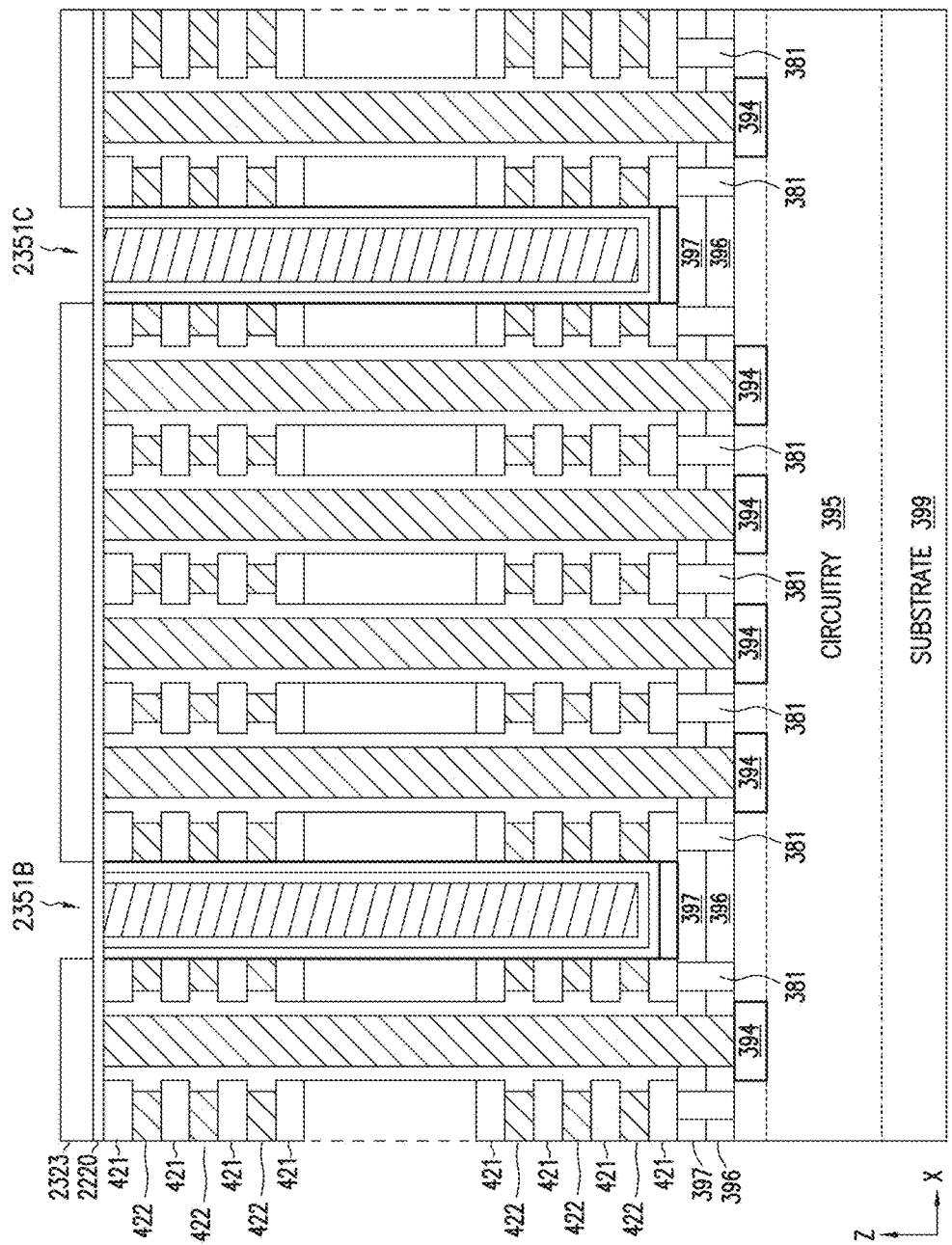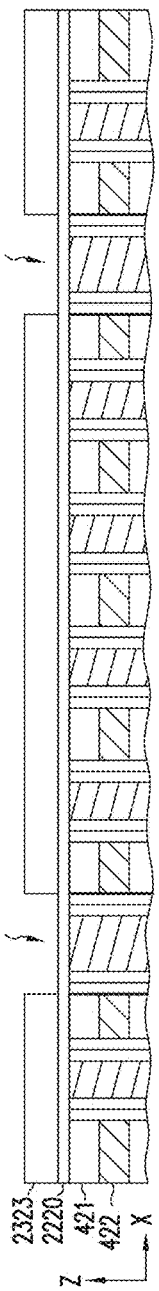
FIG. 23B
FIG. 23A

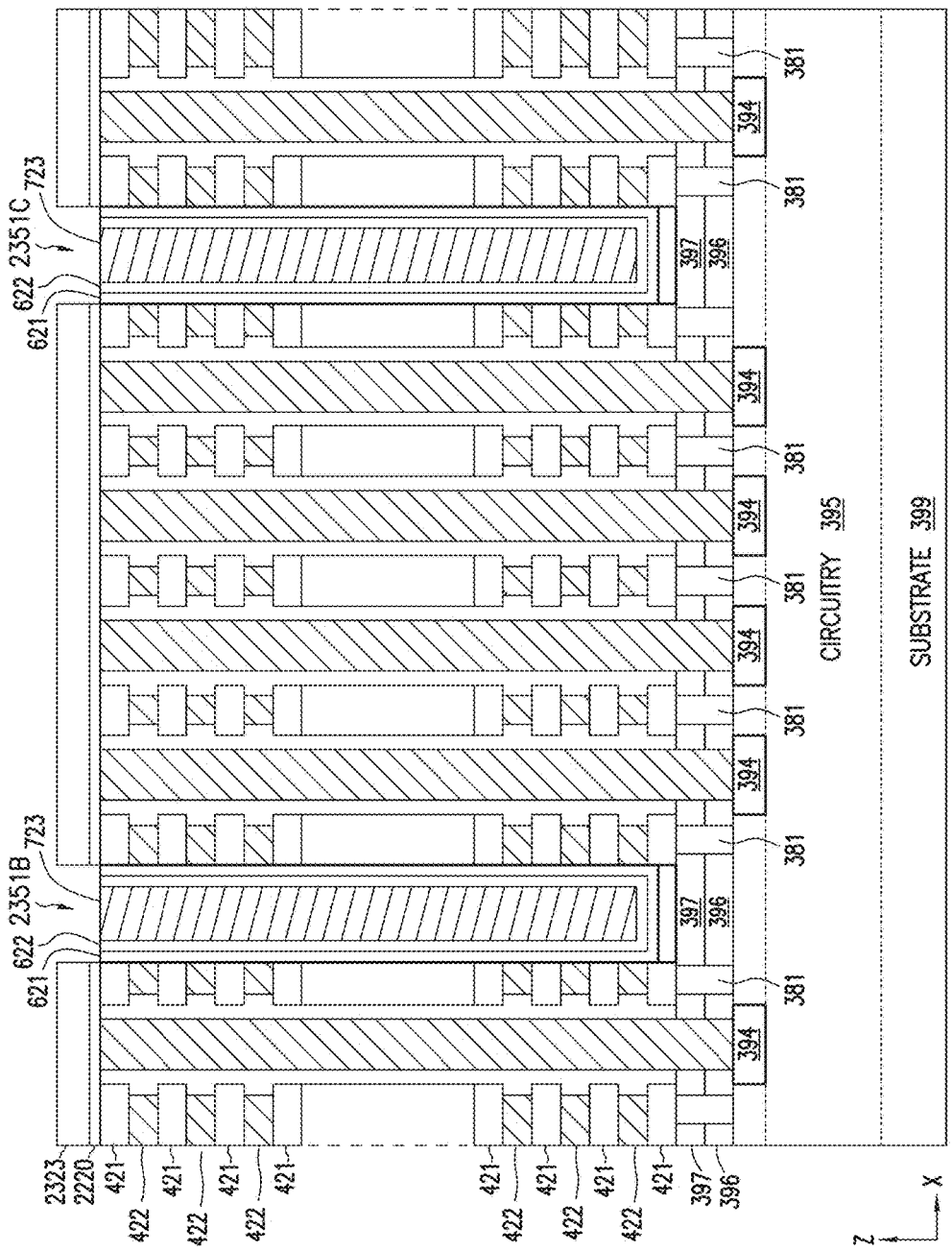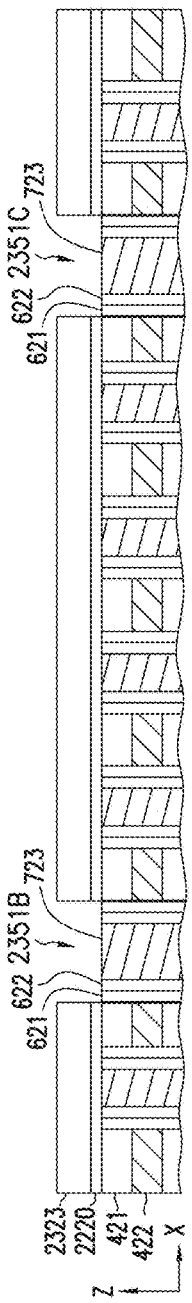

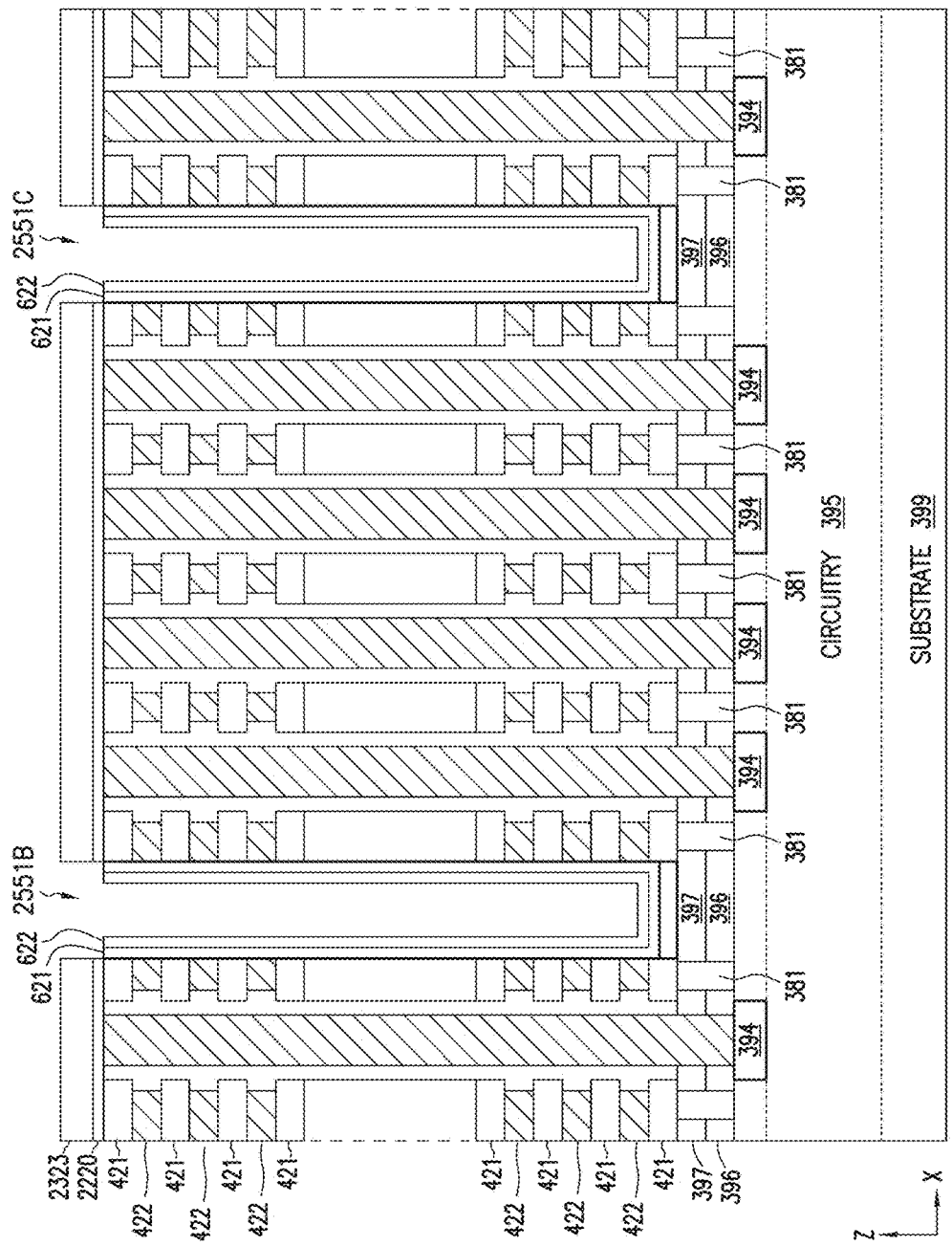
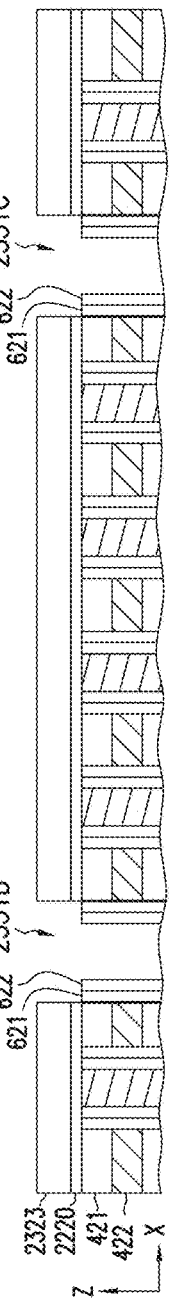
FIG. 25B
FIG. 25A

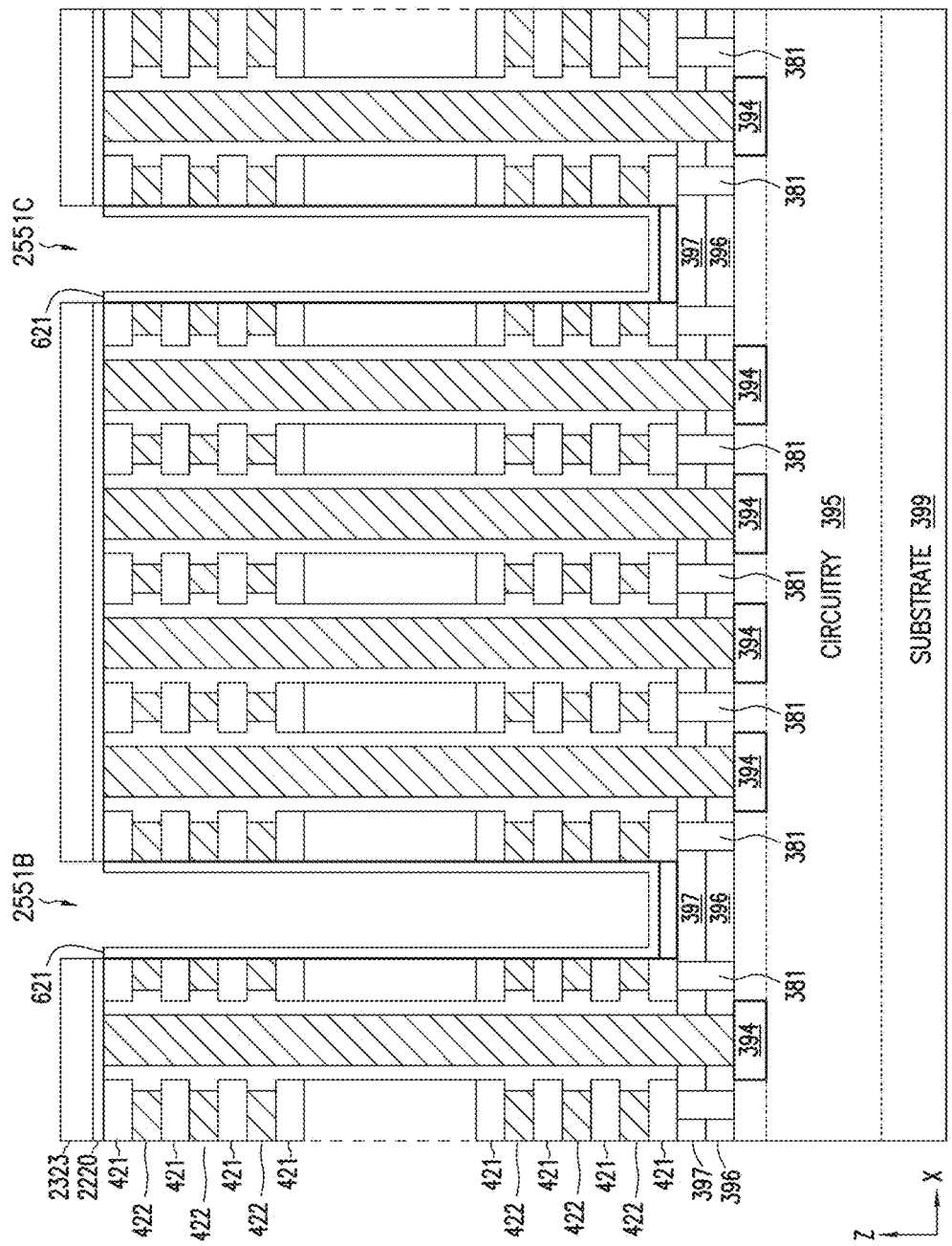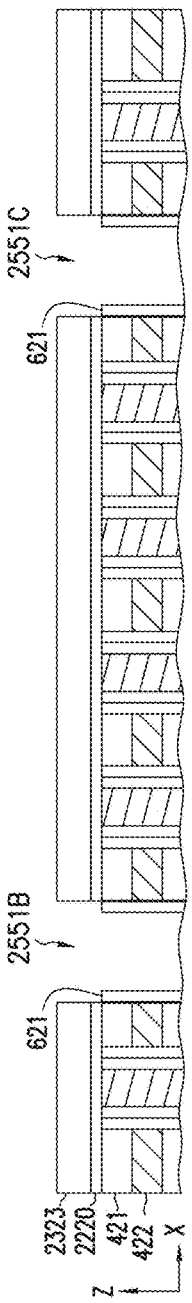

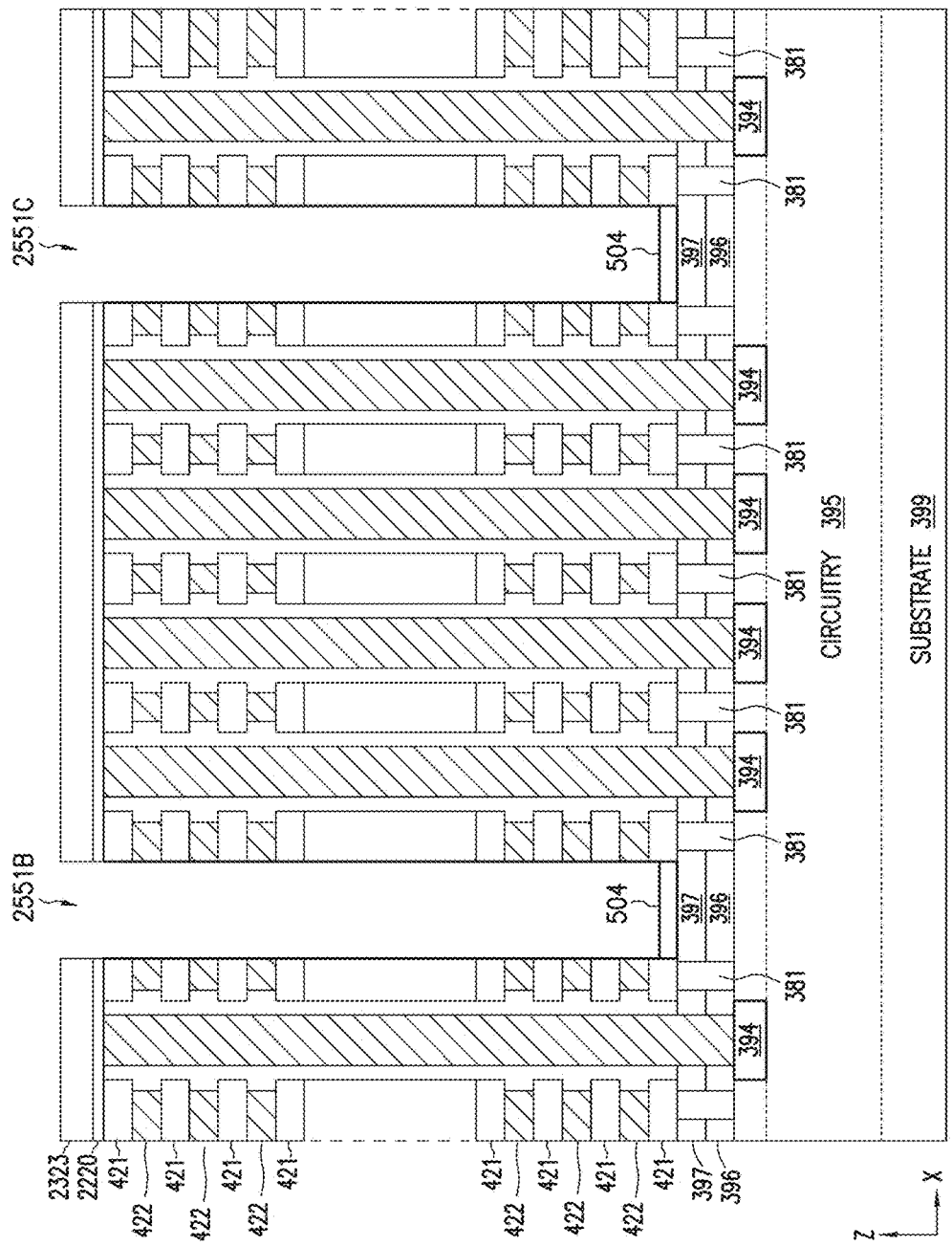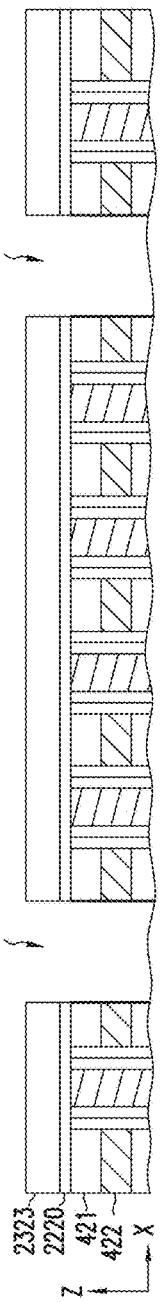

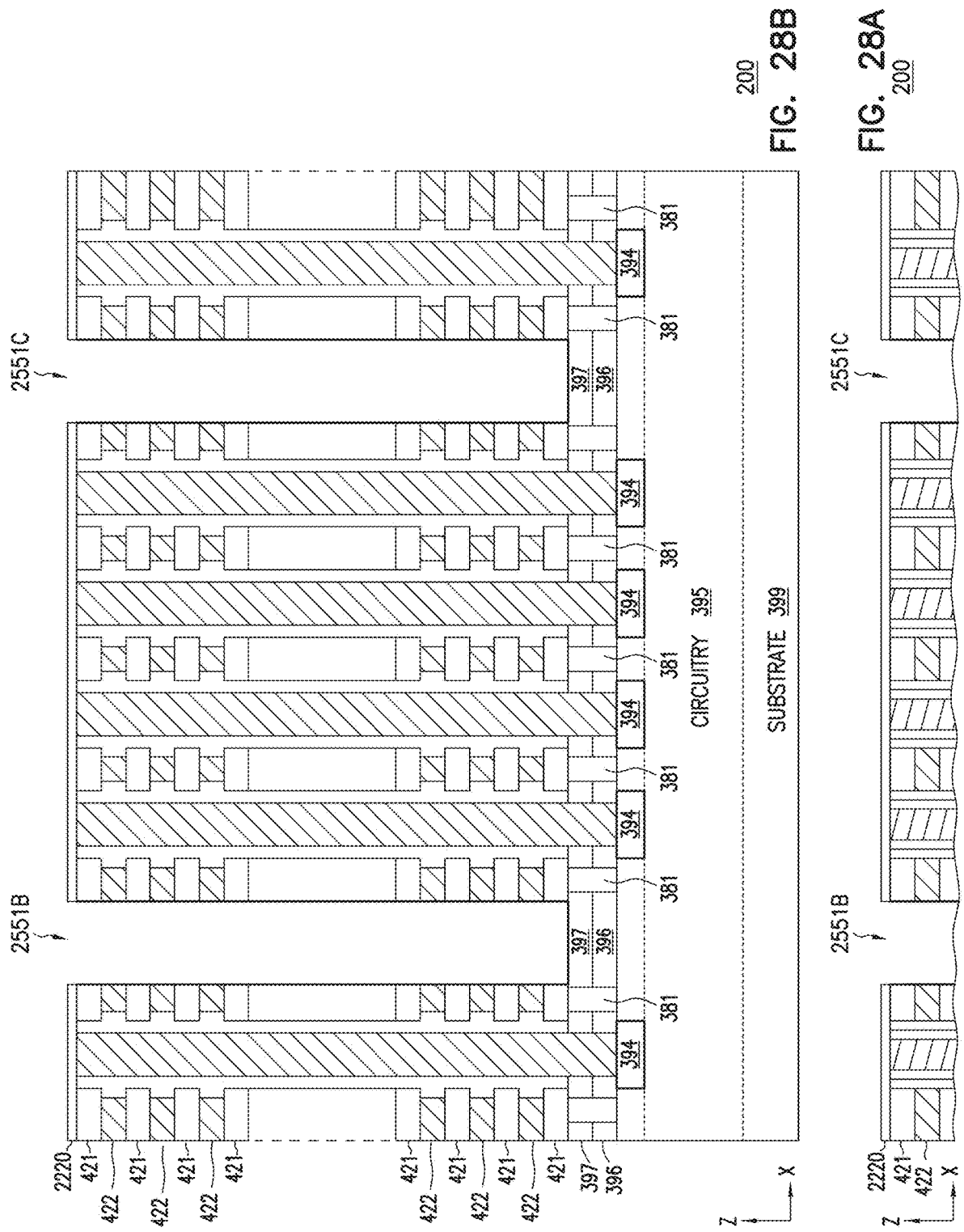

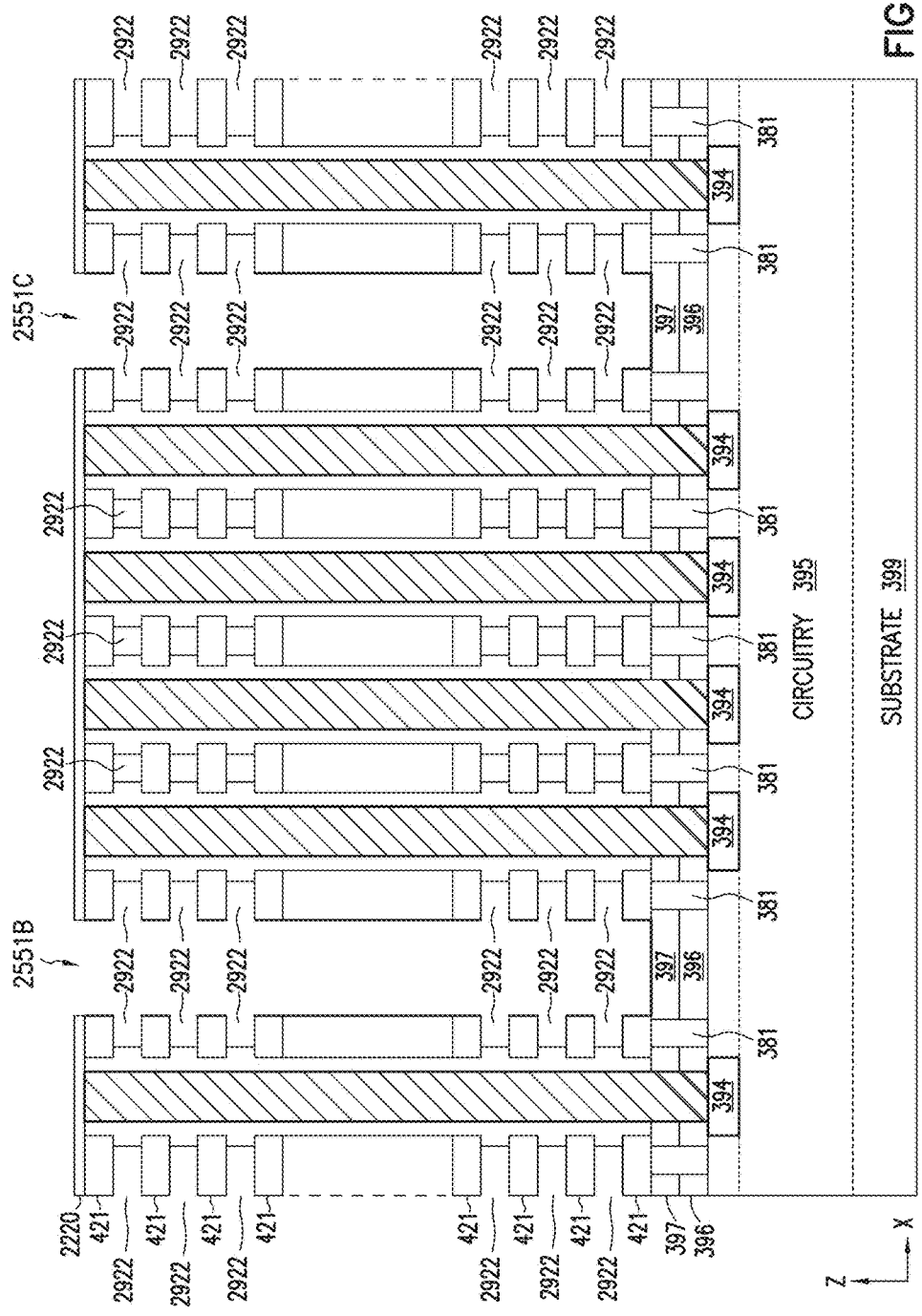

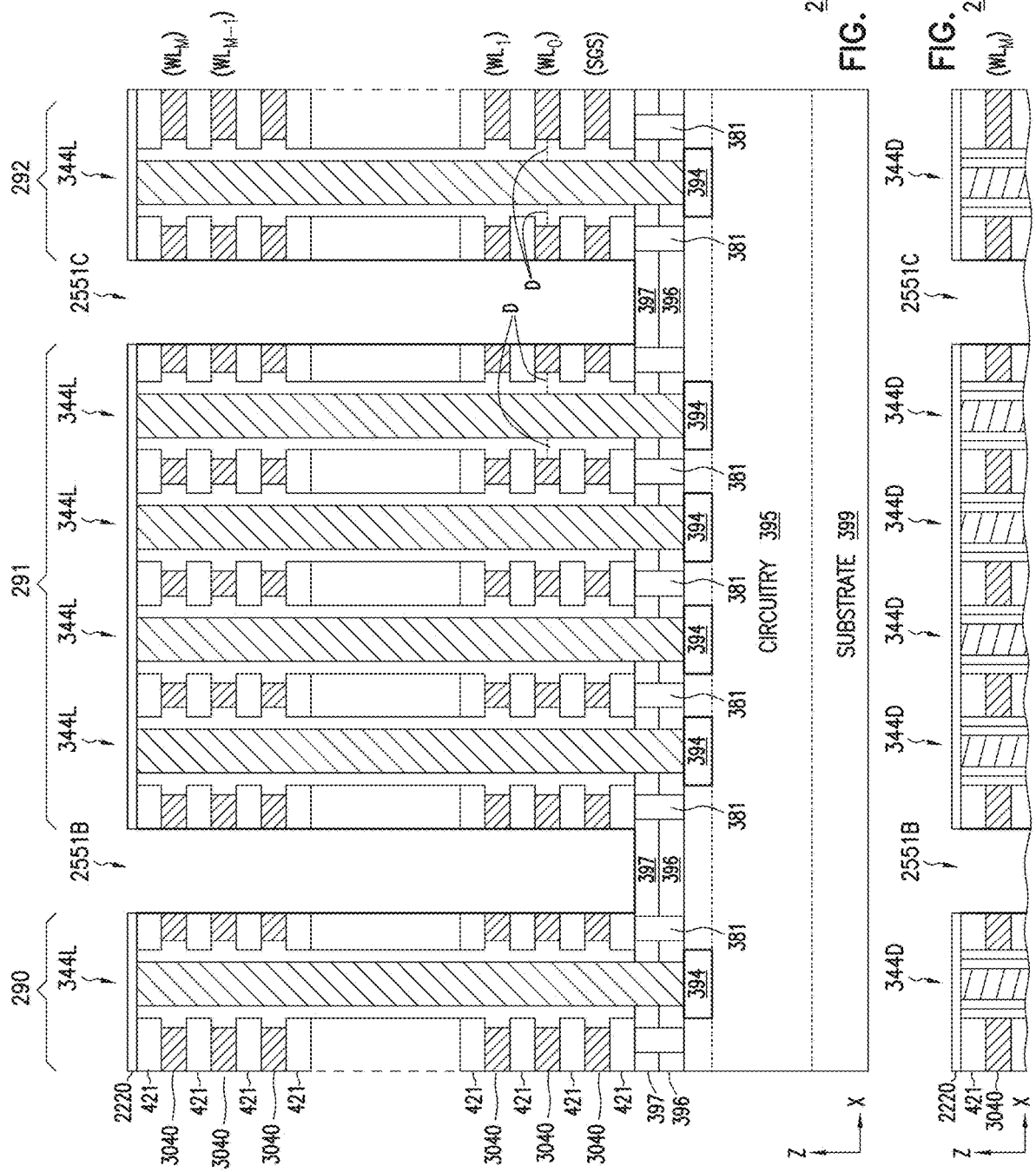

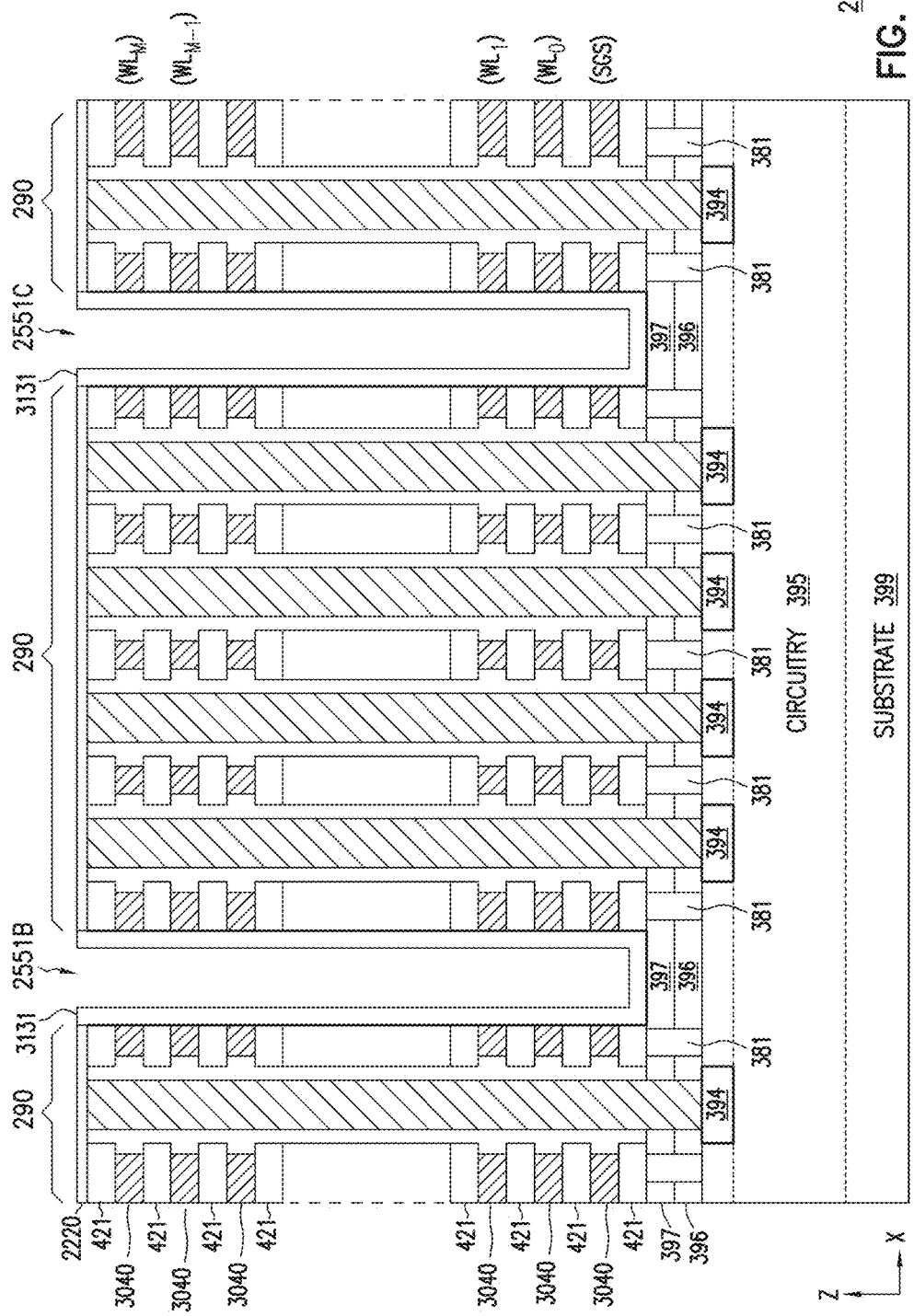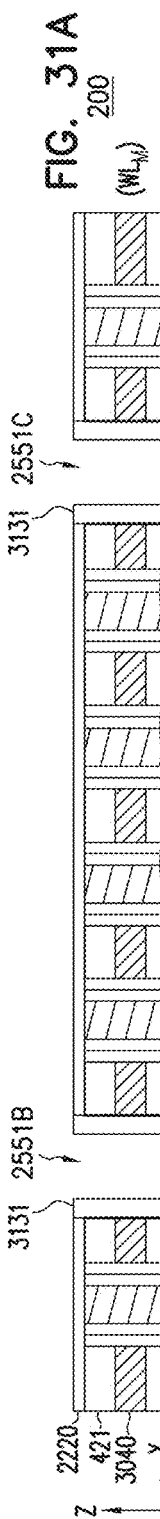

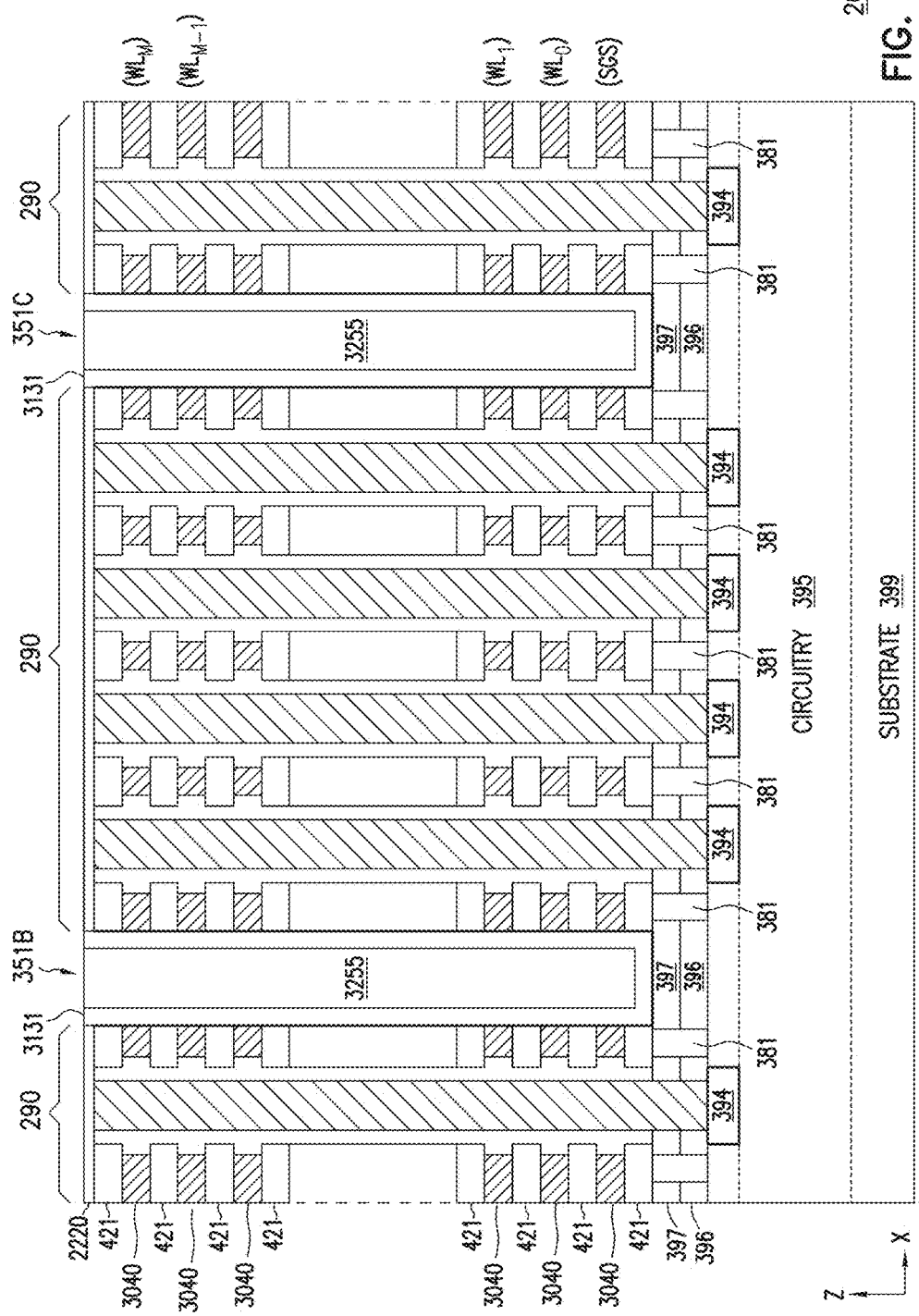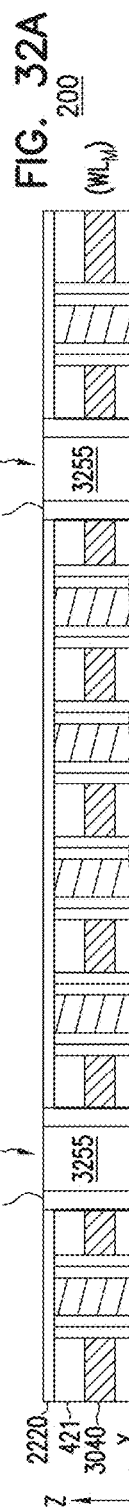

MEMORY DEVICE INCLUDING SUPPORT STRUCTURES AND CONTACT STRUCTURES HAVING DIFFERENT MATERIALS

FIELD

Embodiments described herein relate to memory devices including memory blocks and conductive and non-conductive pillar structures in the memory blocks.

BACKGROUND

Some conventional memory devices have support pillars to support the overall structures of the memory device during manufacturing of the memory device. Such support pillars are formed during manufacturing of the device to prevent different levels (e.g., tiers) of the device from collapsing during manufacturing of the device. The support pillars remain in the finished device. As part of device size reduction, reducing the number of such support structures is a consideration. However, in some memory devices, reducing the number of support pillars while maintaining the strength of the remaining support pillars and the overall structure of the device can be a challenge.

BRIEF DESCRIPTION OF THE DRAWINGS

FIG. 3B shows detail of a portion of the memory device of FIG. 3A, according to some embodiments described herein.

FIG. 4A through FIG. 32B show different views of structures during processes of forming the memory device of FIG. 2 through FIG. 3I, according to some embodiments described herein.

DETAILED DESCRIPTION

The techniques described herein involve a memory device having improved support structures to reduce or mitigate stress imbalance in some regions (e.g., staircase regions and edges) of the memory device. Reduction of the stress imbalance can prevent or reduce undesirable physical bending of memory blocks and support pillars of the memory device. Undesirable cracking and lifting issues (e.g., at edges of the memory blocks) of the memory device can also be reduced or mitigated. In some examples, the support structures described herein include support pillars that have materials different from the materials of contact pillars adjacent the support pillars. Example materials for the support structures are described below. Such materials allow the support structures to provide an improved stress imbalance mitigation as mentioned above. Improvements and benefits of the described techniques are further discussed below with reference to FIG. 1 through FIG. 32B.

Figure 1:
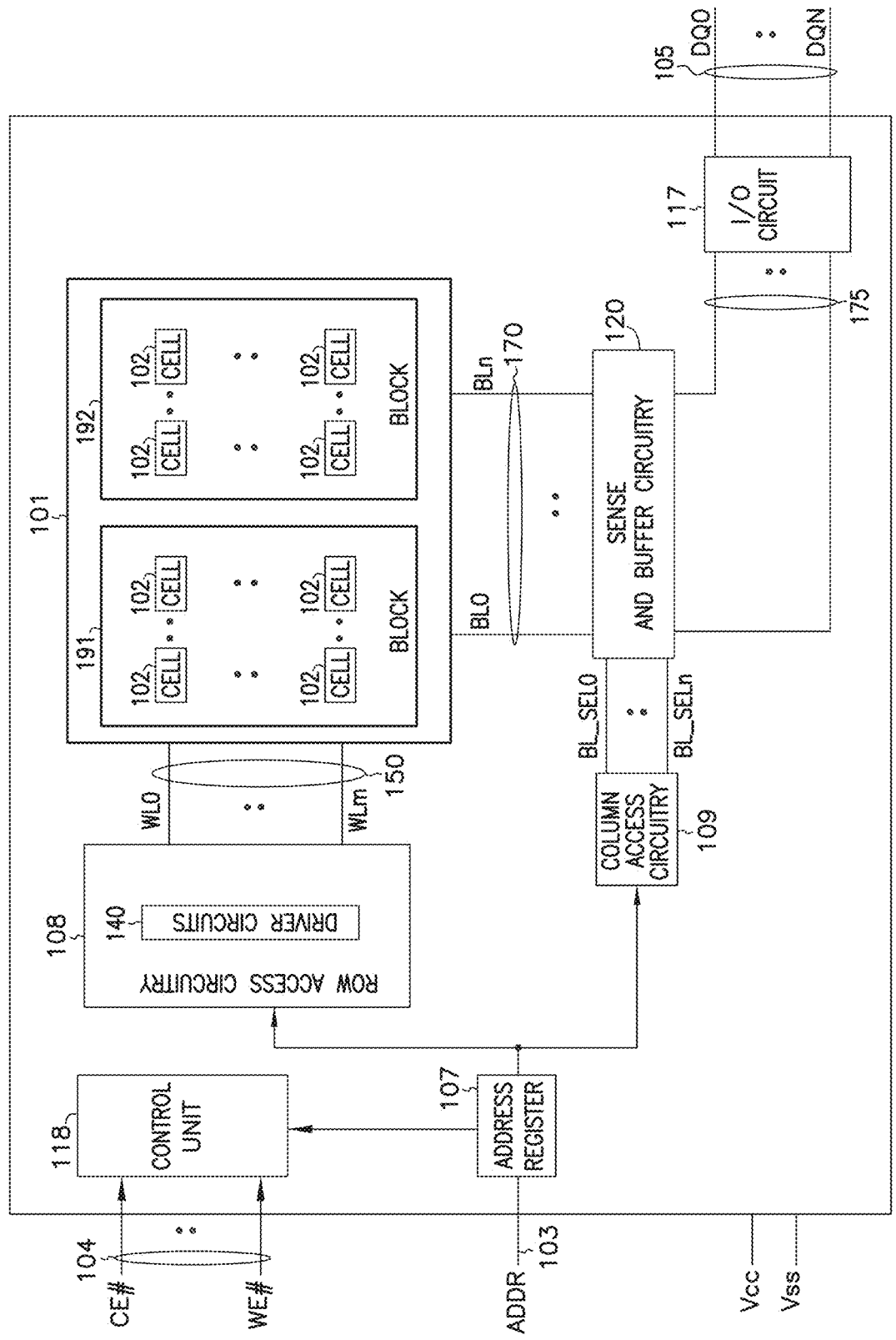
FIG. 1 shows an apparatus in the form of a memory device, according to some embodiments described herein.

FIG. 1 shows an apparatus in the form of a memory device 100, according to some embodiments described herein. Memory device 100 can include a memory array (or multiple memory arrays) 101 containing memory cells 102 arranged in blocks (blocks of memory cells), such as blocks 191 and 192. In the physical structure of memory device 100, memory cells 102 can be arranged vertically (e.g., stacked one over another) over a substrate (e.g., a semiconductor substrate) of memory device 100. FIG. 1 shows memory device 100 having two blocks 191 and 192 as an example. Memory device 100 can have more than two blocks.

As shown in FIG. 1, memory device 100 can include access lines 150 and data lines 170. Access lines 150 can include word lines, which can include global word lines and local word lines (e.g., control gates). Data lines 170 can include bit lines (e.g., local bit lines). Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks 191 and 192 and data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which blocks 191 and 192 are to be accessed during a memory operation. Memory device 100 can include drivers (driver circuits) 140, which can be part of row access circuitry 108. Drivers 140 can operate (e.g., operate as switches) to form (or not to form) conductive paths (e.g., current paths) between nodes providing voltages and respective access lines 150 during operations of memory device 100.

Memory device 100 can perform a read operation to read (e.g., sense) information (e.g., previously stored information) from memory cells 102 of blocks 191 and 192, or a write (e.g., programming) operation to store (e.g., program) information in memory cells 102 of blocks 191 and 192. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks 191 and 192.

Memory device 100 can include a control unit 118 that can be configured to control memory operations of memory device 100 based on control signals on lines 104. Examples of the control signals on lines 104 include one or more clock signals and other signals (e.g., a chip-enable signal CE #, a write-enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that may cause memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks 191 and 192 and provide the value of the information to lines 175, which can include global data lines (e.g., global bit lines). Sense and buffer circuitry 120 can also be configured to use signals on lines 175 to determine the value of information to be stored (e.g., programmed) in memory cells 102 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 102 of blocks 191 and 192 and lines (e.g., I/O lines) 105. Signals DQ0 through DQN on lines 105 can represent information read from or stored in memory cells 102 of blocks 191 and 192. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random-Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 32B.

Figure 2:
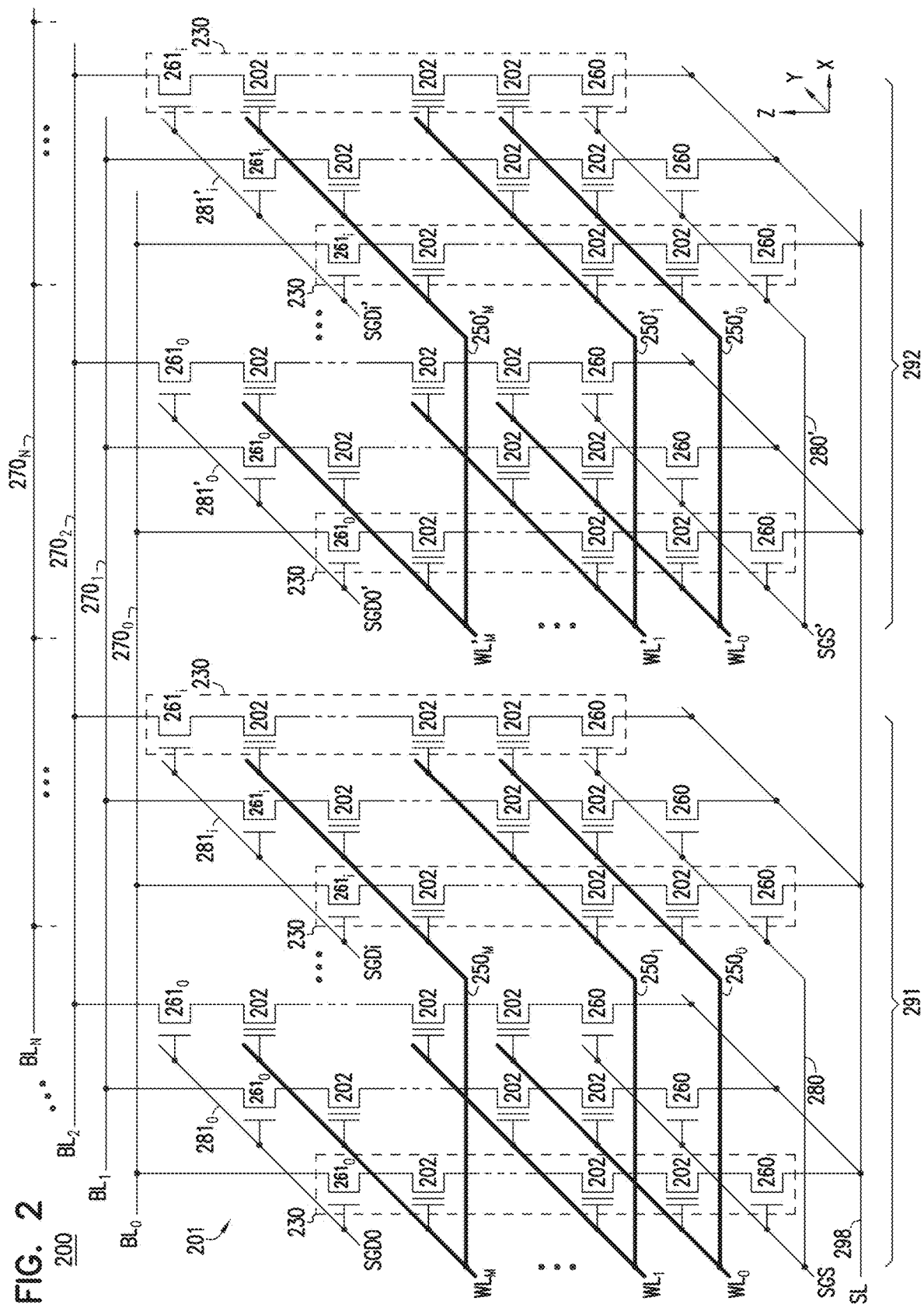
FIG. 2 shows a schematic of an apparatus in the form a memory device having a memory cell array and memory cell blocks, according to some embodiments described herein.

FIG. 2 shows a schematic of an apparatus in the form a memory device 200 having a memory cell array 201 and blocks (e.g., memory cell blocks) 291 and 292, according to some embodiments described herein. Memory device 200 can include a non-volatile (e.g., NAND flash memory device) or other types of memory devices. Memory device 200 can correspond to memory device 100. For example, memory array (or multiple memory arrays) 201 and blocks 291 and 292 can correspond to memory array 101 and blocks 191 and 192, respectively, of memory device 100 of FIG. 1.

As shown in FIG. 2, memory device 200 can include memory cells 202, data lines $270_0$ through $270_N$ ($270_0$-$270_N$), control gates $250_0$ through $250_M$ in block 291, and control gates $250'_0$ through $250'_M$ in block 292. Data lines $270_0$-$270_N$ can correspond to part of data lines 170 of memory device 100 of FIG. 1. In FIG. 2, label "N" (index N) next to a number (e.g., $270_N$) represents the number of data lines of memory device 200. For example, if memory device 200 includes 16 data lines, then N is 15 (data lines $270_0$ through $270_{15}$). In FIG. 2, label "M" (index M) next to a number (e.g., $250_M$) represents the number of control gates of memory device 200. For example, if memory device 200 includes 128 control gates, then M is 127 (control gates $250_0$ through $250_{127}$). Memory device 200 can have the same number of control gates (e.g., M−1 control gates) among the blocks (e.g., blocks 291 and 292) of memory device 200.

In FIG. 2, data lines $270_0$-$270_N$ can include (or can be part of) bit lines (e.g., local bit lines) of memory device 200. As shown in FIG. 2, data lines $270_0$-$270_N$ can carry signals (e.g., bit line signals) $BL_0$ through $BL_N$, respectively. In the physical structure of memory device 200, data lines $270_0$-$270_N$ can be structured as conductive lines and have respective lengths extending in the Y-direction (e.g., a direction from one memory block to another).

As shown in FIG. 2, memory cells 202 can be organized into separate blocks (memory blocks or blocks of memory cells) such as blocks 291 and 292. FIG. 2 shows memory device 200 including two blocks 291 and 292 as an example. However, memory device 200 can include numerous blocks. The blocks (e.g., blocks 291 and 292) of memory device 200 can share data lines (e.g., data lines $270_0$-$270_N$) to carry information (in the form of signals) read from or to be stored in memory cells of selected memory cells (e.g., selected memory cells in block 291 or 292) of memory device 200.

Control gates $250_0$-$250_M$ in block 291 can be part of local word lines, which can be part of (or can be coupled to) access lines (e.g., global word lines) of memory device 200 that can correspond to access lines 150 of memory device 100 of FIG. 1. Control gates $250'_0$-$250'_M$ in block 292 can be another part of other local word lines, which can be part of access lines (e.g., global word lines) of memory device 200. Control gates $250_0$-$250_M$ can be electrically separated from control gates $250'_0$-$250'_M$. Thus, blocks 291 and 292 can be accessed separately (e.g., accessed one at a time). For example, block 291 can be accessed at one time using control gates $250_0$-$250_M$, and block 292 can be accessed at another time using control gates $250'_0$-$250'_M$ at another time.

FIG. 2 shows directions X, Y, and Z that can be relative to the physical directions (e.g., dimensions) of the structure of memory device 200. For example, the Z-direction can be a direction perpendicular to (e.g., vertical direction with respect to) a substrate of memory device 200 (e.g., a substrate 399 shown in FIG. 3C). The Z-direction is perpendicular to the X-direction and Y-direction (e.g., the Z-direction is perpendicular to an X-Y plan of memory device 200). In the physical structure of memory device 200, control gates $250_0$-$250_M$ can be formed on different levels (e.g., layers) of memory device 200 in the Z-direction. In this example, the levels (e.g., layers) of control gates $250_0$-$250_M$ can be formed (e.g., stacked) one level (one layer of material) over another (another layer of material) in the Z-direction.

As shown in FIG. 2, memory cells 202 can be included in respective memory cell strings 230 in each of the blocks (e.g., blocks 291 and 292) of memory device 200. Each of memory cell strings 230 can have series-connected memory cells (e.g., M+1 (e.g., 128) series-connected memory cells) in the Z-direction. In a physical structure of memory device 200, memory cells 202 in each of memory cell strings 230 can be formed (e.g., stacked vertically one over another) in different levels (e.g., M+1 (e.g., 128) layers in the example of FIG. 2) in the Z-direction of memory device 200. The number of memory cells in each of memory cell strings 230 can be equal to the number of levels (e.g., layers) of control gates (e.g., control gates $250_0$-$250_M$) of memory device 200. For example, if each memory cell string 230 has 128 (e.g., M=127) memory cells 202, then there are 128 corresponding levels of control gates $250_0$-$250_M$ for the 128 memory cells.

As shown in FIG. 2, control gates $250_0$-$250_M$ can carry corresponding signals $WL_0$-$WL_M$. As mentioned above, control gates $250_0$-$250_M$ can include (or can be parts of) access lines (e.g., word lines) of memory device 200. Each of control gates $250_0$-$250_M$ can be part of a structure (e.g., a level) of a conductive material (e.g., a layer of conductive material) located in a level of memory device 200. Memory device 200 can use signals $WL_0$-$WL_M$ to selectively control access to memory cells 202 of block 291 during an operation (e.g., read, write, or erase operation). For example, during a read operation, memory device 200 can use signals $WL_0$-$WL_M$ to control access to memory cells 202 of block 291 to read (e.g., sense) information (e.g., previously stored information) from memory cells 202 of block 291. In another example, during a write operation, memory device 200 can use signals $WL_0$-$WL_M$ to control access to memory cells 202 of block 291 to store information in memory cells 202 of block 291.

Like control gates $250_0$-$250_M$ in block 291, control gates $250'_0$-$250'_M$ in block 292 can carry corresponding signals $WL'_0$-$WL'_M$. Each of control gates $250'_0$-$250'_M$ can be part of a structure (e.g., a level) of a conductive material (e.g., a layer of conductive material) located in a single level of memory device 200. Control gates $250'_0$-$250'_M$ can be located in the same levels (in the Z-direction) as control gates $250_0$-$250_M$, respectively. As mentioned above, control gates $250'_0$-$250'_M$ (e.g., local word lines) can be electrically separated from control gates $250_0$-$250_M$ (e.g., other local word lines)

Memory device 200 can use signals $WL'_0$-$WL'_M$ to control access to memory cells 202 respectively, of block 292 during an operation (e.g., read, write, or erase operation). For example, during a read operation, memory device 200 can use signals $WL'_0$-$WL'_M$ to control access to memory cells 202 of block 292 to read (e.g., sense) information (e.g., previously stored information) from memory cells 202 of block 292. In another example, during a write operation, memory device 200 can use signals $WL'_0$-$WL'_M$ to control access to memory cells 202 of block 292 to store information in memory cells 202 block 292.

As shown in FIG. 2, memory cells in different memory cell strings in the same a block can share (e.g., can be controlled by) the same control gate in that block. For example, in block 291, memory cells 202 coupled to control gate $250_0$ can share (can be controlled by) control gate $250_0$. In another example, memory cells 202 coupled to control gate $250_1$ can share (can be controlled by) control gate $250_1$. In another example, in block 292, memory cells 202 coupled to control gate $250'_0$ can share (can be controlled by) control gate $250'_0$. In another example, memory cells 202 coupled to control gate $250'_1$ can share (can be controlled by) control gate $250'_1$.

Memory device 200 can include a source (e.g., a source line, a source plate, or a source region) 298 that can carry a signal (e.g., a source line signal) SL. Source 298 can be structured as a conductive line or a conductive plate (e.g., conductive region) of memory device 200. Source 298 can be common source line (e.g., common source plate or common source region) of block 291 and 292. Source 298 can be coupled to a ground connection of memory device 200.

Memory device 200 can include select transistors (e.g., drain select transistors) $261_0$ through $261_i$ ($261_0$-$261_i$) and select gates (e.g., drain select gates) $281_0$ through $281_i$ in block 291. Transistors $261_0$ can share the same select gate $281_0$. Transistors $261_i$ can share the same select gate $281_i$. Select gates $281_0$-$281_i$ can carry signals SGD0 through SGDi, respectively.

Transistors $261_0$-$261_i$ can be controlled (e.g., turned on or turned off) by signals SGD0-SGDi, respectively. During a memory operation (e.g., a read or write operation) of memory device 200, transistors $261_0$ and transistors $261_i$ can be turned on one group (e.g., either the group of transistors $261_0$ or the group of transistors $261_i$) at a time. Transistors $261_0$ can be turned on (e.g., by activating respective signals SGD0) to couple memory cell strings 230 of block 291 to respective data lines $270_0$-$270_N$. Transistors $261_i$ can be turned on (e.g., by activating respective signals SGDi) to couple memory cell strings 230 of block 291 to respective data lines $270_0$-$270_N$. Transistors $261_0$-$261_i$ can be turned off (e.g., by deactivating respective signals SGD0-SGDi) to decouple the memory cell strings 230 of block 291 from respective data lines $270_0$-$270_N$.

Memory device 200 can include transistors (e.g., source select transistors) 260 in block 291, each of which can be coupled between source 298 and memory cells 202 in a respective memory cell string (one of memory cell strings 230) of block 291. Memory device 200 can include a select gate (e.g., source select gate) 280. Transistors 260 in block 291 can share select gate 280. Transistors 260 in block 291 can be controlled (e.g., turned on or turned off) by the same signal, such as SGS signal (e.g., source select gate signal) provided on select gate 280. During a memory operation (e.g., a read or write operation) of memory device 200, transistors 260 in block 291 can be turned on (e.g., by activating an SGS signal) to couple the memory cell strings of block 291 to source 298. Transistors 260 in block 291 can be turned off (e.g., by deactivating the SGS signal) to decouple the memory cell strings of block 291 from source 298.

Memory device 200 can include similar elements among the blocks (e.g., blocks 291 and 292). For example, in block 292, memory device 200 can include select gates (e.g., drain select gates) $281'_0$ through $281'_i$, and transistors (e.g., drain select transistors) $261_0$-$261_i$. Transistors $261_0$ of block 292 can share the same select gate $281'_0$. Transistors $261_i$ of block 292 can share the same select gate $281'_i$. Select gates $281'_0$ through $281'_i$ can carry signals SGD0' through SGDi', respectively. Transistors $261_0$-$261_i$ of block 292 can be controlled (e.g., turned on or turned off) by signals SGD0' through SGDi', respectively. During a memory operation (e.g., a read or write operation) of memory device 200, the group of transistors $261_0$ and the group of transistors $261_i$ of block 292 can be turned on (e.g., by activating respective signals SGD0' through SGDi') one group at a time to couple respective memory cell strings of block 292 to data lines $270_0$-$270_N$. Transistors $261_0$-$261_i$ of block 292 can be turned off (e.g., by deactivating respective signals SGD0' through SGDi') to decouple the memory cell strings of block 292 from respective sets of data lines $270_0$-$270_N$.

Memory device 200 can include transistors (e.g., source select transistors) 260 in block 292, each of which can be coupled between source 298 and the memory cells in a respective memory cell string of block 292. Transistors 260 of block 292 can share the same select gate (e.g., source select gate) 280' of memory device 200. Transistors 260 of block 292 can be controlled (e.g., turned on or turned off) by the same signal, such as SGS' signal (e.g., source select gate signal) provided on select gate 280'. During a memory operation (e.g., a read or write operation) of memory device 200, transistors 260 of block 292 can be turned on (e.g., by activating an SGS' signal) to couple the memory cell strings of block 292 to source 298. Transistors 260 of block 292 can be turned off (e.g., by deactivating the SGS' signal) to decouple the memory cell strings of block 292 from source 298. FIG. 2 shows select gates 280 and 280' being electrically separated from each other as an example. Alternatively, select gates 280 and 280' can be electrically coupled to each other.

Memory device 200 includes other components, which are not shown in FIG. 2 so as not to obscure the example embodiments described herein. Some of the structures of memory device 200 are described below with reference to FIG. 3A through FIG. 32B. For simplicity, detailed description of the same element among the drawings (FIG. 1 through FIG. 32B) is not repeated.

Figure 3A:
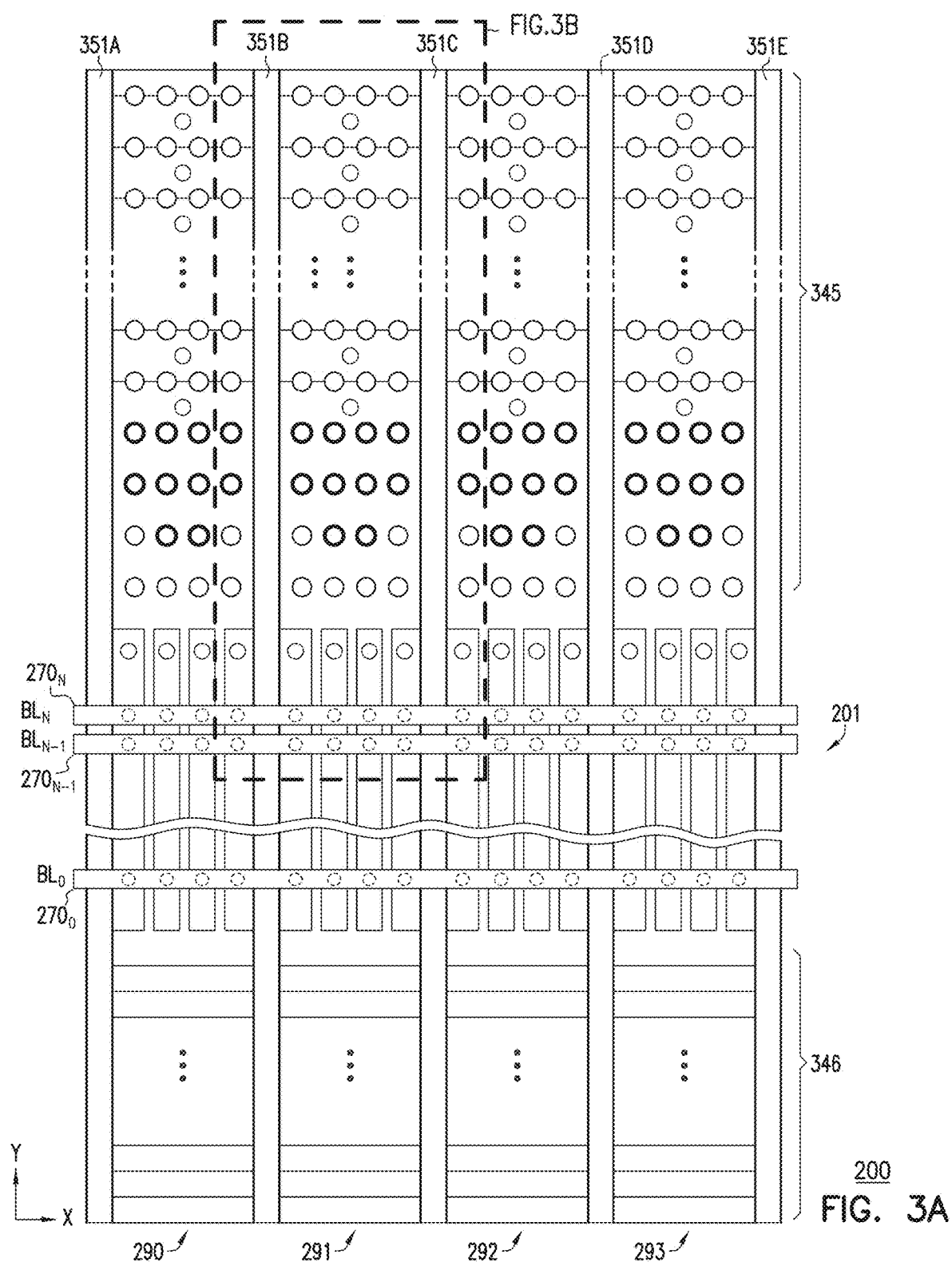
FIG. 3A shows a top view of a structure of the memory device of FIG. 2 including a memory cell array, staircase regions, and dielectric structures between memory cell blocks of the memory device, according to some embodiments described herein.

FIG. 3A shows a top view of a structure of memory device 200 including a memory cell array 201, staircase regions 345 and 346, and dielectric structures (e.g., block dividers) 351A, 351B, 351C, 351D, and 351E between respective blocks 290, 291, 292, and 293, according to some embodiments described herein. In the figures (drawings) herein, similar or the same elements of memory device 200 of FIG. 2 and other figures (e.g., FIG. 3A through FIG. 32B) are given the same labels. Detailed descriptions of similar or the same elements may not be repeated from one figure to another figure. For simplicity, cross-sectional lines (e.g., hatch lines) are omitted from some or all the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 3A, blocks (blocks of memory cells) 290, 291, 292, and 293 (290-293) of memory device 200 can be located side-by-side from one block to another in the X-direction. Four blocks 290-293 are shown as an example. Memory device 200 can include numerous blocks. Blocks 291 and 292 of FIG. 3A are schematically shown and described above with reference to FIG. 2. Other blocks (e.g., block 290 and 293) of memory device 200 in FIG. 3A are not shown in FIG. 2.

In FIG. 3A, dielectric structures 351A, 351B, 351C, 351D, and 351E can be formed to divide (e.g., organize) memory device 200 into physical blocks (e.g., blocks 290-293). Dielectric structures 351A, 351B, 351C, 351D, and 351E can have lengths extending in the Y-direction. Each of dielectric structures 351A, 351B, 351C, 351D, and 351E can include (or can be formed in) a slit (not labeled) between two adjacent blocks. The slit can have sidewalls (e.g., edges) opposing each other in the X-direction and adjacent two respective blocks. The slit can include (or can be) a trench having a depth in the Z-direction. The slit can be similar to or the same as the slit shown in other figures of memory device 200. For example, the slits where dielectric structures 351B and 351C are located can be similar to (or the same as) slits 2551B and 2551C, respectively, shown in FIG. 25A and FIG. 25B.

In FIG. 3A, dielectric structure 351B can be formed (e.g., located) in a slit between blocks 290 and 291, in which the slit can have opposing sidewalls (e.g., edges) adjacent respective blocks 290 and 291. Dielectric structure 351C can be formed in a slit between blocks 291 and 292, in which the slit can have opposing sidewalls adjacent respective blocks 291 and 292. Other dielectric structures 351A, 351D, and 315E can be located adjacent respective blocks shown in FIG. 3A.

Each of dielectric structures 351A, 351B, 351C, 351D, and 351E can include a dielectric material (or dielectric materials) formed in (e.g., filling) a respective slit. Dielectric structures 351A, 351B, 351C, 351D, and 351E can separate (e.g., physically and electrically separate) one block from another. For example, as shown in FIG. 3A, dielectric structure 351B can separate block 291 from block 290. Dielectric structure 351C can separate block 291 from block 292.

As shown in FIG. 3A, data lines $270_0$ through $270_N$ (associated with signals $BL_0$ through $BL_N$) of memory device 200 can be located over blocks 290-293 (with respect to the Z-direction). Data lines $270_0$ through $270_N$ can have respective lengths extending in the X-direction. Data lines $270_0$ through $270_N$ can extend over (e.g., on top of) and across (in the X-direction) blocks 290-293 and can be shared by blocks 290-293.

Staircase regions 345 and 346 of memory device 200 can be located on respective sides (in the Y-direction) of memory cell array 201. Staircase regions 345 and 346 are part of memory device 200 where conductive contacts (labeled in FIG. 3B, e.g., conductive contacts $365_{SGS}$, $365_0$, $365_1$, $365_M$, $365_{M-1}$, $365_{SGD0}$, and $365_{SGDi}$) can be formed to provide electrical connections (e.g., signals) to respective select gates and control gates (e.g., shown in FIG. 2 as select gates 280, $281_0$ and $281_i$ and control gates $250_0$ through $250_M$) in respective blocks 290, 291, 292, and 293 of memory device 200. Staircase regions 345 and 346 can also include other structures (e.g., support structures 344D and contact structures 344L, described below).

In FIG. 3A, staircase regions 345 and 346 can include similar structures. However, for simplicity, details of staircase region 346 are omitted from the description herein. In an alternative structure of memory device 200, staircase region 346 can be omitted from memory device 200, such that only staircase region 345 (and not both staircase regions 345 and 346) is included in memory device 200. A portion labeled "FIG. 3B" in FIG. 3A is shown in detail in FIG. 3B.

As shown in FIG. 3B, memory device 200 can include pillars 330 (shown in top view) in each of the blocks (e.g., block 290, 291, and 292 shown in FIG. 3B) of memory device 200. Pillars 330 are memory cell pillars, which are different from pillars of support structures 344D and pillars of contact structures 344L of memory device 200.

As shown in FIG. 3B, pillars (memory cell pillars) 330 can be located under (below) and coupled to respective data lines (only data lines $270_{N-1}$ and $270_N$ are shown). Memory cells 202 of a memory cell string can be located (e.g., can be formed vertically) long the length (shown in FIG. 3C) of a corresponding pillar 330. Pillars 330 (and associated memory cell strings) of blocks 290-293 can share data lines $270_0$ through $270_N$.

As shown in FIG. 3A and FIG. 3B, data lines $270_0$ through $270_N$ (associated with signals $BL_0$ through $BL_N$) of memory device 200 can be located over (above) pillars 330 (and over associated memory cell strings) in memory cell array 201. Data lines $270_0$ through $270_N$ can be coupled to respective pillars 330 (which are located under data lines $270_0$ through $270_N$ in the Z-direction).

As mentioned above, memory device 200 can include support structures 344D and contact structures 344L. As shown in FIG. 3B, support structures 344D and contact structures 344L can be adjacent respective conductive contacts $365_{SGS}$, $365_0$, $365_1$, $365_M$, $365_{M-1}$, $365_{SGD0}$, and $365_{SGDi}$. For simplicity, FIG. 3B does not give labels for all support structures 344D and contact structures 344L of the blocks (e.g., blocks 290, 291, and 292) in FIG. 3B. As shown in FIG. 3B (e.g., viewing from a direction perpendicular to the X-Y plan), conductive contacts $365_{SGS}$, $365_0$, $365_1$, $365_M$, $365_{M-1}$, $365_{SGD0}$, and $365_{SGDi}$ can have a circular shape (e.g., the boundary of a conductive contact has circular boundary when viewed from a direction perpendicular to the X-Y plan). Support structures 344D and contact structures 344L can also have a circular shape (e.g., the boundary of a support structure and conductive structure has circular boundary when viewed from a direction perpendicular to the X-Y plan).

As mentioned above, conductive contacts $365_{SGS}$, $365_0$, $365_1$, $365_M$, $365_{M-1}$, $365_{SGD0}$, and $365_{SGDi}$ in FIG. 3B can be formed to provide electrical connections (e.g., signals) to respective select gates and control gates (e.g., select gates 280, $281_0$ and $281_i$ and control gates $250_0$ through $250_M$ of FIG. 2) of memory device 200.

Although support structures 344D and contact structures 344L can include a similar structure (e.g., similar vertical pillars, described in detail below), support structure 344D and contact structures 344L have different functions in memory device 200. Support structures 344D can be formed to provide structural support to a portion (e.g., staircase region 345) of memory device 200 during processes of forming memory device 200. Contact structures 344L in FIG. 3B can be formed to provide electrical connections (e.g., to form part of respective conductive paths) between circuitry (e.g., circuitry 395 in FIG. 3C) of memory device 200 and other elements of memory device 200. Support structures 344D can be called dummy structures in comparison with contact structures (e.g., active structures) 344L because support structures 344D do not provide electrical functions whereas contact structures 344L provide electrical function (e.g., form current paths between elements of memory device 200).

As shown in FIG. 3B, memory device 200 can include conductive materials $340_{SGS}$, $340_0$, $340_1$, $340_{M-1}$, $340_M$, $340_{SGD0}$, $340_{SGD1}$ and $340_{SGD2}$ and $340_{SGDi}$ in block 291 that can form (e.g., can be materials included in) respective select gate (e.g., source select gate) 280, control gates $250_0$ through $250_M$, and select gates (e.g., drain select gates) $280_0$ and $280_i$ (FIG. 2). In FIG. 3B, conductive materials $340_{SGD0}$ and $340_{SGDi}$ can form two of the four drain select gates of block 291. Conductive materials $340_{SGD1}$ and $340_{SGD2}$ (adjacent conductive materials $340_{SGD0}$ and $340_{SGDi}$) can form the other two of the four drain select gates of block 291. The drain select gates formed by conductive materials $340_{SGD1}$ and $340_{SGD2}$ in FIG. 3B are not shown in FIG. 2.

As shown in FIG. 3B, conductive materials $340_{SGD0}$, $340_{SGD1}$, $340_{SGD2}$, and $340_{SGDi}$ (FIG. 3B) can be electrically separated from each other by a gap 347 (which can be filled with a dielectric material (or materials)). For simplicity, FIG. 3B does not give labels for other conductive materials that form respective select gates and control gates of blocks 290 and 292.

Line A-A in FIG. 3B indicates a location (e.g., a side view (e.g., a cross-section)) of memory device 200 including some of support structures 344D during some processes of forming memory device 200 as shown and described below with reference to FIG. 4A through FIG. 32A.

Line B-B in FIG. 3B indicates a location (e.g., a side view (e.g., a cross-section)) of memory device 200 including some of contact structures 344L during some processes of forming memory device 200 as shown and described below with reference to FIG. 4A through FIG. 32A.

Figure 3C:
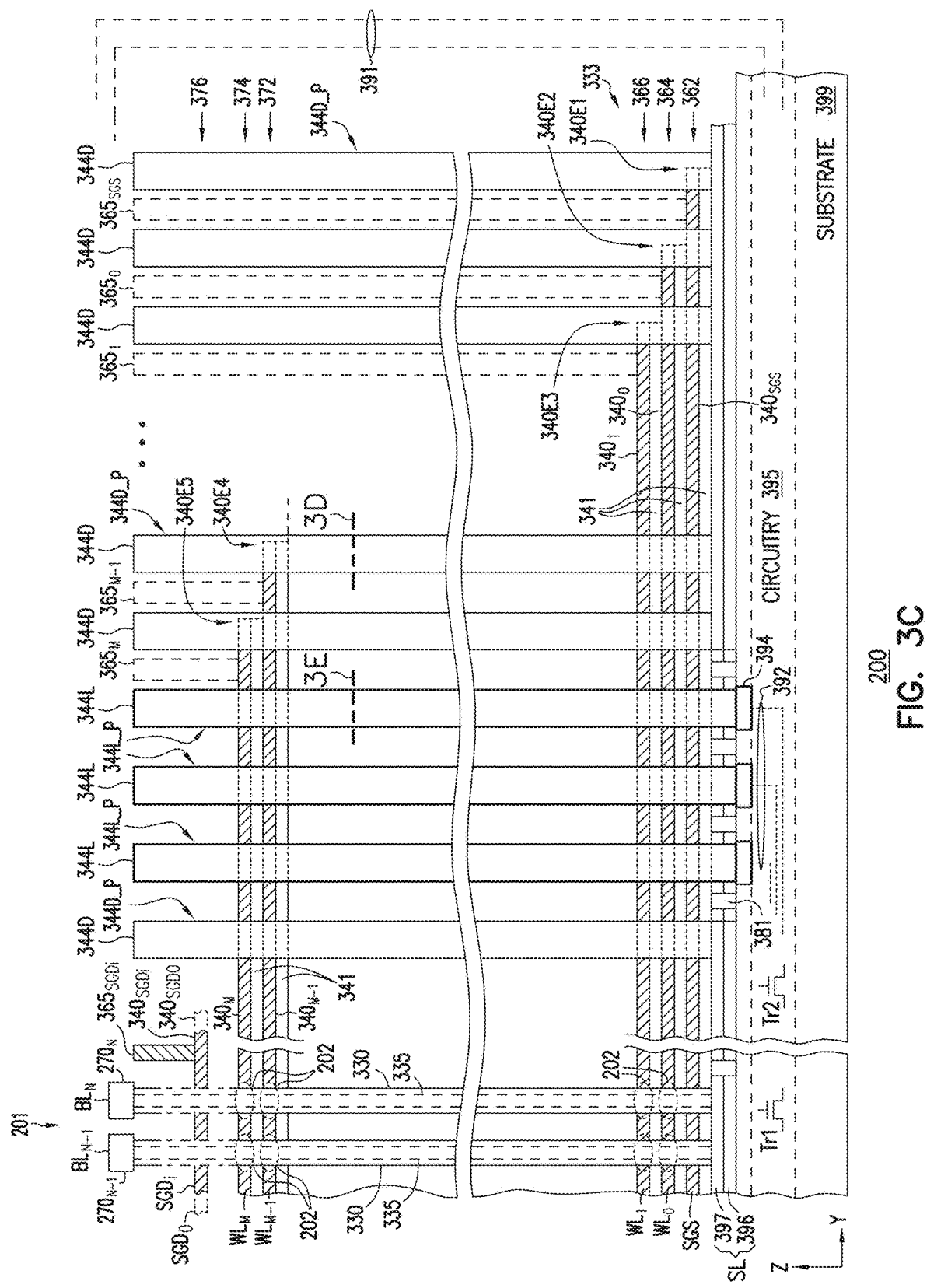
FIG. 3C shows a portion (e.g., a side view) of the memory device of FIG. 3B, according to some embodiments described herein.

Line 3C-3C in FIG. 3B shows a location of a portion (e.g., a side view (e.g., a cross-section)) of memory device 200 shown in FIG. 3C. In FIG. 3B, a portion (e.g., portion 3F) of dielectric structure 351C is shown in FIG. 3F.

As shown in FIG. 3C, memory device 200 can include levels 362, 364, 366, 372, 374, and 376 that are physical layers (e.g., portions) in the Z-direction of memory device 200. Conductive materials $340_{SGS}$, $340_0$, $340_1$, $340_{M-1}$, $340_M$, and $340_{SGDi}$ can be located (e.g., stacked) one level (e.g., one layer) over another in respective levels 362, 364, 366, 372, 374, and 376 in the Z-direction. Conductive materials $340_{SGS}$, $340_0$, $340_1$, $340_{M-1}$, $340_M$, and $340_{SGDi}$ can also be called levels of conductive materials $340_{SGS}$, $340_0$, $340_1$, $340_{M-1}$, $340_M$, and $340_{SGDi}$. As shown in FIG. 3C, conductive materials $340_{SGD0}$, $340_1$, 3402, and $340_{SGDi}$ ($340_{SGD1}$ and $340_{SGD2}$ are not shown) can be located on the same level (e.g., level 376).

As shown in FIG. 3C, conductive materials $340_{SGS}$, $340_0$, $340_1$, $340_{M-1}$, $340_M$, and $340_{SGDi}$ can interleave with dielectric materials 341 in the Z-direction. Conductive materials $340_{SGS}$, $340_0$, $340_1$, $340_{M-1}$, $340_M$, and $340_{SGDi}$ can include metal (e.g., tungsten, or other metal), other conductive materials, or a combination of conductive materials. Dielectric materials 341 can include silicon dioxide.

Signals SGS, $WL_0$, $WL_1$, $WL_{M-1}$, $WL_M$, $SGD_0$, and $SGD_i$ in FIG. 3C associated with respective conductive materials in FIG. 3C are the same signals shown in FIG. 2. Conductive material $340_{SGS}$ can form select gate 280 (associated with signal SGS) of FIG. 2. Conductive materials $340_0$, $340_1$, $340_{M-1}$, and $340_M$ can form control gates $250_0$ through $250_M$ (associated with signals $WL_0$, $WL_1$, $WL_{M-1}$, and $WL_M$, respectively) of FIG. 2. Conductive material $340_{SDG0}$ and $340_{SGDi}$ (associated with signals $SGD_0$, and $SGD_i$) can form select gates $281_0$ and $281_i$, respectively, of FIG. 2.

FIG. 3C shows an example of memory device 200 including one level of conductive materials $340_{SGS}$ that forms a select gate (e.g., source select gate associated with signal SGS). However, memory device 200 can include multiple levels (similar to level 362) of conductive materials (e.g., multiple levels of conductive material $340_{SGS}$) located under (in the Z-direction) the level of conductive materials $340_1$ (e.g., below level 364) to form multiple source select gates of memory device 200.

FIG. 3C shows an example of memory device 200 including one level (e.g., level 376) of multiple drain select gates (on the same level, formed by respective materials $340_{SGD0}$ through $SGD_i$). However, memory device 200 can include multiple levels (similar to level 376) in which each of such multiple levels can include multiple drain select gates (e.g., four drain select gates in each of the multiple levels).

As shown in FIG. 3C, memory device 200 can include staircase structure 333 located in staircase region 345 (FIG. 3B shows a top view of staircase region 345). For simplicity, only a portion of staircase structure 333 is shown in FIG. 3C (e.g., a middle portion of staircase structure 333 is omitted from FIG. 3C). As shown in FIG. 3C, respective portions (e.g., end portions) of conductive materials $340_{SGS}$, $340_0$, $340_1$, $340_{M-1}$, $340_M$, and $340_{SDG1}$ and their respective edges (e.g., steps (or risers)) 340E1, 340E2, and 340E3, 340E4, and 340E5 can collectively form staircase structure 333. As shown in FIG. 3C, dielectric materials 341 can also include edges (not labeled) adjacent (e.g., aligned in the Z-direction with) respective edges 340E1 through 340E5. Thus, staircase structure 333 can also be formed in part by portions and edges of dielectric materials 341.

FIG. 3C also shows tiers of memory device 200. A tier of memory device 200 can include a level of conductive material (e.g., conductive material $340_1$) and an adjacent level of dielectric material 341 (e.g., dielectric material 341 between conductive materials $340_0$ and $340_1$). As shown in FIG. 3C, the tiers can be located (e.g., stacked) one over another in the Z-direction over substrate 399. Each tier can have respective memory cells 202 and control gates (e.g., word lines formed by conductive materials $340_0$, $340_1$, $340_{M-1}$, and $340_M$). FIG. 3C shows a few tiers of memory device 200 for simplicity. However, memory device 200 can include up to (or more than) one hundred tiers.

Other blocks (e.g., blocks 290, 292, and 293 in FIG. 3B) of memory device 200 can also have their own tiers of memory cells 202 and respective control gates (e.g., respective word lines) for the memory cells, and staircase structures similar to staircase structure 333 in block 291 in FIG. 3C. For simplicity, details of staircase structures of the other blocks (e.g., blocks 290, 292, and 293) of memory device 200 are omitted from the description herein.

As shown in FIG. 3C, memory device 200 can include a substrate 399 and materials 396 and 397 located over (e.g., formed over) substrate 399. Substrate 399 can include semiconductor (e.g., silicon) substrate. Substrate 399 can also include circuitry 395 located under other components of memory device 200 that are formed over substrate 399. Circuitry 395 can include circuit elements (e.g., transistors Tr1 and Tr2 shown in FIG. 3C) coupled to circuit elements outside substrate 399. For example, the circuit elements outside substrate 399 can include data lines $270_0$ through $270_N$ (shown in FIG. 3A) conductive contacts $365_{SGS}$, $365_0$, $365_1$, $365_M$, $365_{M-1}$, $365_{SGD0}$, and $365_{SGDi}$ (FIG. 3B), part of conductive paths 391 and other (not shown) conductive connections, and other circuit elements of memory device 200. The circuit elements (e.g., transistors Tr1 and Tr2) of circuitry 395 can be configured to perform part of a function of memory device 200. For example, transistors Tr1 and Tr2 can be part of decoder circuits, driver circuits, buffers, sense amplifiers, charge pumps, and other circuitry of memory device 200.

As shown in FIG. 3C, conductive paths (e.g., conductive routings) 391 can include portions extending in the Z-direction (e.g., extending vertically). Conductive paths 391 can include (e.g., can be coupled to) some of the conductive contacts (e.g., conductive contacts $365_{SGS}$, $365_1$, $365_M$, $365_{M-1}$, $365_{SGD0}$, and $365_{SGDi}$ in FIG. 3B) or all of the conductive contacts of memory device 200. As shown in FIG. 3C, conductive paths 391 can be coupled to circuitry 395. For example, at least one of conductive paths 391 can be coupled to at least of one of transistors Tr1 and Tr2 of circuitry 395.

Conductive paths 391 can provide electrical connections between elements of memory device 200. For example, conductive paths 391 can be coupled to conductive contacts $365_{SGS}$, $365_1$, $365_M$, and $365_{M-1}$ (and $365_{SGD0}$, and $365_{SGDi}$, not shown in FIG. 3C) and circuit elements (e.g., word line drivers and word line decoders, not shown) of circuitry 395 to provide electrical connections (e.g., in the form of signals SGS, $WL_0$, $WL_1$, $WL_{M-1}$, $WL_M$, $SGD_0$, and $SGD_i$) from circuit elements (e.g., word line drivers, word line decoders, and charge pumps, not shown) in circuitry 395 to conductive contacts $365_{SGS}$, $365_0$, $365_1$, $365_M$, $365_{M-1}$, $365_{SGDi}$, and $365_{SGD0}$, respectively.

As shown in FIG. 3C, conductive contacts $365_{SGS}$, $365_0$, $365_1$, $365_M$, and $365_{M-1}$ can include pillars (conductive pillars) that can have different lengths extending in the Z-direction (e.g., extending vertically (e.g., outward) from substrate 399. Each of conductive contacts $365_{SGS}$, $365_0$, $365_1$, $365_M$, and $365_{M-1}$ (including a respective pillar) can contact (e.g., land on) a respective level of a particular conductive material among conductive materials $340_{SGS}$, $340_0$, $340_1$, $340_{M-1}$, and $340_M$ to form an electrical contact with that particular conductive material. Thus, conductive contacts $365_{SGS}$, $365_0$, $365_1$, $365_M$, and $365_{M-1}$ (and $365_{SGD0}$ and $365_{SGDi}$ shown in FIG. 3B) can be part of conductive paths (e.g., part of conductive paths 391) to carry electrical signals to the select gate (e.g., source select gate associated with signal SGS), the control gates (e.g., control gates associated with signals $WL_M$ and $WL_{M-1}$) and other select gates (e.g., drain select gates associated with signals $SGD_0$ through $SGD_i$), respectively.

As shown in FIG. 3C, conductive contact $365_{SGS}$ is electrically in contact with conductive materials $340_{SGS}$ and electrically separated from the rest of conductive materials (e.g., conductive materials $340_0$, $340_1$, $340_{M-1}$, $340_M$, and $340_{SGDi}$). Conductive contact $365_0$ is electrically in contact with conductive materials $340_0$ and electrically separated from the rest of conductive materials (e.g., conductive materials $340_{SGS}$, $340_1$, $340_{M-1}$, $340_M$, and $340_{SGDi}$). Thus, a conductive contact (e.g., conductive contact $365_0$) can be electrically in contact with only one of the conductive materials among the conductive materials (e.g., conductive materials $340_{SGS}$, $340_0$, $340_1$, $340_{M-1}$, $340_M$, $340_{SGD0}$, and $340_{SGDi}$ in FIG. 3C) of memory device 200.

Materials 396 and 397 (FIG. 3C) can be part of a source (e.g., a source line, a source plate, or a source region) 298 (FIG. 2) of memory device 200. Materials 396 and 397 are different conductive materials. An example of material 396 includes tungsten silicide. An example of material 397 include polysilicon. Materials 396 and 397 can include other conductive materials. Material 397 can include multiple levels (e.g., layers) of materials in the Z-direction. For example, material 397 can include levels (e.g., layers) of polysilicon interleaved with levels (e.g., layers) of oxide (e.g., silicon dioxide). Materials 396 and 397 can be used to form electrical connections (e.g., lateral connections in the X-direction or the Y-direction) between elements (e.g., contact structures 344L and other elements) of memory device 200 in circuitry 395.

As shown in FIG. 3C, pillar 330 can include a structure 335 extending along the length (in the Z-direction) of pillar 330 and coupled to a respective data line (e.g., data line $270_{N-1}$ or $270_N$) and the source (which includes materials 396 and 397) of memory device 200. Structure 335 can include a conductive channel portion that can be part of a conductive path between a respective data line (e.g., data line $270_N$) and the source (e.g., includes materials 396 and 397) to carry current (e.g., current between data line $270_N$ and materials 396 and 397) during an operation (e.g., read, write, or erase) of memory device 200.

Structure 335 of pillar 330 can include multiple layers of different materials that can be part of a TANOS (TaN, $Al_2O_3$, $Si_3N_4$, $SiO_2$, Si) structure of pillar 322 or a structure similar to a TANOS structure. For example, structure 335 can include a dielectric portion 331 (e.g., interpoly dielectric portion). The dielectric portion can include a charge blocking material or materials (e.g., a dielectric material including TaN and $Al_2O_3$) that are capable of blocking a tunneling of a charge. Structure (e.g., TANOS structure) 335 can include a charge storage portion. The charge storage portion can include a charge storage element (e.g., charge storage material or materials, e.g., $Si_3N_4$) that can provide a charge storage function (e.g., trap charge) to represent a value of information stored in a respective memory cell 202. Structure (e.g., TANOS structure) 335 can include another dielectric portion (where the charge storage portion can be between the dielectric portions) that can include a tunnel dielectric material or materials (e.g., $SiO_2$). The tunnel dielectric material (or materials) is capable of allowing tunneling of a charge (e.g., electrons). In an alternative structure of memory device 200, structure 335 of pillar 330 can include or can be part be part of a SONOS (Si, $SiO_2$, $Si_3N_4$, $SiO_2$, Si) structure. In another alternative structure of memory device 200, structure 335 of pillar 330 can include or can be part of a floating gate structure. For example, structure 335 can include a charge storage portion that can include polysilicon (or other material) that can be part of a floating gate of a respective memory cell 202.

As described above, support structures 344D can be formed to provide structural support to a portion (e.g., staircase region 345) of memory device 200. As shown in FIG. 3C, support structures 344D can include respective pillars 344D_P that have lengths extending in the Z-direction (e.g., extending vertically (e.g., outward) from substrate 399). Support structures 344D can have the same length. Support structures 344D (including pillars 344D_P) can go through a respective portion of (e.g., go through respective holes in tiers of) conductive materials $340_{SGS}$, $340_0$, $340_1$, $340_{M-1}$, and $340_M$ and dielectric materials 341. Thus, pillars 344D_P of support structures 344D can be formed in holes in the tiers of memory device 200. Support structures 344D are electrically separated from conductive materials $340_{SGS}$, $340_0$, $340_1$, $340_{M-1}$, and $340_M$. Support structures 344D are also electrically separated from other elements of memory device 200. For example, support structures 344D are electrically uncoupled to (e.g., are not in electrical contact with) to materials 396 and 397. In another example, support structures 344D are electrically uncoupled to elements (e.g., transistors Tr1 and Tr2) of circuitry 395.

Contact structures 344L can include respective pillars 344L_P that have lengths extending in the Z-direction (e.g., extending vertically (e.g., outward) from substrate 399). Contact structures 344L (including pillars 344L_P) can have the same length. Contact structures 344L can go through a respective portion of (e.g., go through respective holes in tiers of) conductive materials $340_{SGS}$, $340_0$, $340_1$, $340_{M-1}$, and $340_M$ and dielectric materials 341. Thus, pillars 344L_P of contact structures 344L can be formed in holes in the tiers of memory device 200. Contact structures 344L are electrically separated from conductive materials $340_{SGS}$, $340_0$, $340_1$, $340_{M-1}$, and $340_M$. Each of contact structures 344L can contact (e.g., be electrically coupled to) part of material 396.

Contact structures 344L can also be coupled to (e.g., electrically coupled to) respective portions of materials 396 and 397. Contact structures 344L can also be coupled to respective conductive portions 394. Conductive portion 394 can include a conductive material (e.g., tungsten or other metals). Conductive portion 394 can be coupled to (or can be part of) conductive paths 392. Conductive paths 392 can be electrically coupled to other elements of memory device 200. For example, conductive paths 392 can be electrically coupled to elements (e.g., transistors Tr1 and Tr2) of circuitry 395. Thus, unlike support structures 344D, contact structures 344L can be electrically coupled to respective elements (e.g., elements of circuitry 395 and other elements) of memory device 200 (e.g., through conductive portions 394) to provide electrical connections between such elements. FIG. 3C also shows dielectric materials (e.g., silicon dioxide spacers) 381 formed in different locations in materials 396 and 397. Dielectric materials 381 can be formed to selectively separate (e.g., laterally separate) materials 396 and 397 into different portions.

Figure 3D:
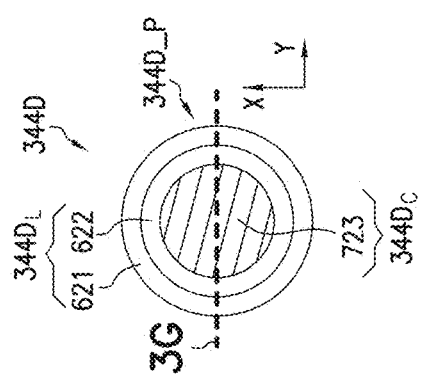
FIG. 3D, FIG. 3E, and FIG. 3F show details (e.g., top views) of a support structure, a contact structure, and a dielectric structure, respectively, of the portions of the memory device of FIG. 3B and FIG. 3C, according to some embodiments described herein.
Figure 3E:
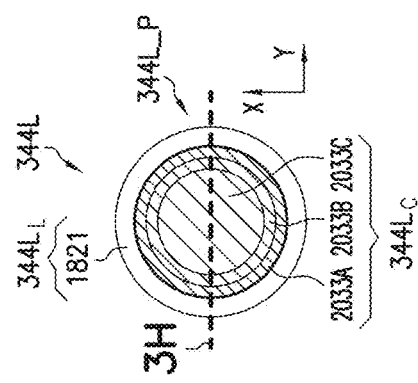
Figure 3F:
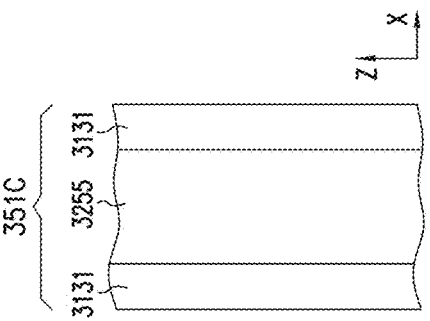

In FIG. 3C, details along line 3D of one of support structures 344D including pillar 344D_P is shown in FIG. 3D. Details along line 3E of one of contact structures 344L including pillar 344L_P is shown in FIG. 3E.

FIG. 3D shows detail of a portion (e.g., a cross-section) of a support structure 344D (taken at line 3E in FIG. 3C) including pillar 344D_P. As shown in FIG. 3D, pillar 344D_P can include a dielectric liner portion $344D_L$ and a core portion $344D_C$. Core portion $344D_C$ is adjacent dielectric liner portion $344D_L$ (e.g., interface with an inner surface of dielectric liner portion $344D_L$); such core portion $344D_C$ can be surrounded by dielectric liner portion $344D_L$ with respect to the top view (e.g., X-Y plan view, as shown in FIG. 3D).

Dielectric liner portion $344D_L$ of support structure 344D can include a material (e.g., a layer of material) 621 and material (e.g., a layer of material) 622 adjacent (e.g., contacting) material 621. Each of materials 621 and 622 can include a dielectric material. Materials 621 and 622 can include different dielectric materials. For example, material 621 can include an oxide material (e.g., silicon dioxide). Material 622 can include a nitride material (e.g., silicon nitride).

Core portion $344D_C$ of support structure 344D can include a material (or materials) 723. As shown in FIG. 3D, core portion $344D_C$ can contact (e.g., be directly coupled to) dielectric liner portion $344D_L$, such that the material (e.g., material 723) of core portion $344D_C$ can contact (e.g., be directly coupled to) the material (e.g., material 622) of dielectric liner portion $344D_L$.

Material 723 can be a non-conductive material (not electrically conductive material). For example, material 723 can include a non-metal material (e.g., a dielectric material or other non-conductive materials). Alternatively, material 723 can be a conductive material (e.g., metal (e.g., tungsten)). Material 723 can include a material that is different from material 621, material 622, or both. In an example structure of memory device 200, material 723 includes polysilicon. Other materials can be used. For example, material 723 can include a titanium-based material, a tungsten-based material, or a combination of both titanium-based material and tungsten-based materials. However, using a non-titanium-based material, a non-tungsten-based material (e.g., using polysilicon or another material different from tungsten) may improve the structure (e.g., strength) and functions of support structure 344D. For example, material (e.g., polysilicon) different from a titanium-based material, a tungsten-based material, or both can provide an improved stress mitigation in memory device 200 in comparison with that of titanium-based material or a tungsten-based material. Further, block bending or a non-tungsten-based material (e.g., polysilicon) is used in core portion 344D$_C$. The structures of support structures 344D can also reduce or mitigate undesirable cracking and lifting issues (e.g., at edges of the memory blocks) of memory device 200.

In an alternative structure of memory device 200, material 622 of dielectric liner portion 344D$_L$ can be omitted (not formed), such that core portion 344D$_C$ can be adjacent material 621 (e.g., interface with an inner surface of material 621 (in the absence of material 622)) of dielectric liner portion 344D$_L$. However, including material 622 (in addition to material 621) in dielectric liner portion 344D$_L$ can provide additional improvements and benefits to memory device 200. For example, undesirable interaction between a material (e.g., material 621) of dielectric liner portion 344D$_L$ and core portion 344D$_C$ can be reduced or mitigated.

FIG. 3E shows detail of a portion (e.g., a cross-section) of a contact structure 344L (taken at line 3E in FIG. 3C) including pillar 344L_P. As shown in FIG. 3E, pillar 344L_P can include a dielectric liner portion 344L$_L$ and a core portion 344L$_C$. Core portion 344L$_C$ is adjacent dielectric liner portion 344L$_L$ (e.g., interface with an inner surface of dielectric liner portion 344L$_L$); such core portion 344L$_C$ can be surrounded by dielectric liner portion 344L$_L$ with respect to the top view (e.g., X-Y plan view, as shown in FIG. 3E). As shown in FIG. 3E, dielectric liner portion 344L$_L$ can contact (e.g., be directly coupled to) core portion 344L$_C$.

Dielectric liner portion 344L$_L$ of contact structure 344L can include a material (e.g., a layer of material) 1821. Material 1821 can include a dielectric material. For example, material 1821 can include an oxide material (e.g., silicon dioxide). However, material 1821 can include other dielectric materials (e.g., instead of silicon dioxide). In the example of FIG. 3D and FIG. 3E, between dielectric liner portion (e.g., silicon dioxide and silicon nitride) 344D$_L$ and dielectric liner portion (e.g., silicon dioxide) 344L$_L$, only dielectric liner portion 344D$_L$ includes silicon nitride. Thus, in this example, dielectric liner portion 344L$_L$ can exclude silicon nitride (does not include silicon nitride). However, dielectric liner portion 344L$_L$ can include silicon nitride in some other examples.

Core portion 344L$_C$ of contact structure 344L can include a material (e.g., a layer of material) 2033A, a material (e.g., a layer of material) 2033B, and a material (e.g., a layer of material) 2033C adjacent each other as shown in FIG. 3E. Materials 2033A, 2033B, and 2033C can be collectively called a material (or materials) 2033. As shown in FIG. 3D, core portion 344L$_C$ can contact (e.g., directly coupled to) dielectric liner portion 344L$_L$, such that the material (e.g., material 2033A) of core portion 344L$_C$ can contact (e.g., be directly coupled to) the material (e.g., material 1821) of dielectric liner portion 344L$_L$.

One or more of materials 2033A, 2033B, and 2033C can be omitted as long as core portion 344L$_C$ can remain a conductive structure. Thus, core portion 344L$_C$ can include fewer than all of materials 2033A, 2033B, and 2033C as long as core portion 344L$_C$ can remain a conductive structure.

As shown in FIG. 3E (e.g., cross-section of contact structure 344) material 2033 can be surrounded by material 1821 of dielectric liner portion 344L$_L$. Core portion 344L$_C$ can include a conductive material (or materials), such that material 2033 (e.g., at least one of materials 2033A, 2033B, and 2033C) can include a conductive material. For example, at least one of materials 2033A, 2033B, and 2033C can include a metal material or an alloy. The material (e.g., conductive material) of core portion 344L$_C$ can be different form the material (e.g., non-conductive material) of core portion 344D$_C$ of support structures 344D. For example, materials 2033A, 2033B, and 2033C can include titanium, titanium nitride, and tungsten, respectively. In the example of FIG. 3D and FIG. 3E, between core portion (e.g., polysilicon) 344D$_C$ and core portion (e.g., layers of titanium, titanium nitride, and tungsten) 344L$_C$, only core portion 344L$_C$ includes a metal material (e.g., tungsten). Thus, in this example, core portion 344D$_C$ can exclude metal (does not include metal).

FIG. 3F shows side view (e.g., a cross-section) of portion 3F of memory device 200 of FIG. 3C. As shown in FIG. 3F, dielectric structure 351C can include materials 3131 and 3255. Material 3131 can be formed on both sides (e.g., formed on opposite sidewalls in the X-direction, not labeled) of dielectric structure 351C. Material 3255 can be formed between portions (e.g., sidewall portions) of material 3131. Dielectric structure 351C can be formed by filling (e.g., depositing) material (e.g., a liner) 3131 and material 3255 in a slit included in dielectric structure 351C. Material 3131 can include a dielectric material (e.g., silicon dioxide). Material 3255 can include polysilicon, or alternatively, a dielectric material (e.g., silicon dioxide or silicon nitride).

Figure 3G:
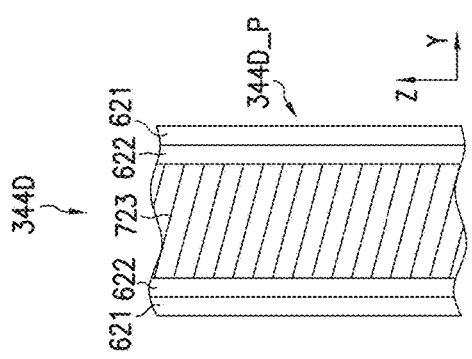
FIG. 3G, FIG. 3H, and FIG. 3I show details (e.g., side views) of the support structure, the contact structure, and the dielectric structure, respectively, of the portions of the memory device of FIG. 3D, FIG. 3E, and FIG. 3F, according to some embodiments described herein.
Figure 3H:
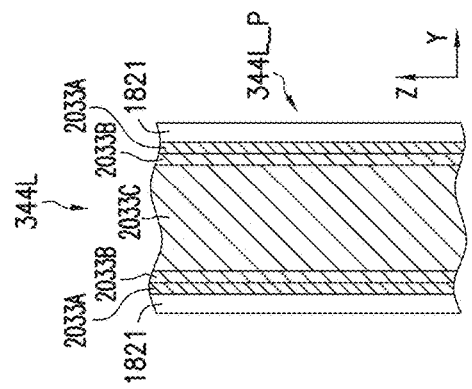
Figure 3I:
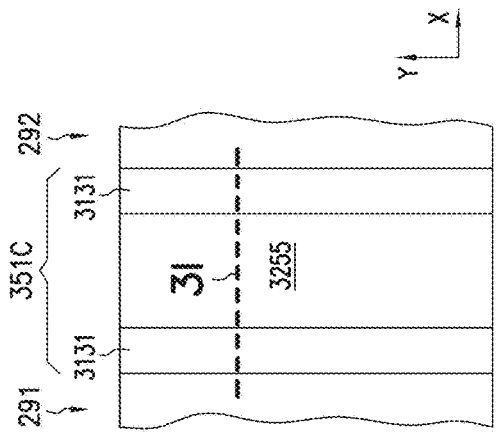

Lines G and H in FIG. 3D and FIG. 3E, respectively, are locations of respective portions (e.g., side view) in the Y-Z directions of support structure 344D and contact structure 344L shown in FIG. 3G and FIG. 3H. Line 3I in FIG. 3F is a location of a portion (e.g., side view) in the X-Z directions of dielectric structure 351C shown in detail in FIG. 3I. For simplicity, descriptions of support structure 344D, contact structure 344L, and dielectric structure 351C are not repeated in FIG. 3G, FIG. 3H, and FIG. 3I.

FIG. 4A through FIG. 32B show different views of structures during processes of forming memory device 200 of FIG. 2 through FIG. 3F, according to some embodiments described herein. In FIG. 4A through FIG. 32B, a figure number associated with label "A" (e.g., FIG. 4A, FIG. 5A, FIG. 6A, and so on) shows a side view (e.g., a cross-section in the X-Z directions) at the location indicated by line A-A in FIG. 4C (also in FIG. 3B) during processes of forming memory device 200. A figure number associated with label "B" (e.g., FIG. 4B, FIG. 5B, FIG. 6B, and so on) is a side view (e.g., a cross-section in the X-Z directions) at the location indicated by line B-B in FIG. 4C (also in FIG. 3B) during processes of forming memory device 200. In FIG. 4A through FIG. 32B, a subsequent figure number associated with label "A" (e.g., FIG. 5A) shows the same view as a preceding figure number associated with label "A" (e.g., FIG. 4A). Similarly, a subsequent figure number associated with label "B" (e.g., FIG. 5B) shows the same view as a preceding figure number associated with label "B" (e.g., FIG. 5B).

Figure 4B:
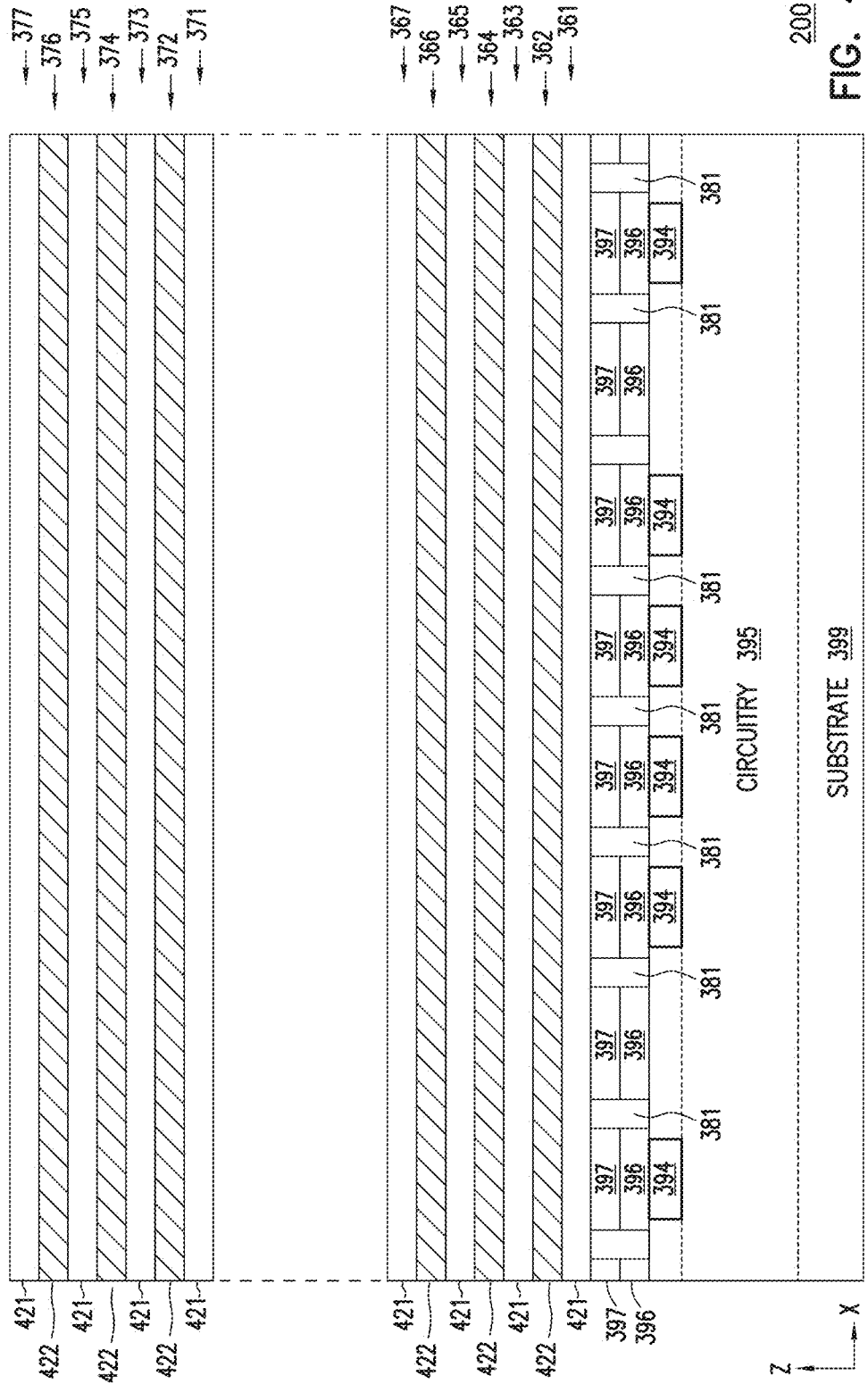

FIG. 4A and FIG. 4B show side views (e.g., cross-sections) of memory device 200 taken along lines 4A-4A and 4B-4B, respectively, of FIG. 4C. FIG. 4C shows a top view of memory device 200. The locations of lines 4A-4A and 4B-4B in FIG. 4C correspond to the locations of lines 3A-3A and 3B-3B, respectively, of FIG. 3B.

In FIG. 4A and FIG. 4B, dielectric materials 421 and dielectric materials 422 (FIG. 4A and FIG. 4B) can be sequentially formed one material after another over substrate 399 in an interleaved fashion. Dielectric materials 421 can include silicon dioxide. Dielectric materials 422 can include silicon nitride. As shown in FIG. 4A, dielectric materials 421 and 422 can be formed, such that dielectric materials 421 can interleave with dielectric materials 422 on respective levels of memory device 200 in the Z-direction. For simplicity, only levels 362, 364, 366, 372, 374, and 376 are labeled in FIG. 4A and FIG. 4B. These levels correspond to the same levels 362, 364, 366, 372, 374, and 376 shown in FIG. 3C. Other levels (interleaved with levels 362, 364, 366, 372, 374, and 376 are not labeled in FIG. 4A and FIG. 3B. For simplicity, FIG. 4A omits (does not show) some of dielectric materials 421 and 422 between levels 366 and 372.

As shown in FIG. 4A, memory device 200 can include levels 361, 363, 365, 371, 373, 375, and 377 interleaved with levels 362, 364, 366, 372, 374, and 376. Dielectric materials 421 are formed on respective levels 361, 363, 365, 371, 373, 375, and 377.

Dielectric materials 421 can correspond to dielectric materials 341 of FIG. 3C. After memory device 200 is formed, dielectric materials 341 (FIG. 3C) are part of dielectric materials 421 of FIG. 4A. Thus, the processes associated with FIG. 4A can include forming levels of materials (e.g., levels 361, 363, 365, 371, 373, 375, and 377 of dielectric materials 421) interleaved with levels of additional materials (e.g., levels 362, 364, 366, 372, 374, and 376 of dielectric materials 422). The levels 361, 363, 365, 371, 373, 375, and 377 of dielectric materials 421 are formed for electrically separating (in the Z-direction) respective control gates (e.g., control gates associated signals $WL_0$-$WL_M$ in FIG. 3C) of memory device 200 from each other. The levels 361, 363, 365, 371, 373, 375, and 377 of dielectric materials 421 are also formed for electrically separating (in the Z-direction) the control gates from other elements (e.g., drain select gate and source select gate) of memory device 200.

FIG. 4B also shows memory device 200 after dielectric materials 381 and conductive portions 394 are formed. Conductive portions 394 can be formed over (or formed in) substrate 399 before dielectric materials 421 and 422 are formed, such that dielectric materials 421 and 422 are formed over (e.g., formed on) conductive portions 394. Conductive portions 394 are electrically coupled to elements of circuitry 395 (as described above with reference to FIG. 3C). As described below, conductive structures 334L can be subsequently formed over respective conductive portions 394 and coupled to circuitry 395 through conductive portions 394.

Figure 5B:
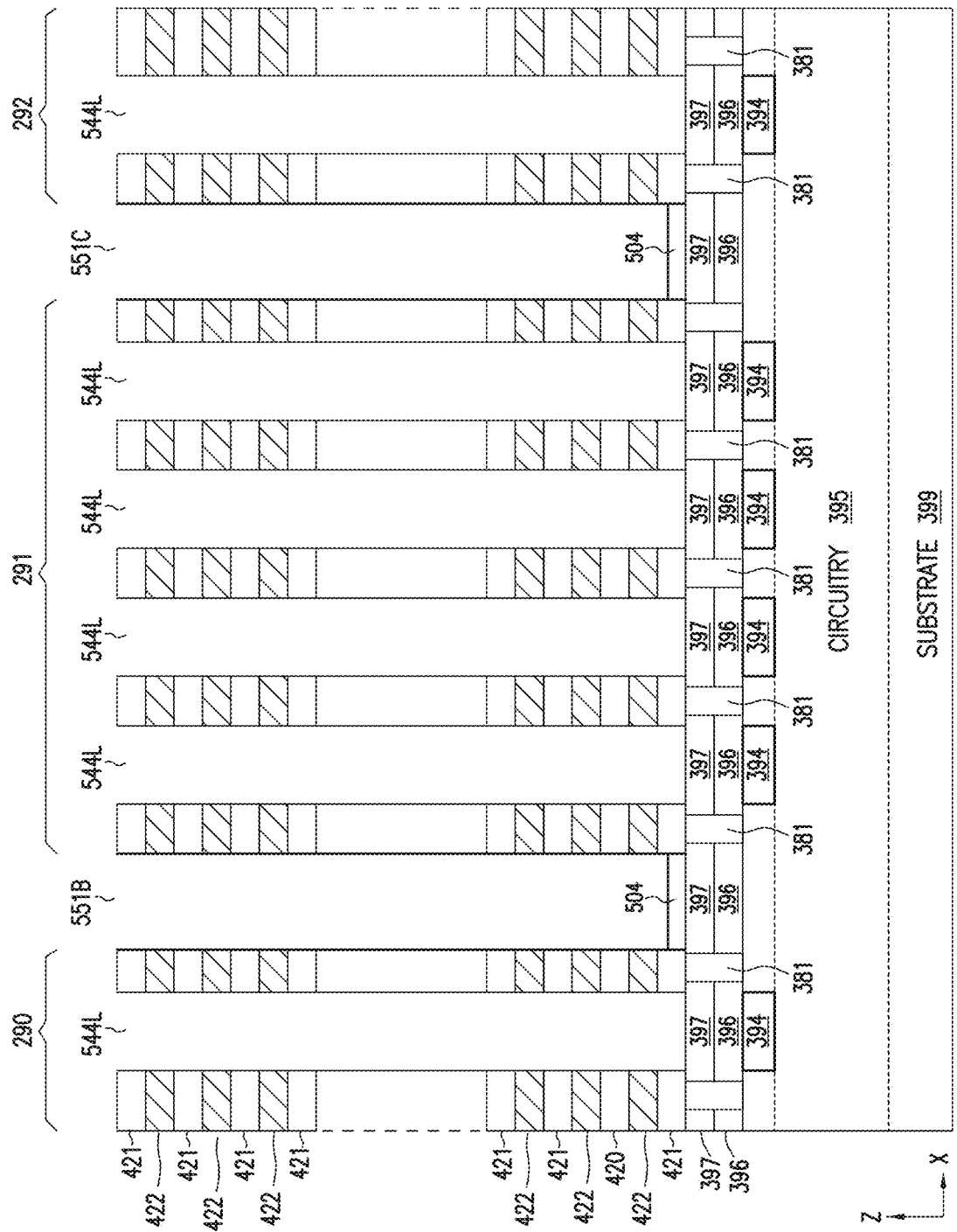
Figure 5C:
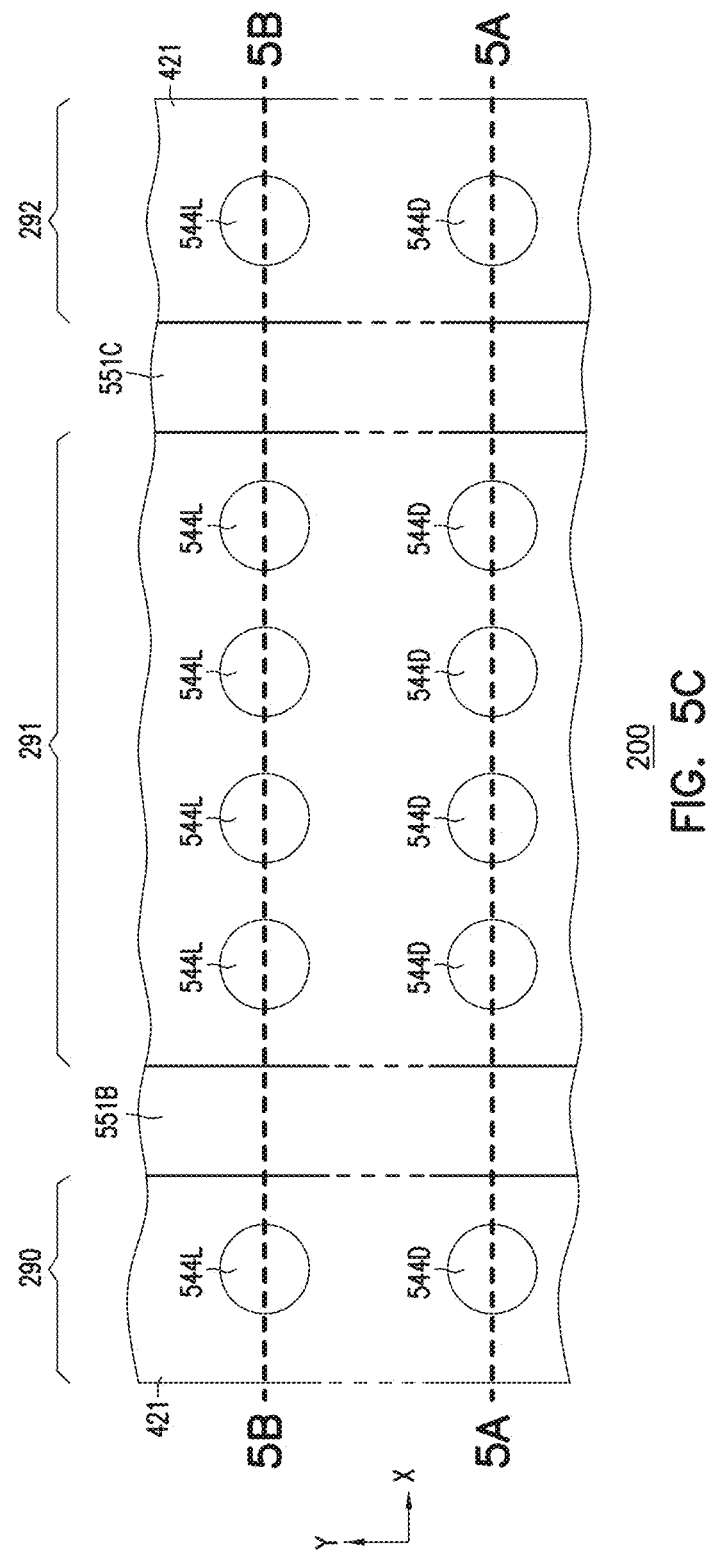

FIG. 5A, FIG. 5B, and FIG. 5C show respective side views and a top view of memory device 200 after formation of slits 551B and 551C and openings 544D and 544L in blocks 290, 291, and 292. FIG. 5A and FIG. 5B shows side views taken along lines 5A-5A and 5B-5B, respectively, of FIG. 5C, which shows a top view of memory device 200. As shown in FIG. 5C, each of slits 551B and 551C can have a length in the Y-direction and width in the X-direction. Openings 544D and 544L are holes (e.g., deep holes) that are concurrently formed (formed in the same process step) where support structures 344D and 344L, respectively (FIG. 3B), can be subsequently formed. As shown in FIG. 5A and FIG. 5B, each of slits 551B and 551C can include (or can be) a trench having a depth in the Z-direction. Each of openings (e.g., holes) 544D and 5444L can include a depth in the Z-direction. As shown in FIG. 5A and FIG. 5B, a material 504 can also be formed at (e.g., formed at the bottom of) slits 551B and 551C. Material 504 can include tungsten or other materials that can be used as an etch stop to prevent other materials in slits 551B and 551C from being removed (etched away) in some subsequent processes of forming memory device 200.

Figure 6B:
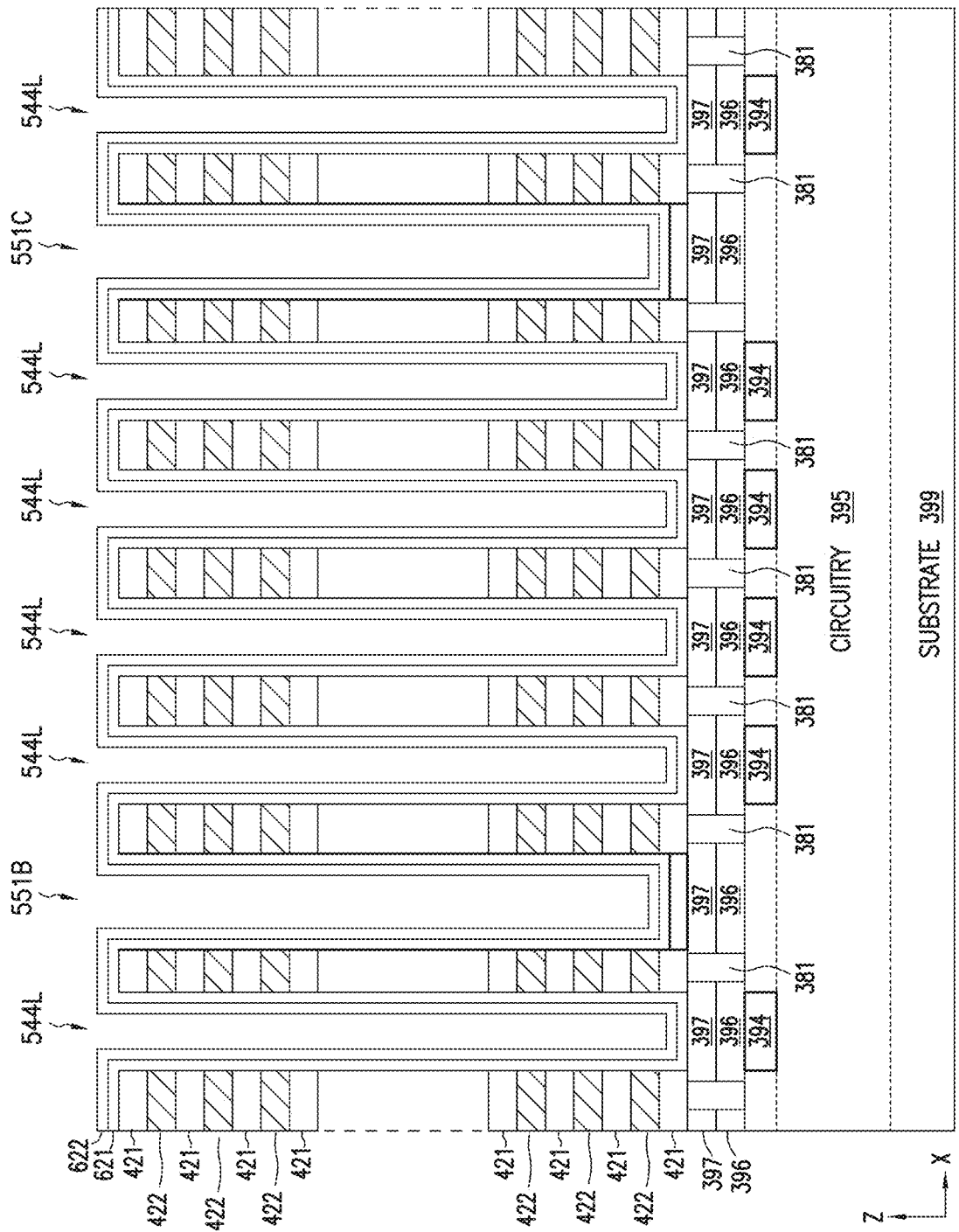

FIG. 6A and FIG. 6B show memory device 200 after material 621 and material 622 are formed in slits 551B and 551C and in openings 544D and 544L. As described above, material 621 can include an oxide material (e.g., silicon dioxide) and material 622 can include a nitride material (e.g., silicon nitride). Materials 621 and 622 can be formed one after another. For example, material 621 can be formed on sidewalls (e.g., vertical sidewalls, not labeled) of slits 551B and 551C and on sidewalls of openings 544D and 544L. Then, material 622 can be formed (e.g., formed immediately) after material 621 is formed. Material 621 can have a relatively small thickness and can conform to the sidewalls of slits 551B and 551C and the sidewalls of openings 544D and 544L. As an example, material 621 can be a layer of oxide material having a thickness in the range from 5 to 7 nanometers. Material 622 can be formed adjacent to (e.g., formed on) material 621. Material 622 can have a thickness greater than the thickness of material 621. For example, material 622 can be a layer of nitride material having a thickness in the range from 11 to 13 nanometers.

In an alternative structure of memory device 200, material 622 can be omitted (not formed) from memory device 200. However, including material 622 can provide improvements and benefits to memory device 200, as described above with reference to FIG. 3D.

Figure 7A:
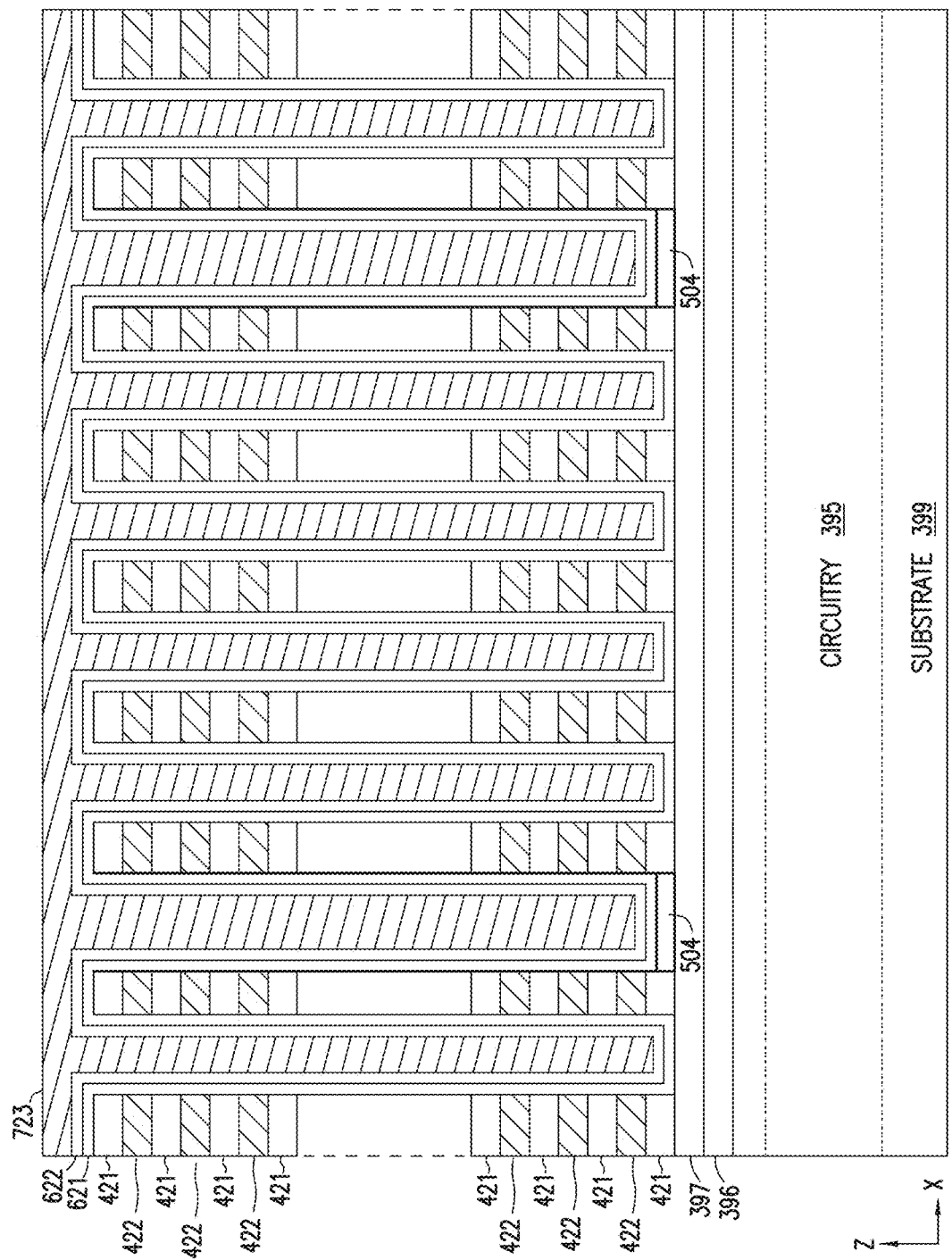
Figure 7B:
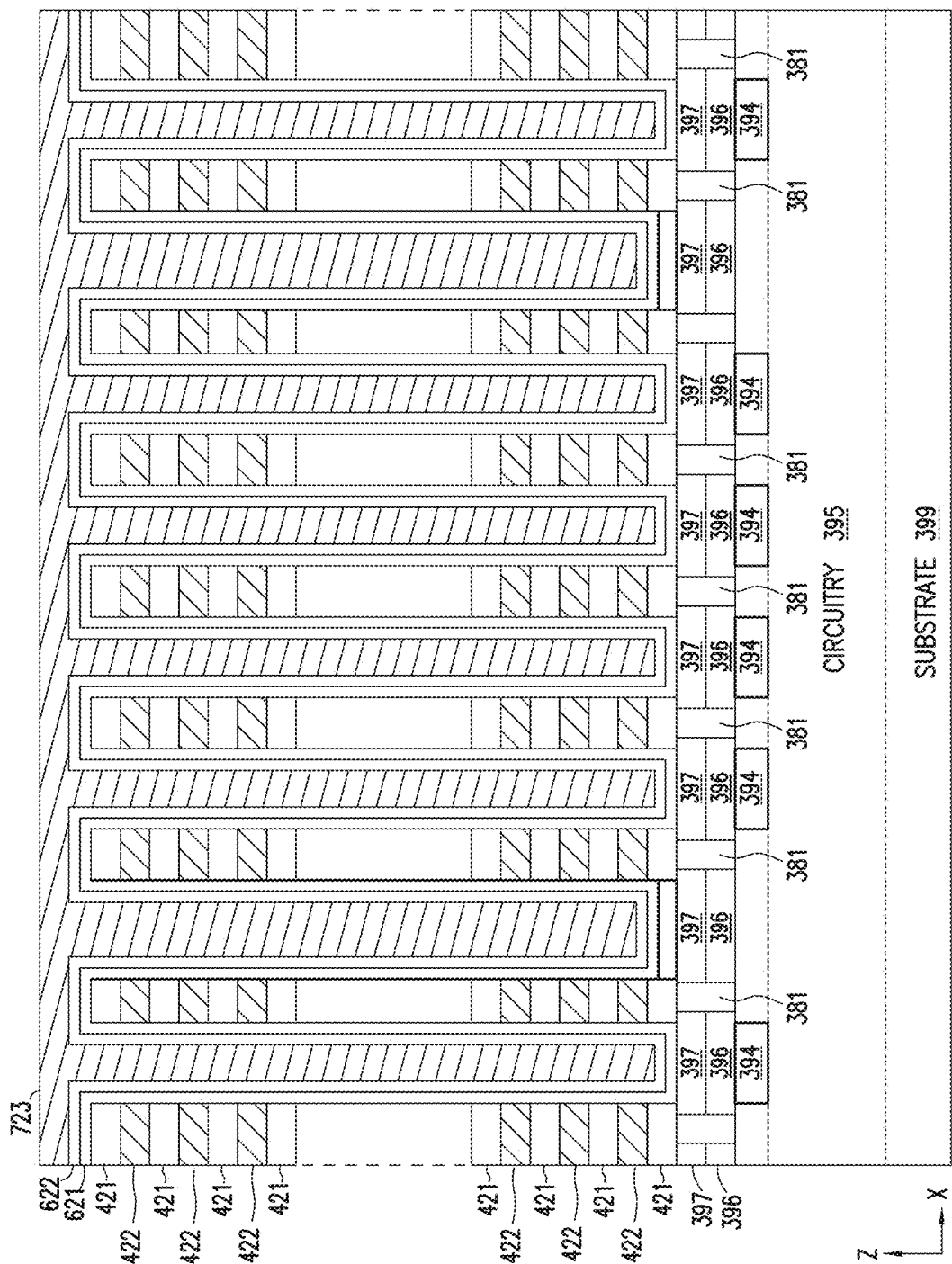

FIG. 7A and FIG. 7B show memory device 200 after a material 723 is formed in slits 551B and 551C and openings 544D and 544L and over material 622 in slits 551B and 551C and in openings 544D and 544L. In an example, material 723 includes polysilicon. In another example, material 723 can include a titanium-based material, a tungsten-based material, or both.

Figure 8A:
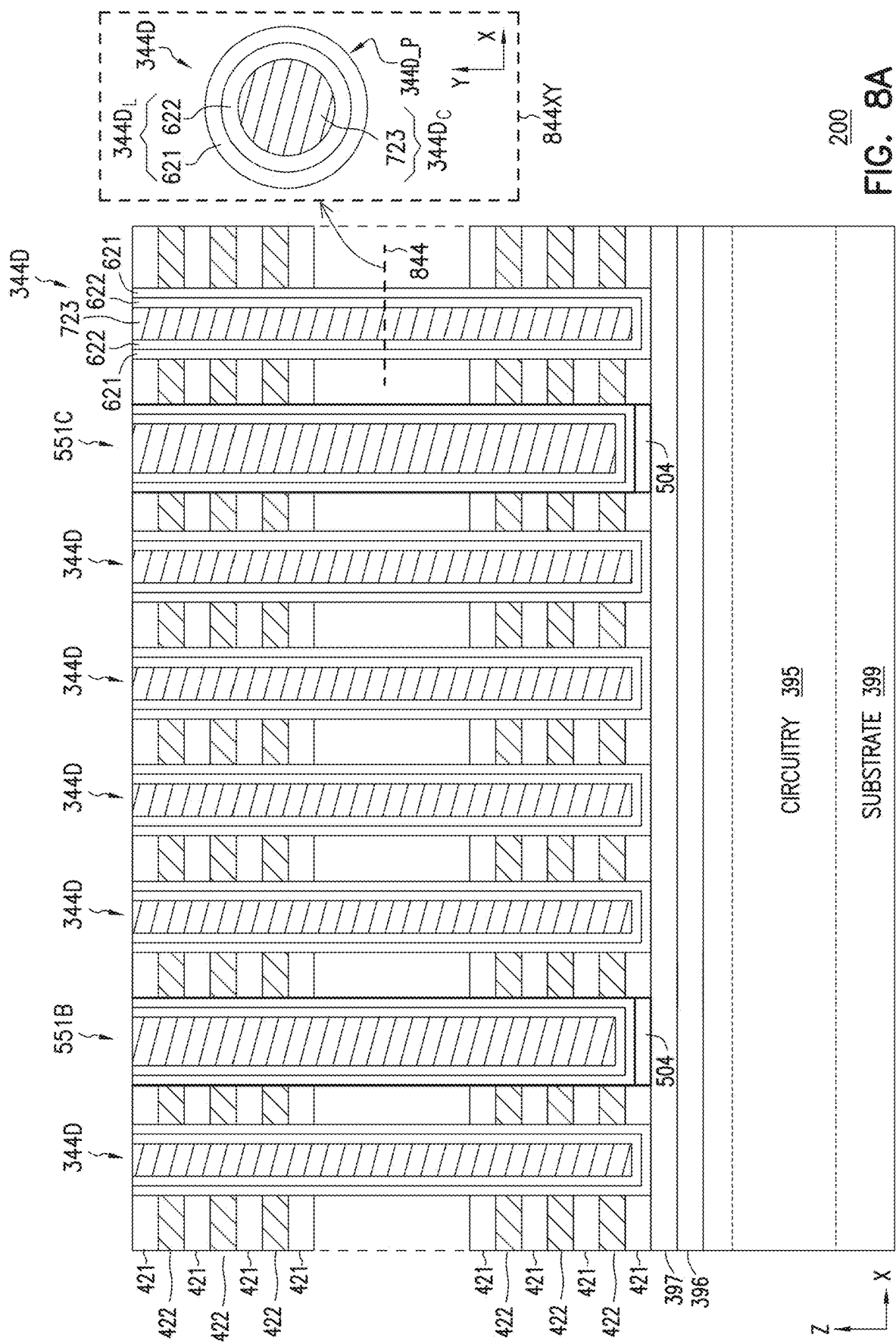
Figure 8B:
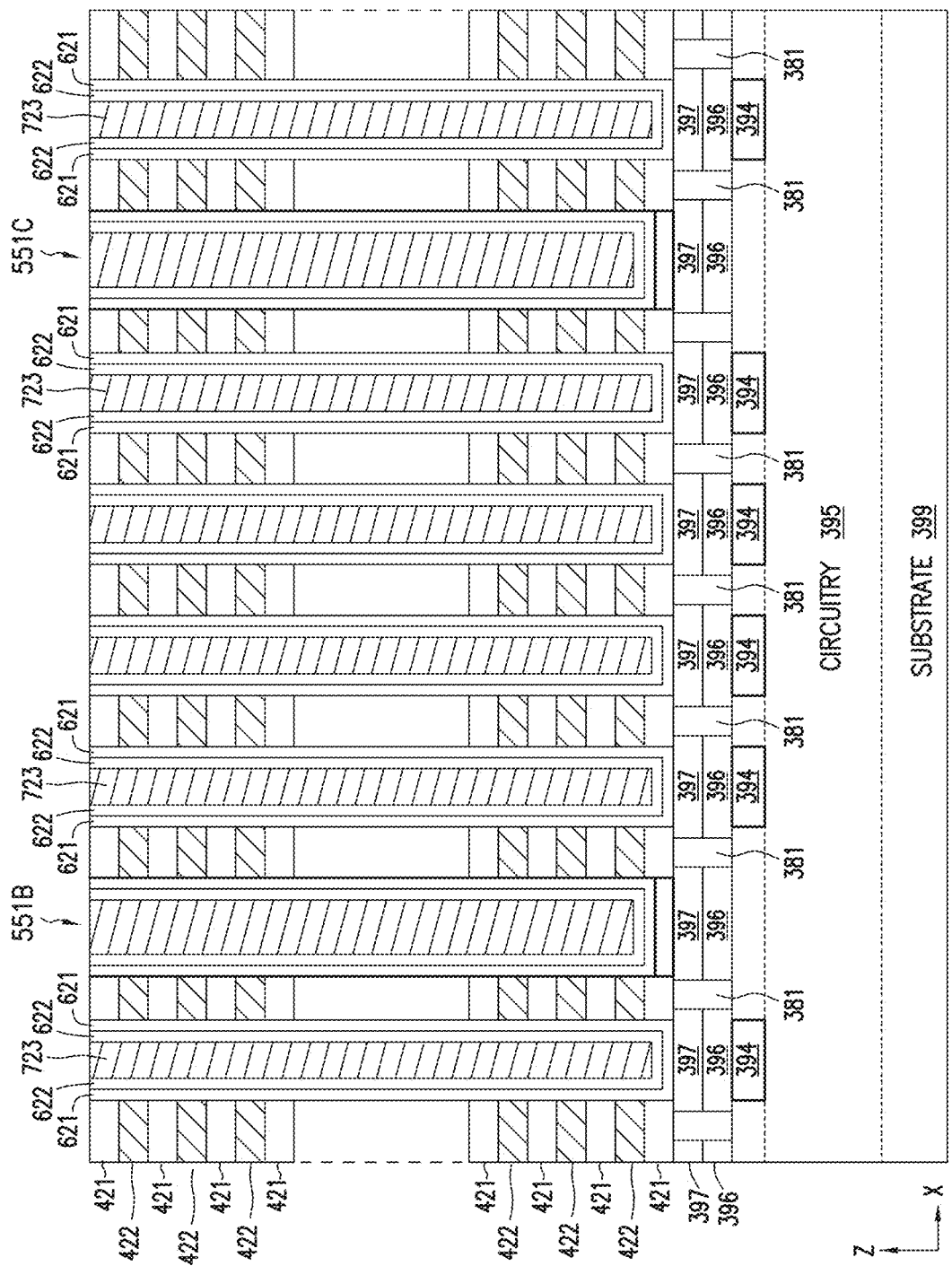

FIG. 8A and FIG. 8B show memory device 200 after a portion (e.g., top portion) of material 723 is removed (e.g., using chemical mechanical polishing or planarization (CMP) process). A remaining portion (e.g., after a CMP process) of material 723 is shown in FIG. 8A and FIG. 8B.

As shown in FIG. 8A, support structures 344D are formed at the locations of openings 544D (labeled in FIG. 5A). Each of support structures 344D can include materials 621 and 622 and material 723. A top view (e.g., cross-section) of a portion 844XY of a support structure 344D along line 844 is also shown in FIG. 8A. Portion 844XY is the same as the portion of support structure 344D shown in FIG. 3D. As shown in FIG. 8A, portion 844XY can include dielectric liner portion 344D$_L$ (which includes materials 621 and 622) and core portion 344D$_C$ (which includes material 723) that are part of pillar 344D_P of support structure 344D. For simplicity, the description of FIG. 8A omits detailed description of portion 844XY. Support structures 344D can remain the same during subsequent processes of forming other structures (e.g., during forming contact structures 344L in FIG. 9B through FIG. 21B and dielectric structures 351B and 351C in FIG. 22A through FIG. 32B) of memory device 200.

In FIG. 8B, materials 621, 622, and 723 at openings 544L and slits 551B and 551C will be subsequently removed during the processes of forming contact structures 344L (described below with reference to FIG. 9B through FIG. 21B) and dielectric structures 351B and 351C (described below with reference to FIG. 22B through FIG. 32B). Since material 723 in openings 544L and slits 551B and 551C is subsequently removed, material 723 in openings 544L and slits 551B and 551C can be called sacrificial material (e.g., sacrificial polysilicon). Unlike material 723 in openings 544L and slits 551B and 551C (that is subsequently removed), material 723 (FIG. 8A) in support structures 344D remain in memory device 200 after fabrication of memory device 200. Thus, material 723 (FIG. 8A) included in support structures 344D may not be part of sacrificial material.

Figure 9A:
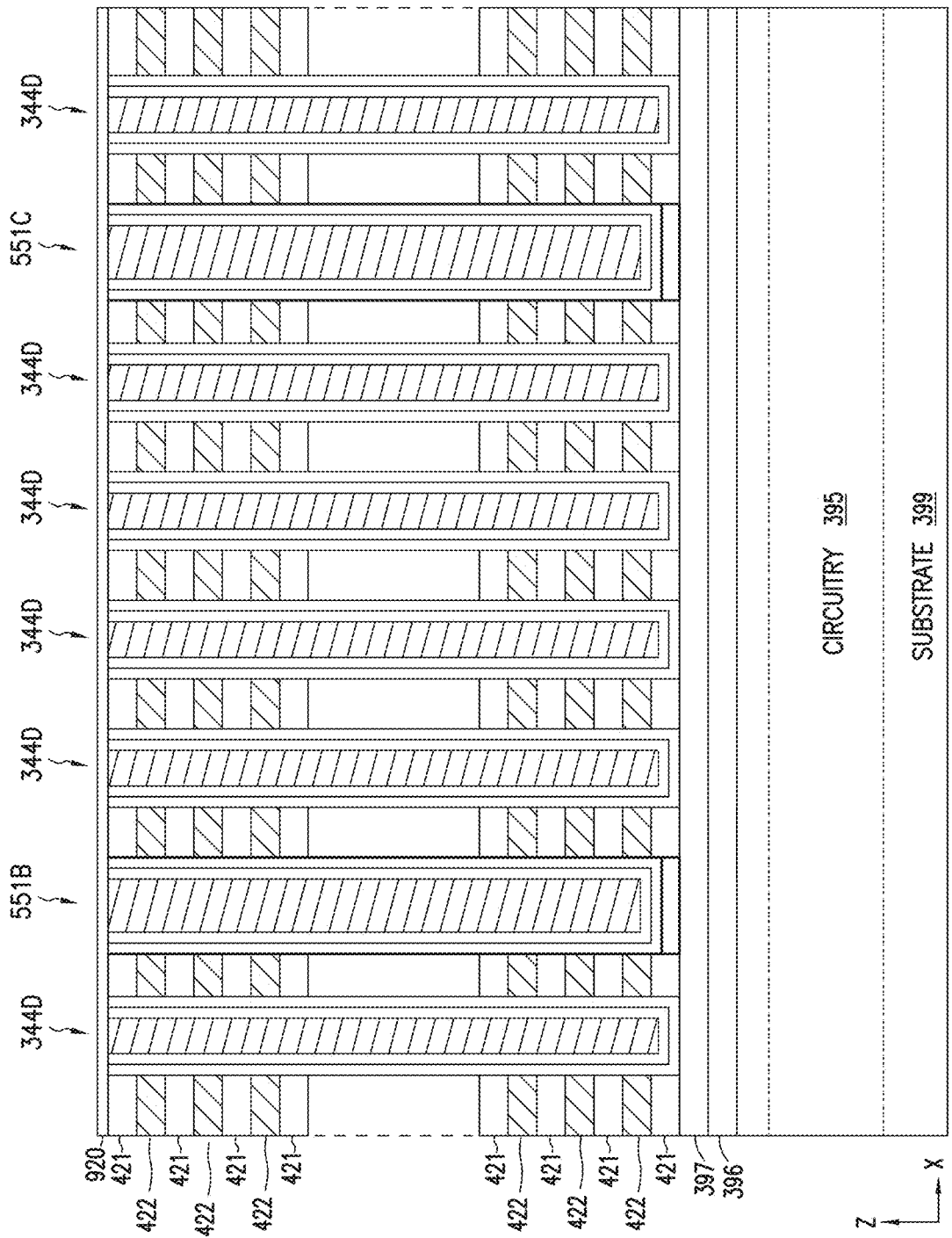

FIG. 9A and FIG. 9B show memory device 200 after a material 920 is formed over materials 621, 622, and 723 (labeled in FIG. 8A) of support structures 344D (FIG. 9A) and over materials 621, 622, and 723 (labeled in FIG. 8B) of slits 551B and 551C and openings 544L. Material 920 can include a dielectric material (silicon dioxide).

Figure 10B:
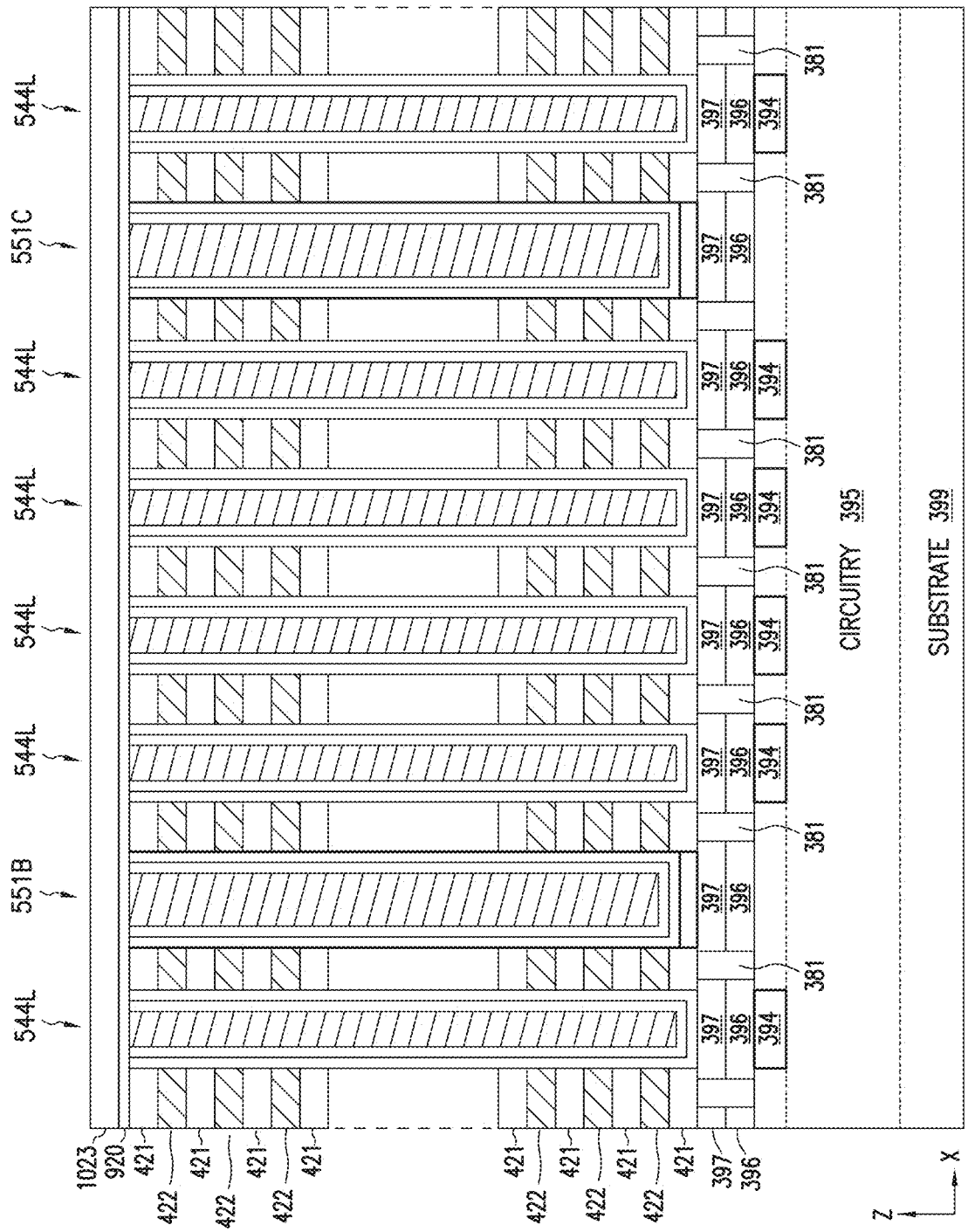

FIG. 10A and FIG. 10B show memory device 200 after a material 1023 is formed over material 920. Material 1023 can be a photo-resist material.

In the following processes of forming contact structures 344L (FIG. 11A through FIG. 21B), the portion of memory devices 200 at support structures 344D (FIG. 10A) remain unchanged. Thus, for simplicity, only the top part of the structure of memory device 200 of FIG. 10A is shown in subsequent figures FIG. 11A, FIG. 12A, FIG. 13A, FIG. 14A, FIG. 15A, FIG. 16A, FIG. 17A, FIG. 18A, FIG. 19A, and FIG. 20A (FIG. 11A through FIG. 20A) and detailed description of FIG. 10A is not repeated in the description of subsequent FIG. 11A through FIG. 20A).

FIG. 11B shows memory device 200 after a pattern, which includes can openings (e.g., shallow holes) 1102L, is selectively formed in material 1023. Openings 1102L can be formed over (e.g., vertically aligned with) the locations of respective openings 544L (formed in FIG. 5B). As shown in FIG. 11A, the portion of material 1023 at respective locations of support structures 344D is not patterned (e.g., shallow holes are not formed at respective locations of support structures 344D). Thus, the process associated with FIG. 11A and FIG. 11B can include removing (e.g., patterning or etching) part of material 1023 at respective locations of openings 544L (FIG. 11B) and not removing part of material 1023 at respective locations of support structures 344D (FIG. 11A).

Figures 12A, 12B:
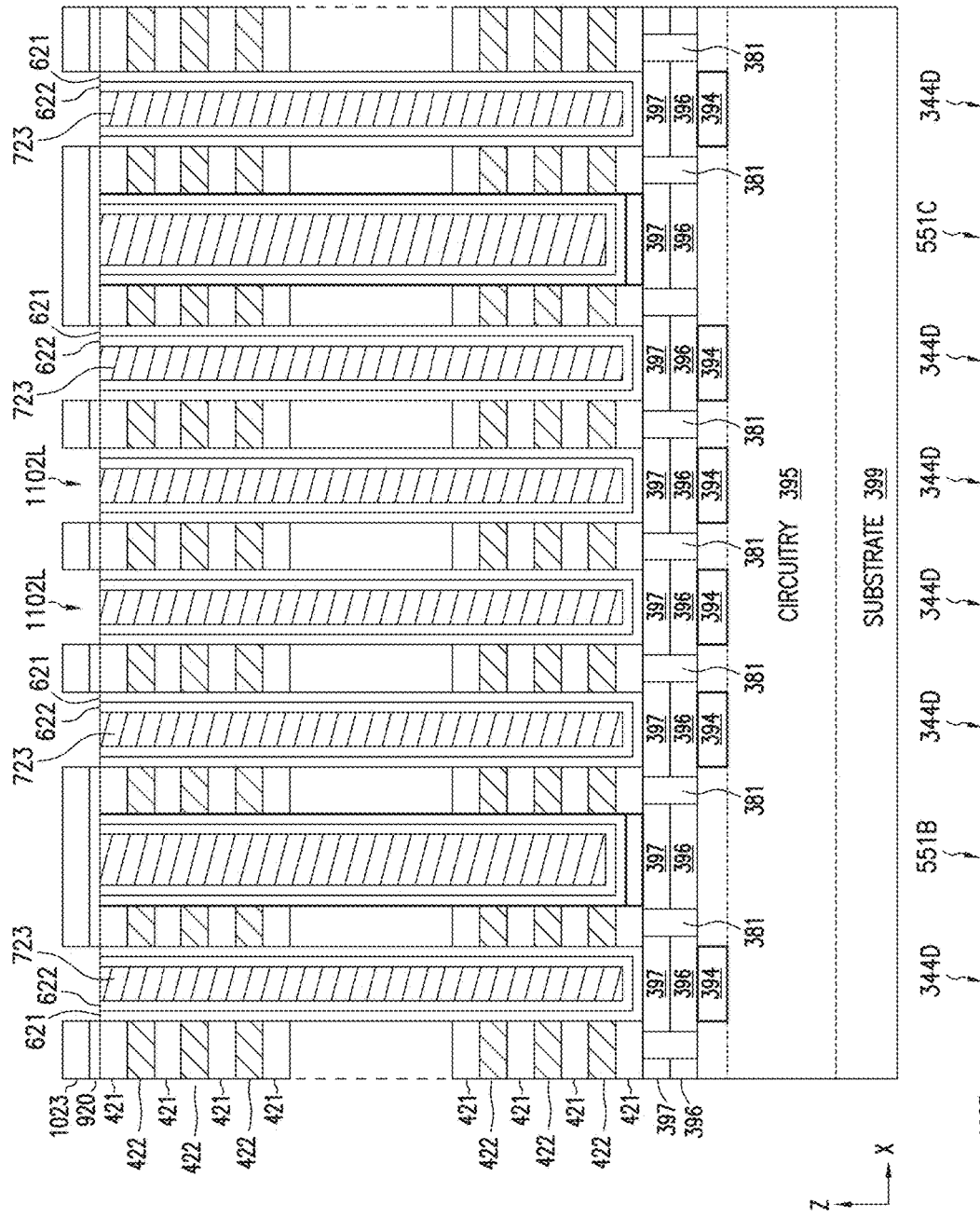

FIG. 12B shows memory device 200 after part of material 920 at respective openings 1102L is removed. As shown in FIG. 12B, material (e.g., oxide) 621, material (e.g., nitride) 622, and material (e.g., polysilicon) 723 are exposed at openings 1102L.

FIG. 13B shows memory device 200 after material 723 at openings 1102L is removed (e.g., exhumed), thereby forming openings (e.g., deep holes) 1344L at the locations that were occupied by material 723 (FIG. 12B). The locations of openings 1344L are the same as the locations of respective openings 544L that were formed in the processes associated with FIG. 5B.

FIG. 14A and FIG. 14B show memory device 200 after material 1023 (FIG. 13B) is removed.

FIG. 15B shows memory device 200 after material (e.g., nitride) 622 at respective openings 1344L is removed.

FIG. 16B shows memory device 200 after material (e.g., oxide) 621 at respective openings 1344L is removed.

FIG. 17B shows memory device 200 after pockets (e.g., recesses) 1722 are formed on respective levels (e.g., tiers) of memory device 200 along sidewalls of respective openings 1344L. Pockets 1722 can be formed by removing (e.g., recessing) respective portions of material (e.g., nitride) 422 along sidewalls of respective openings 1344L as shown in FIG. 17B. As described in more detail below (associated with FIG. 30B), pockets 1722 are formed to improve electrical functions of contact structures 344L (which will be subsequently formed in openings 1344L).

FIG. 18B shows memory device 200 after a material 1821 is formed. Material 1821 can include a dielectric material (e.g., silicon dioxide) that is formed on sidewalls of openings 1344L and filled pockets 1722 (labeled in FIG. 17B).

FIG. 19B shows memory device 200 after part of material 396 and part of material 397 at respective openings 1344L are removed (e.g., using a punch-through process). As shown in FIG. 19B, the process (e.g., punch-through process) can stop at conductive portions (e.g., tungsten) 394, such that conductive portions 394 are exposed at respective openings 1344L.

FIG. 20B shows memory device 200 after a material (or materials) 2033 are formed (e.g., filled) in openings 1344L adjacent (formed on) material 1821. Material 2033 can include multiple portions (e.g., layers) 2033A, 2033B, and 2033C that can be formed one after another to fill openings 1344L. Detail of material 2033 (which can include materials 2033A, 2033B, and 2033C) is shown in FIG. 21B.

FIG. 21A and FIG. 21B show memory device 200 after a portion (e.g., top portion) of material 2033 and material 920 are removed (e.g., using a CMP process). A remaining portion (e.g., after a CMP process) of material 2033 (in openings 1344L) is shown in FIG. 21B.ccc As shown in FIG. 21B, contact structures 344L are formed. Each of contact structures 344L can include materials 1821 and 2033. A top view (e.g., cross-section) of a portion 2144XY of a contact structure 344L along line 2144 is also shown in FIG. 21B. Portion 2144XY is the same as the portion of contact structure 344L shown in FIG. 3E. Thus, for simplicity, the description of FIG. 21B omits detailed description of portion 2144XY. As shown in FIG. 21B, portion 2144XY can include dielectric liner portion 344L$_L$ (which includes material 1821) and core portion 344L$_C$ (which includes materials 2033A, 2033B, and 2033C) that are part of pillar 344L_P of contact structure 344L.

Materials 2033A, 2033B, and 2033C can include different conductive materials. Example materials 2033A, 2033B, and 2033C can include titanium, titanium nitride, and tungsten, respectively. The materials 2033A, 2033B, and 2033C can be formed one after another in the processes described above with reference to FIG. 20B. For example, material 2033A (e.g., titanium) can be formed on material (e.g., oxide) 1821, material 2033B (e.g., titanium nitride) can be formed on material 2033B (after material 2033B is formed). Then, material 2033C (e.g., tungsten) can be formed after material 2033B is formed.

FIG. 22A and FIG. 22B show memory device 200 after a material 2220 is formed over support structures 344D (FIG. 22A), contact structures 344L (FIG. 22B), and materials 621, 622, and 723 (labeled in FIG. 21B and FIG. 21B) in slits 551B and 551C. Material 2220 can include a dielectric material (silicon dioxide).

FIG. 23A and FIG. 23B show memory device 200 after a material 2323 is formed over material 2220. Material 2323 can include a photo-resist material. A pattern including openings (e.g., shallow trenches) 2351B and 2351C is also formed in material 2323. Openings 2351B and 2351C can be formed over (e.g., vertically aligned with) the locations of respective slits 551B and 551C (formed in FIG. 5A and FIG. 5B). Openings 2351B and 2351C can have length extending in the Y-direction.

FIG. 24A and FIG. 24B show memory device 200 after part of material 2220 at respective openings 2351B and 2351C is removed. As shown in FIG. 24A and FIG. 24B, material (e.g., oxide) 621, material (e.g., nitride) 622, and material (e.g., polysilicon) 723 are exposed at openings 2351B and 2351C. Materials 621 and 622 were formed in the processes associated with FIG. 6A and FIG. 6B. Material 723 was formed in the processes associated with FIG. 7A and FIG. 7B.

FIG. 25A and FIG. 25B show memory device 200 after slits 2551B and 2551C are formed at openings 2351B and 2351C, respectively. The locations of slits 2551B and 2551C are the same as the locations of slits 551B and 551C, respectively, that were formed in the processes associated with FIG. 5A and FIG. 5C. In FIG. 25B, slits 2551B and 2551C can include removing (e.g., exhuming) material 723 exposed at openings 2351B and 2351C (labeled in FIG. 24A and FIG. 24B).

FIG. 26A and FIG. 26B show memory device 200 after material (e.g., nitride) 622 is removed.

FIG. 27A and FIG. 27B show memory device 200 after material (e.g., oxide) 621 is removed. Material 504 (formed in the processed associated with FIG. 5A and FIG. 5B) can be exposed at slits 2551B and 2551C.

FIG. 28A and FIG. 28B show memory device 200 after material 2323 and 504 (labeled in FIG. 27B) are removed.

FIG. 29A and FIG. 29B show memory device 200 after material (e.g., nitride) 422 are removed from locations 2922.

FIG. 29A and FIG. 29B show memory device 200 after material (e.g., nitride) 422 removed (e.g., exhumed) from locations 2922. Locations 2922 are empty spaces after dielectric materials 422 are removed. As shown in FIG. 29A, material (e.g., nitride) 622 at support structures 344D can be protected by material (e.g., oxide) 621 during removal of material (e.g., nitride) 422. In subsequent processes, a conductive material (or conductive materials) can be formed in locations 2922 to form respective control gates and select gates (e.g., source select gates) of memory device 200.

FIG. 30A and FIG. 30B show memory device 200 after material (or materials) 3040 is formed in locations 2922. Forming material 3040 includes depositing a single conductive material (e.g., tungsten or other metal) in locations 2922 (FIG. 29A and FIG. 29B). Alternatively, the processes associated with FIG. 30A and FIG. 30B can include forming (e.g., depositing) multiple materials (one at a time) in locations 2922. For example, processes can include depositing aluminum oxide on sidewalls of locations 2922, depositing titanium nitride conformal to the aluminum oxide, and then depositing tungsten (or other suitable conductive material) conformal to the titanium nitride. Thus, material 3040 can include a combination of (multiple layers of) aluminum oxide, titanium nitride, and titanium.

Material 3040 at respective tiers (e.g., levels in the Z-direction) of memory device 200 can correspond to respective conductive materials on levels (e.g., tiers) 362, 364, 366, 372, and 374 of FIG. 3C. For example, material 3040 on different levels in block 291 of memory device 200 in FIG. 30A and FIG. 30B can correspond to respective conductive materials $340_{SGS}$, $340_0$, $340_1$, $340_{M-1}$, and $340_M$ $340_{SGD0}$, and $340_{SGDi}$ in block 291 of memory device 200 shown in FIG. 3C. Thus, as shown in FIG. 30A and FIG. 30B, control gates (associated with signals $WL_0$, $WL_1$, $WL_{M-1}$, and $WL_M$) and a select gate (e.g., source select gate associated with signal SGS) of blocks 290, 290, and 292 are formed (formed from material 3040 on respective levels of memory device 200).

As shown in FIG. 30B, each contact structure 344L can be separated from a respective material 3040 by a distance D. Distance D is part of the dimension (e.g., width in the X-direction) of pockets 1722 formed in the processes associated with FIG. 17B. Distance D can be selected to allow enough separation (in the X-direction) between core portion $344L_C$ (a conductive structure) of contact structure 344L and material 3040 (a conductive structure). Such a separation (e.g., separation by the width of a respective pocket 1722) can improve or maintain electrical property of contact structure 344L, for example, to keep bias voltage and electric field associated with contact structure 344L at proper values.

FIG. 31A and FIG. 31B show memory device 200 after a material 3131 is formed. Material 3131 can include a dielectric material (e.g., silicon dioxide) formed opposite sidewalls (not labeled) of each of slits 2551B and 2551C. As shown in FIG. 31A and FIG. 31B, material 3151 can be formed (e.g., located) adjacent sidewalls (e.g., vertical sidewalls) of respective dielectric materials 421 and material 3040 at the location of slits 2551B and 2551C (which are part of dielectric structure 351B and 351C (FIG. 32A and FIG. 32C, respectively).

FIG. 32A and FIG. 32B show memory device 200 after dielectric structures 351B and 351C are formed in slits 2551B and 2551C (labeled in FIG. 31A and FIG. 31B). The processes associated with FIG. 32A and FIG. 32C can include forming a material 3255 in each of slits 2551B and 2251C (labeled in FIG. 31A and FIG. 31B). Material 3255 can be formed adjacent and between the portions of material 3131 that are formed on opposite sidewalls of each of slits 2551B and 2551C. Material 3255 can include polysilicon. Alternatively, material 3255 can include a dielectric material. As described above with reference to FIG. 3A, dielectric structure 351B and 351C can divide blocks 290, 291, and 292 from each other.

The process of forming memory device 200 as described above with reference to FIG. 4A through FIG. 32B can include additional processes after the processes associated with FIG. 32A and FIG. 32B are performed. For example, additional processes can include forming drain select gates and data lines and other elements and interconnections to complete the processes of forming memory device 200.

The illustrations of apparatuses (e.g., memory devices 100 and 200) and methods (e.g., methods of forming memory device 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100 and 200) or a system (e.g., an electronic item that can include any of memory devices 100 and 200).

Any of the components described above with reference to FIG. 1 through FIG. 32B can be implemented in a number of ways, including simulation via software. Thus, apparatuses (e.g., memory devices 100 and 200), or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 32B include apparatuses and methods of forming the apparatuses. One of the apparatuses includes tiers located one over another, the tiers including respective memory cells and control gates for the memory cells; a first pillar extending through the tiers and separated from the control gates, the first pillar including a first dielectric liner portion and a first core portion adjacent the first dielectric liner portion, the first dielectric liner portion and the first core portion extending along a length of the first pillar; and a second pillar extending through the tiers and separated from the control gates, the second pillar including a second dielectric liner portion and a second core portion adjacent the second dielectric liner portion, the second dielectric portion and the second core portion extending along a length of the second pillar, wherein the first core portion and the second core portion have different materials. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

In the detailed description and the claims, the terms "first," "second," and "third," etc. are used merely as labels, and are not intended to impose numerical requirements on their objects.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   tiers located one over another, the tiers including respective memory cells and control gates for the memory cells;
   a first pillar extending through the tiers and separated from the control gates, the first pillar including a first dielectric liner portion and a first core portion adjacent the first dielectric liner portion, the first dielectric liner portion and the first core portion extending along a length of the first pillar; and
   a second pillar extending through the tiers and separated from the control gates, the second pillar including a second dielectric liner portion and a second core portion adjacent the second dielectric liner portion, the second dielectric portion and the second core portion extending along a length of the second pillar, wherein the first core portion and the second core portion have different materials.

2. The apparatus of claim 1, wherein the first core portion includes a non-conductive material.

3. The apparatus of claim 1, wherein the first core portion includes polysilicon.

4. The apparatus of claim 1, wherein the second core portion includes a conductive material.

5. The apparatus of claim 1, wherein the second core portion includes tungsten.

6. The apparatus of claim 1, wherein the first dielectric liner portion and the second dielectric liner portion have different materials.

7. The apparatus of claim 1, wherein the first dielectric liner portion includes silicon dioxide.

8. The apparatus of claim 7, wherein the first dielectric liner portion includes silicon nitride material adjacent the silicon dioxide.

9. The apparatus of claim 1, wherein the apparatus comprises a memory device, the memory device includes circuitry located under the tiers, the second core portion is electrically coupled to the circuitry, and the first core portion is electrically uncoupled to the circuitry.

10. An apparatus comprising:
    tiers located one over another, the tiers including respective memory cells and control gates for the memory cells, the control gates including respective portions that collectively form a staircase structure;
    conductive contacts contacting the control gates at a location of the staircase structure, the conductive contacts having different lengths extending in a direction from one tier to another tier among the tiers;

a support structure adjacent a first conductive contact of the conductive contacts, the support structure including a first pillar extending through the tiers and separated from the control gates, the first pillar including a first dielectric liner portion and a first core portion adjacent the first dielectric liner portion; and a contact structure adjacent a second conductive contact of the conductive contacts, the contact structure including a second pillar extending through the tiers and separated from the control gates, the second pillar including a second dielectric liner portion and a second core portion adjacent the second dielectric liner portion, wherein the first core portion and the second core portion have different materials.

11. The apparatus of claim 10, wherein the first core portion includes a non-conductive material, and the second core portion includes a conductive material.

12. The apparatus of claim 10, wherein the first core portion includes polysilicon, and the second core portion includes a conductive material.

13. The apparatus of claim 10, wherein the first core portion includes a non-conductive material, and the second core portion includes tungsten.

14. The apparatus of claim 10, wherein the first core portion includes polysilicon, and the second core portion includes tungsten.

15. The apparatus of claim 10, wherein the first dielectric liner portion includes silicon dioxide, and silicon nitride adjacent the silicon dioxide.

16. An apparatus comprising:
tiers located one over another, the tiers including respective memory cells and control gates for the memory cells;
a first pillar extending through the tiers and separated from the control gates, the first pillar including a first dielectric liner portion and a first core portion adjacent the first dielectric liner portion, the first dielectric liner portion and the first core portion extending along a length of the first pillar; and a second pillar extending through the tiers and separated from the control gates, the second pillar including a second dielectric liner portion and a second core portion adjacent the second dielectric liner portion, the second dielectric portion and the second core portion extending along a length of the second pillar, wherein the first dielectric liner portion and the second dielectric liner portion have different materials.

17. The apparatus of claim 16, wherein the first core portion and the second core portion have different materials.

18. The apparatus of claim 17, wherein the first core portion includes non-conductive material, and the second core portion includes a conductive material.

19. The apparatus of claim 16, wherein:
the first dielectric liner portion includes silicon nitride adjacent the first core portion; and the second dielectric liner portion includes silicon dioxide adjacent the second core portion.

20. The apparatus of claim 19, wherein:
the first core portion includes polysilicon adjacent the silicon nitride; and the second core portion includes a conductive material adjacent the silicon dioxide.

* * * * *